United States Patent
Takahashi et al.

(10) Patent No.: US 8,277,687 B2
(45) Date of Patent: Oct. 2, 2012

(54) PHOSPHOR AND LIGHT-EMITTING DEVICE USING SAME

(75) Inventors: Tomoko Takahashi, Akita (JP); Nobuhiro Kodama, Akita (JP); Yasuo Shimomura, Kanagawa (JP); Naoto Kijima, Kanagawa (JP); Tomoyuki Kurushima, Kanagawa (JP); Takashi Hase, Kanagawa (JP); Eiji Hattori, Tokyo (JP); Kouichi Adachi, Fukuoka (JP); Keiichi Seki, Kanagawa (JP); Yutaka Mori, Fukuoka (JP)

(73) Assignee: Mitsubishi Chemical Corporation, Tokyo (JP)

( * ) Notice: Subject to any disclaimer, the term of this patent is extended or adjusted under 35 U.S.C. 154(b) by 1197 days.

(21) Appl. No.: 11/997,926

(22) PCT Filed: Aug. 10, 2006

(86) PCT No.: PCT/JP2006/315805
§ 371 (c)(1),
(2), (4) Date: Feb. 5, 2008

(87) PCT Pub. No.: WO2007/018260
PCT Pub. Date: Feb. 15, 2007

(65) Prior Publication Data
US 2009/0072255 A1 Mar. 19, 2009

(30) Foreign Application Priority Data

Aug. 10, 2005 (JP) ................................. 2005-231876
Jan. 18, 2006 (JP) ................................. 2006-010096
Jan. 18, 2006 (JP) ................................. 2006-010097
Jul. 26, 2006 (JP) ................................. 2006-203439
Aug. 9, 2006 (JP) ................................. 2006-216855

(51) Int. Cl.
*C09K 11/08* (2006.01)
*C09K 11/61* (2006.01)

(52) U.S. Cl. ........................ 252/301.4 H; 252/301.4 R

(58) Field of Classification Search ............ 252/301.4 R, 252/301.6 R, 301.4 H; 313/467, 468, 503, 313/513
See application file for complete search history.

(56) References Cited

U.S. PATENT DOCUMENTS
6,576,156 B1 * 6/2003 Ratna et al. ............ 252/301.4 R
(Continued)

FOREIGN PATENT DOCUMENTS
DE 102 59 946 A1 7/2004
(Continued)

OTHER PUBLICATIONS
Translation of TWI250664.*
(Continued)

*Primary Examiner* — Emily Le
*Assistant Examiner* — Lynne Edmondson
(74) *Attorney, Agent, or Firm* — Oblon, Spivak, McClelland, Maier & Neustadt, L.L.P.

(57) ABSTRACT

The present invention relates to a phosphor that satisfies requirements (1) to (3):
(1) the phosphor satisfies Formula [2] and/or Formula [3]:

$$85 \leq \{R_{455}(125)/R_{455}(25)\} \times 100 \leq 110 \quad [2]$$

$$92 \leq \{R_{405}(100)/R_{405}(25)\} \times 100 \leq 110 \quad [3]$$

wherein $R_{455}(125)$ represents an emission peak intensity when the phosphor is excited by light having a peak wavelength of 455 nm at 125° C.,
(2) the emission peak wavelength is in the range of 570 nm to 680 nm, and
(3) the full width at half maximum of an emission peak is 90 nm or less.

The phosphor of the present invention has a high luminous efficiency and emits light of orange to red with high luminance. The use of the phosphor makes it possible to produce a light-emitting device, an illumination apparatus, and an image display, having a high efficiency and excellent color rendering properties.

29 Claims, 13 Drawing Sheets

U.S. PATENT DOCUMENTS

| | | | |
|---|---|---|---|
| 2005/0168127 A1* | 8/2005 | Shei et al. | 313/487 |
| 2006/0022208 A1 | 2/2006 | Kim et al. | |
| 2006/0227087 A1* | 10/2006 | Hajjar et al. | 345/84 |
| 2006/0284185 A1 | 12/2006 | Kim et al. | |
| 2006/0290275 A1 | 12/2006 | Kim et al. | |
| 2007/0035813 A1 | 2/2007 | Roth et al. | |
| 2009/0140630 A1* | 6/2009 | Kijima et al. | 313/498 |

FOREIGN PATENT DOCUMENTS

| | | | |
|---|---|---|---|
| DE | 102005005263 A1 | | 8/2006 |
| JP | 1-266188 | | 10/1989 |
| JP | 10-163535 | | 6/1998 |
| JP | 2900928 | | 3/1999 |
| JP | 2927279 | | 5/1999 |
| JP | 3364229 | | 10/2002 |
| JP | 2003 110150 | | 4/2003 |
| JP | 2004-161981 | | 6/2004 |
| JP | 2004-161982 | | 6/2004 |
| JP | 2005 68269 | | 3/2005 |
| JP | 2005-068269 | | 3/2005 |
| JP | 2005068269 A | * | 3/2005 |
| JP | 2005 150691 | | 6/2005 |
| JP | 2005-277441 | | 10/2005 |
| JP | 2006-036943 | | 2/2006 |
| JP | 2007-131843 | | 5/2007 |
| KR | 10-0626272 | | 9/2006 |
| TW | I250664 | * | 12/2005 |
| WO | WO 2004/085570 A1 | | 10/2004 |
| WO | WO 2005/098972 A1 | | 10/2005 |
| WO | WO 2005/098973 A1 | | 10/2005 |
| WO | WO 2006/081803 A1 | | 8/2006 |
| WO | WO 2007/018569 A1 | | 2/2007 |

OTHER PUBLICATIONS

G. Blasse, et al., "Fluorescence of $Eu^{2+}$-Activated Silicates", Philips Research Report, vol. 23, 1968, pp. 189-200.

Yuki Masui, et al., "Mechanism of Long-lasting Phosphorescence of $Eu^{2+}:Ba_3SiO_5$", The Rare Earth Society of Japan, vol. 42, May 2003, pp. 146-147. (with English abstract).

Omituo Yamaga, et al., "Mechanism of long-lasting phosphorescence of $Eu^{2+}$ doped barium silicates", Extended Abstracts ($51^{st}$ Spring Meeting, 2004) The Japan Society of Applied Physics and Related Societies, No. 3, 2003, p. 1318 (with English Translation).

Joung Kyu Park, et al., "Application of strontium silicate yellow phosphor for white light-emitting diodes", Applied Physics Letters, vol. 84, No. 10, Mar. 8, 2004, pp. 1647-1649.

Joung Kyu Park, et al., "P-77: Application of $Sr_3SiO_5$: Eu Yellow Phosphor for White Light-Emitting Diodes", Asia Display/IMID'04, Aug. 23-27, 2004, 5 Pages.

Mitsuo Yamaga, et al., "Radiative and nonradiative decay processes responsible for long-lasting phosphorescence of $Eu^{2+}$—doped barium silicates", Physical Review, B 71, 2005, pp. 205102-1-205102-7.

Satoshi Yasuda, et al., "Luminescence Characteristics of $Ba_3SiO_5$ : $Eu^{2+}$ under Near-ultraviolet Light Excitation", The $51^{st}$ Applied Physics-Related Joint Lecture Conference, 2004, p. 1607 (with English Translation).

Joung Kyu Park, et al., "Luminescence characteristics of yellow emitting $Ba_3SiO_5$ :$Eu^{2+}$ phosphor", Journal of Materials Science, 40(8)m 2005, pp. 2069-2071 and a cover page.

Ho Seong Jang, et al., "Luminescent properties of $(Sr_{1-x}M_x)_3SiO_5$: $Eu^{2+}$ (M=Ca, Ba) phosphor for white emitting light source using blue/near UV LEDs", Proceedings of the $12^{th}$ International Display Workshops in conjuction with Asia Display 2005, vol. 1, Dec. 6-9, 2005, pp. 539-542.

Foreign Search Report issued Sep. 10, 2010 in EP Application No. 06782609.9-2111.

Office Action issued Aug. 18, 2011, in European Patent Application No. 06 782 609.9.

Office Action mailed Jun. 5, 2012, in Japanese Patent Application No. 2006-216855.

Office Action mailed Jun. 5, 2012, in Japanese Patent Application No. 2006-217906.

* cited by examiner

EMISSION SPECTRUM AT 460-nm EXCITATION

EMISSION SPECTRUM AT 400-nm EXCITATION

EXAMPLE 41

PHOSPHOR AND LIGHT-EMITTING DEVICE USING SAME

CROSS REFERENCE TO RELATED APPLICATION

This application is a 371 of PCT/JP06/315805, filed on Aug. 10, 2006, and claims priority to the following Japanese Patent Applications: 2005-231876, filed on Aug. 10, 2005; 2006-010096, filed on Jan. 18, 2006; 2006-010097, filed on Jan. 18, 2006; 2006-203439, filed on Jul. 26, 2006; and 2006-216855, filed on Aug. 9, 2006.

FIELD OF INVENTION

The present invention relates to a phosphor, a phosphor-containing composition containing the phosphor, a light-emitting device including the phosphor, an image display including the light-emitting device, and an illumination apparatus including the light-emitting device. In particular, the present invention relates to a phosphor that emits orange to red light, a phosphor-containing composition containing the phosphor, a light-emitting device including the phosphor, an image display including the light-emitting device, and an illumination apparatus including the light-emitting device.

BACKGROUND OF INVENTION

In the related art of light-emitting devices including excitation light sources and phosphors that convert wavelengths of at least part of light from the excitation light sources, white-light-emitting devices including blue-light-emitting diodes in combination with yellow phosphors have been put to practical use for various illumination applications. Typical examples thereof include devices described in Patent Documents 1, 2, and 3. An example of phosphors particularly used in these white-light-emitting devices is a cerium-activated yttrium-aluminum-garnet phosphor represented by a general formula

$(Y,Gd)_3(Al,Ga)_5O_{12}:Ce^{3+}$.

However, white-light-emitting devices including blue-light-emitting diodes in combination with yttrium-aluminum-garnet phosphors emit bluish white light because of the lack of a red component, thus disadvantageously resulting in low color rendering properties.

Accordingly, the development of a white-light-emitting device in which the red component, in which light emitted from the white-light-emitting device including the yttrium-aluminum-garnet phosphor is lacking, is supplemented with another red phosphor has been studied. Such a light-emitting device is disclosed in, for example, Patent Document 4. Also in the light-emitting device disclosed in Patent Document 4 or the like, however, problems regarding the improvement of color rendering properties have yet to be solved. Thus, a light-emitting device in which the above problems are solved has been required. The red phosphor described in Patent Document 4 contains cadmium and thus is disadvantageous from the viewpoint of environmental pollution.

Patent Document 5 discloses a europium- or cerium-activated phosphor represented by a general formula $M_x(SiO_n)_y$ (wherein M represents an alkaline-earth-metal element, i.e., Mg, Ca, Sr, Ba, or Ra). However, the document only discloses that as a specific example, $Ba_3SiO_5:Eu^{2+}$ has an emission peak of 590 nm. $(Ba_{1-a}Sr_a)_3SiO_5:Eu^{2+}$ is also exemplified, but the specific value of a is not described.

Non-Patent Document 1 discloses the crystal structure of a $Ba_3SiO_5:Eu^{2+}$ phosphor. Non-Patent Document 2 discloses that the $Ba_3SiO_5:Eu^{2+}$ phosphor is excited by an InGaN semiconductor laser having a wavelength of 405 nm. Non-Patent Document 3 discloses a $Sr_3SiO_5:Eu^{2+}$ phosphor and discloses when Sr/Si ratios are 3/0.8, 3/0.9, 3/1, and 3/1.1, the emission peak wavelengths are 559 nm, 564 nm, 568 nm, and 570 nm, respectively.

Non-Patent Document 4 was published after the first filing date of the present invention and discloses that in $(Ba_{1-x}Sr_x)_3SiO_5:Eu^{2+}$, the partial occupation of the Sr sites by Ba allows the wavelength of light emitted from $Eu^{2+}$ to shift to longer wavelengths to reduce the emission intensity. That is, the emission intensity of the $(Ba_{1-x}Sr_x)_3SiO_5:Eu^{2+}$ phosphor is lower than that of $Sr_3SiO_5:Eu^{2+}$. Furthermore, the document describes a reduction in luminance by increasing the firing temperature of $Sr_3SiO_5:Eu^{2+}$ from 1,250° C. to 1,350° C. Thus, Non-Patent Document 4 does not suggest the possibility of improvement in the emission properties of the $(Ba_{1-x}Sr_x)_3SiO_5:Eu^{2+}$ phosphor.

Patent Document 1: Japanese Patent No. 2900928
Patent Document 2: Japanese Patent No. 2927279
Patent Document 3: Japanese Patent No. 3364229
Patent Document 4: Japanese Unexamined Patent Application Publication No. H10-163535
Patent Document 5: Japanese Unexamined Patent Application Publication No. 2005-68269
Non-Patent Document 1: Mitsuo Yamaga and four other persons, "Physical Review B", 2005, vol. 71, pp. 205102-1 to 7
Non-Patent Document 2: Satoshi Yasuda and three other persons, "Proceedings of the 51st Spring Meeting of the Japan Society of Applied Physics", p. 1607
Non-Patent Document 3: Joung Kyu Park and four other persons, "Applied Physics Letters", 2004, vol. 84, pp. 1647
Non-Patent Document 4: Ho Seong Jang and two other persons, "Proceedings of the 12th International Display Workshops in Conjunction with Asia, display 2005 volume 1", pp. 539-542

Hitherto, as described above, phosphors which are mainly composed of alkaline-earth metal silicates and which emit yellow to red light and light-emitting devices including the phosphors have been known.

However, the luminous efficiency thereof is insufficient. Phosphors and light-emitting devices having higher luminous efficiency have been required. Furthermore, the temperature of a phosphor incorporated in a light-emitting device has been known to rise to about 100° C. to 200° C. Thus, a phosphor and a light-emitting device in which luminous efficiency is not reduced even when the temperature rises have been required.

SUMMARY OF INVENTION

It is an object of the present invention to provide an orange-to red-light-emitting phosphor with high luminous efficiency and high luminance.

It is another object of the present invention to provide a high-efficiency high-color-rendering light-emitting device including the phosphor with high luminous efficiency, an illumination apparatus including the light-emitting device, and an image display including the light-emitting device.

A phosphor according to a first aspect satisfies requirements (1) to (3):

(1) the phosphor satisfies Formula [2] and/or Formula [3]:

$$85 \leq \{R_{455}(125)/R_{455}(25)\} \times 100 \leq 110 \quad [2]$$

$$92 \leq \{R_{405}(125)/R_{405}(25)\} \times 100 \leq 110 \quad [3]$$

wherein in Formula [2], $R_{455}(25)$ represents an emission peak intensity when the phosphor is excited by light having a peak wavelength of 455 nm at 25° C., and $R_{455}(125)$ represents an emission peak intensity when the phosphor is excited by light having a peak wavelength of 455 nm at 125° C., and wherein in Formula [3], $R_{405}(25)$ represents an emission peak intensity when the phosphor is excited by light having a peak wavelength of 405 nm at 25° C., and $R_{405}(100)$ represents an emission peak intensity when the phosphor is excited by light having a peak wavelength of 405 nm at 100° C., (2) the emission peak wavelength is in the range of 570 nm to 680 nm, and (3) the full width at half maximum of an emission peak is 90 nm or less.

The phosphor may have an internal quantum efficiency of 64% or more when being excited by light having a peak wavelength of 455 nm and/or the phosphor may have an internal quantum efficiency of 56% or more when being excited by light having a peak wavelength of 405 nm.

The phosphor may have a weight median diameter ($D_{50}$) of 1 μm to 40 μm.

The phosphor may contain Eu and/or Ce.

The phosphor may contain Eu and Si.

A phosphor according to a second aspect has a chemical composition represented by Formula [1]:

$$M^1{}_{3-x-y}Ba_xM^2{}_yM^3{}_aM^4{}_bM^5{}_cM^6{}_d \quad [1]$$

wherein in Formula [1], $M^1$ represents at least one element selected from the group consisting of Zn and alkaline-earth-metal elements except Ba, $M^2$ represents at least one activation element selected from the group consisting of Eu, Ce, Cr, Mn, Sm, Tm, Tb, Er, and Yb, $M^3$ represents a tetravalent element containing at least Si, $M^4$ represents at least one element selected from the group consisting of alkali-metal elements, La, Gd, P, Sb, Al, Pr, Sm, Yb, and $B^1$, $M^5$ represents at least one element selected from halogen elements, $M^6$ represents at least one element selected from the group consisting of N, O, and S, x and y represent values that satisfy the following expressions:

$$0 < x < 3$$

$$0 < y < 1, \text{ and}$$

$$0 < 3-x-y, \text{ and}$$

a, b, c, and d represent values that satisfy the following expressions:

$$0.5 \leq a \leq 1.5$$

$$0 \leq b \leq 0.6$$

$$0 \leq c \leq 0.3$$

$$4.5 \leq d \leq 5.5, \text{ and}$$

$$b+c \geq 0.$$

In Formula [1], $M^2$ may contain Eu.
In Formula [1], $M^1$ may contain Sr.
In Formula [1], the value of y may satisfy $0.01 \leq y \leq 0.1$.
In Formula [1], the value of x may satisfy $0.8 \leq x \leq 1.2$.
In Formula [1], the value of x may satisfy $0.5 \leq x \leq 0.8$.

A phosphor according to a third aspect has a chemical composition represented by Formula [1B]:

$$Sr_{3-x-y}Ba_xEu_ySiO_5 \quad [1B]$$

wherein in Formula [1B], x and y represent values that satisfy $0 \leq x \leq 3$, $0 \leq y \leq 1$, and $0 < 3-x-y$.

In Formula [1B], x may represent 1.

In the phosphor according to the first or second aspect, a material different from the phosphor may be present on the surface of the phosphor.

A method for producing a phosphor according to a fourth aspect is a method for producing the phosphor according to the second aspect and includes firing a material mixture containing at least one compound selected from the group consisting of alkaline-earth-metal halides, alkali metal phosphates, alkali metal halides, zinc compounds, and compounds of the elements in group 15 of the periodic table.

A phosphor composition according to a fifth aspect contains the phosphor according to the first or second aspect and a liquid medium.

A light-emitting device according to a sixth aspect includes a first illuminant and a second illuminant that emits visible light by irradiation with light emitted from the first illuminant, wherein as a first phosphor, the second illuminant contains at least one of the phosphors according to the first and second aspects.

In the sixth aspect, as a second phosphor, the second illuminant may contain at least one phosphor different in emission wavelength from the first phosphor.

In this aspect, the first illuminant may have an emission peak of 420 nm to 500 nm, and the second illuminant may contain at least one phosphor having an emission peak of 490 nm to 560 nm as the second phosphor.

In this aspect, the first illuminant may have an emission peak of 300 nm to 420 nm, and as the second phosphor, the second illuminant may contain at least one phosphor having an emission peak of 420 nm to 490 nm and at least one phosphor having an emission peak of 490 nm to 560 nm.

An image display according to a seventh aspect includes the light-emitting device according to the sixth aspect as a light source.

An illumination apparatus according to an eighth aspect includes the light-emitting device according to the sixth aspect as a light source.

DETAILED DESCRIPTION

Figure 1A:
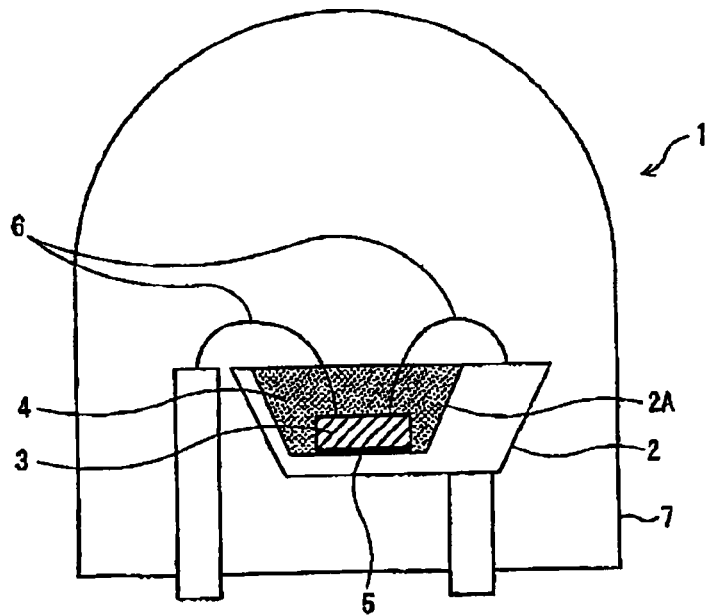
FIG. 1a is a schematic cross-sectional view of a light-emitting device according to an embodiment of the present invention.

The inventors have conducted intensive studies on compositions and crystal structures of phosphors mainly composed of alkaline-earth metal silicates and have found an orange to red phosphor that emits light with very high efficiency within a specific composition range defined by Formula [1] described below. The inventors also have found that the phosphor having a composition represented by Formula [1] has an excellent emission-intensity maintenance ratio when the temperature of the phosphor is changed. These findings have led to the completion of the present invention.

The present invention provides a high-performance phosphor that emits orange to red light with high luminous efficiency and high luminance.

The present invention also provides an orange to red phosphor having excellent temperature characteristics. The phosphor having excellent temperature characteristics can also be used for a light-emitting device including a high-power LED. Thus, a high-power high-luminance light-emitting device can be provided.

The use of a composition containing the phosphor results in a high-efficiency high-performance light-emitting device.

This light-emitting device is suitable for use in image displays and illumination apparatuses.

While the present invention will be described in more detail, the present invention is not limited to the following description. Various changes may be made within the scope of the gist of the invention.

[1. Phosphor]

[1-1. Characteristics of Phosphor]

Temperature Characteristics

Preferably, a phosphor of the present invention has excellent temperature characteristics and satisfies Formula [2] and/or Formula [3]. In Formulae [2] and [3], $R_x(y)$ represents an emission peak intensity when the phosphor is excited by excitation light having a wavelength of x nm at a temperature of y° C. That is, the numerical subscript x next to R denotes the wavelength of excitation light (unit: nm), and the value y inside the parentheses denotes the surface temperature (unit: ° C.) of the phosphor.

$$85 \leq \{R_{455}(125)/R_{455}(25)\} \times 100 \leq 110 \quad [2]$$

$$92 \leq \{R_{405}(125)/R_{405}(25)\} \times 100 \leq 110 \quad [3]$$

wherein in Formula [2], $R_{455}(25)$ represents an emission peak intensity when the phosphor is excited by light having a peak wavelength of 455 nm at 25° C., $R_{455}(125)$ represents an emission peak intensity when the phosphor is excited by light having a peak wavelength of 455 nm at 125° C., and wherein in Formula [3], $R_{405}(25)$ represents an emission peak intensity when the phosphor is excited by light having a peak wavelength of 405 nm at 25° C., and $R_{405}(100)$ represents an emission peak intensity when the phosphor is excited by light having a peak wavelength of 405 nm at 100° C.

Formula [2] represents the ratio of the emission intensity at 125° C., $R_{455}(125)$, to the emission intensity at 25° C., $R_{455}(25)$, in other words, the emission-intensity maintenance ratio when the temperature of the phosphor is changed.

The value of Formula [2] is usually 85 or more, preferably 87 or more, more preferably 89 or more, and still more preferably 91 or more, and usually 110 or less.

Formula [3] means the ratio of the emission intensity at 100° C., $R_{405}(100)$, to the emission intensity at 25° C., $R_{405}(25)$, in other words, the emission-intensity maintenance ratio when the temperature of the phosphor is changed.

The value of Formula [3] is usually 92 or more, preferably 93 or more, and more preferably 94 or more, and usually 110 or less.

In common phosphors, emission intensity decreases with increasing temperature. Thus, it is unlikely that the emission-intensity maintenance ratio exceeds 100. Even if for some reason the ratio exceeds 100, there is no problem. However, when the emission-intensity maintenance ratio exceeds 110, the color shift of a light-emitting device due to temperature changes tends to occur as in the case of a low emission-intensity maintenance ratio. Therefore, the emission-intensity maintenance ratio is preferably close to 100. Most preferably, the emission-intensity maintenance ratio is 100.

The phosphor of the present invention preferably satisfies at least one of Formulae [2A], [2B], [3A], and [3B], in addition to Formulae [2] and [3].

$$92 \leq \{R_{455}(100)/R_{455}(25)\} \times 100 \leq 110 \quad [2A]$$

$$83 \leq \{R_{455}(150)/R_{455}(25)\} \times 100 \leq 110 \quad [2B]$$

$$88 \leq \{R_{405}(125)/R_{405}(25)\} \times 100 \leq 110 \quad [3A]$$

$$83 \leq \{R_{405}(150)/R_{405}(25)\} \times 100 \leq 110 \quad [3B]$$

wherein in each of Formulae [2A] and [2B], $R_{455}(100)$ represents an emission peak intensity when the phosphor is excited by light having a peak wavelength of 455 nm at 100° C., $R_{455}(150)$ represents an emission peak intensity when the phosphor is excited by light having a peak wavelength of 455 nm at 150° C., and $R_{455}(25)$ is as defined in Formula [2], and wherein each of Formulae [3A] and [3B], $R_{405}(125)$ represents an emission peak intensity when the phosphor is excited by light having a peak wavelength of 405 nm at 125° C., $R_{405}(150)$ represents an emission peak intensity when the phosphor is excited by light having a peak wavelength of 405 nm at 150° C., and $R_{405}(25)$ is as defined in Formula [3].

Formula [2A] means the ratio of the emission intensity at 100° C., $R_{455}(100)$, to the emission intensity at 25° C., $R_{455}(25)$, in other words, the emission-intensity maintenance ratio when the temperature of the phosphor is changed.

The value of Formula [2A] usually 92 or more, preferably 93 or more, more preferably 94 or more, and still more preferably 95 or more, and usually 110 or less.

Formula [2B] means the ratio of the emission intensity at 150° C., $R_{455}(150)$, to the emission intensity at 25° C., $R_{455}(25)$, in other words, the emission-intensity maintenance ratio when the temperature of the phosphor is changed.

The value of Formula [2B] is usually 83 or more, preferably 84 or more, more preferably 85 or more, and still more preferably 86 or more, and usually 110 or less.

Formula [3A] means the ratio of the emission intensity at 125° C., $R_{405}(125)$, to the emission intensity at 25° C., $R_{405}(25)$, in other words, the emission-intensity maintenance ratio when the temperature of the phosphor is changed.

The value of Formula [3A] usually 88 or more, preferably 90 or more, and more preferably 92 or more, and usually 110 or less.

Formula [3B] means the ratio of the emission intensity at 150° C., $R_{405}(150)$, to the emission intensity at 25° C., $R_{405}(25)$, in other words, the emission-intensity maintenance ratio when the temperature of the phosphor is changed.

The value of Formula [3B] is usually 83 or more, preferably 85 or more, and more preferably 87 or more, and usually 110 or less.

In the case where the phosphor is used in a light-emitting device, the temperature of the phosphor may rise owing to heat produced by a light source ("first illuminant" described below). In particular, brighter light-emitting devices have recently been required. Thus, high-power light sources, such as power LEDs, are used as light sources, in some cases. Such high-power light sources usually produce large amounts of heat, thus resulting in a large temperature rise.

At a low emission-intensity maintenance ratio, in the case of a light-emitting device including a GaN-based LED and the like, an increase in temperature during operation is liable to cause a reduction in emission intensity, and a change in temperature is liable to cause a change in the emission color of the light-emitting device, which are not preferred. On the other hand, a high emission-intensity maintenance ratio results in a tendency to suppress a reduction in emission intensity and a change in emission color described above, which is preferred. The reduction in emission intensity and the change in emission color due to temperature changes are referred to as "temperature characteristics". A phosphor in which the changes in emission intensity and color due to temperature changes are small is referred to as "a phosphor having excellent temperature characteristics".

The phosphor of the present invention has excellent temperature characteristics as described above. Thus, the phosphor of the present invention can be suitably used for light-emitting devices and the like described below.

For example, the emission-intensity maintenance ratio can be measured with a multichannel spectrophotometer MCPD7000, as an emission spectrometer, manufactured by Otsuka Electronics Co., Ltd., a luminance colorimeter BM5A as a luminance measuring apparatus, a stage including a cooling mechanism with a Peltier element and a heating mechanism with a heater, and an apparatus provided with a 150-W xenon lamp as a light source, as described below.

A cell into which a phosphor sample is charged is placed on the stage. The temperature is changed in the range of 20° C. to 150° C. It is checked that the surface of the phosphor has a constant temperature of 25° C., 100° C., 125° C., or 150° C. The phosphor is excited by 405- or 455-nm light obtained by dispersing light from the light source with a diffraction grating, and an emission spectrum is measured. The emission peak intensity is determined from the measured emission spectrum.

Corrected values obtained by using temperature values measured with a radiation thermometer and a thermocouple are used as the measurements of the surface temperature of the phosphor.

The relative value of the emission peak intensity at 100° C., 125° C. or 150° C. which determined from the emission spectrum measured with the spectrometer to the emission peak intensity at 25° C. refers to the emission-intensity maintenance ratio.

For example, the emission-intensity maintenance ratio when a phosphor is excited by 455-nm light at 125° C. may be determined as follows.

When an emission peak intensity obtained by exciting the phosphor by light having a peak wavelength of 455 nm at 25° C. is referred to as $R_{455}(25)$ and when an emission peak intensity obtained by exciting the phosphor by light having a peak wavelength of 455 nm at 125° C. is referred to as $R_{455}(125)$, the value of $\{R_{455}(125)/R_{455}(25)\} \times 100$ is defined as the emission-intensity maintenance ratio when the phosphor is excited by 455-nm light at 125° C.

Characteristics of Emission Spectrum

The spectrum of the fluorescence (emission spectrum) of the phosphor of the present invention is not particularly limited. In view of the applications of the phosphor as an orange to red phosphor, in the case where the phosphor is excited by light having a wavelength of 405 nm or 455 nm, the emission spectrum preferably satisfies requirements (2) and (3):

(2) the emission peak wavelength is in the range of 570 nm to 680 nm, and (3) the full width at half maximum of an emission peak is 90 nm or less.

The phosphor of the present invention has an emission peak in the wavelength range of usually 570 nm or more, preferably 580 nm or more, and more preferably 590 nm or more, and usually 680 nm or less, preferably 650 nm or less, and more preferably 640 nm or less. An emission peak at a shorter wavelength results in an excessive reduction of a red component. Thus, in the case of a white-light-emitting device, the phosphor is possibly inadequate as a red phosphor. An emission peak at a longer wavelength increases light having a low luminosity factor, thus possibly reducing the luminance of the phosphor.

In the case where the phosphor of the present invention has a plurality of emission peaks, the wavelength of the peak of the highest intensity is defined as the emission peak wavelength.

In the phosphor of the present invention, the full width at half maximum (hereinafter, appropriately referred to as "FWHM") of the emission peak is usually 90 nm or less, preferably 87 nm or less, and more preferably 84 nm or less, and usually 50 nm or more, preferably 70 nm or more, and more preferably 80 nm or more. Such a narrow FWHM results in emission having a good balance between the red component in the emission of the phosphor and luminance.

In the case where the phosphor of the present invention has a plurality of emission peaks, the width of a wavelength region having an intensity equal to or higher than half the intensity of an emission peak having the highest intensity is defined as the full width at half maximum.

To evaluate the phosphor of the present invention, for example, a xenon lamp can be used to excite the phosphor by light having a wavelength of 405 nm or 455 nm. In this case, the phosphor is irradiated with light having a predetermined wavelength obtained with a grating spectrometer or the like. A GaN-based LED and a GaN-based LD may be used as excitation light sources. The emission spectrum of the phosphor of the present invention can be measured with a 150-W xenon lamp as an excitation light source and a fluorescence spectrometer (manufactured by JASCO Corporation) provided with a CCD multichannel detector C7041 (manufactured by Hamamatsu Photonics K.K.) as a spectrometer at room temperature, e.g., 25° C. The emission peak wavelength and the full width at half maximum can be calculated from the resulting emission spectrum.

Characteristics of Excitation Wavelength

The phosphor of the present invention may be capable of being excited by light in the wavelength range of 200 nm to 500 nm. The excitation wavelength is not particularly limited. For example, when the phosphor can be excited by light in the blue region and/or light in the near-ultraviolet region, the phosphor can be suitably used for a light-emitting device including, for example, a semiconductor light-emitting device as a first illuminant.

The excitation spectrum can be measured with a 150-W xenon lamp as an excitation light source and a fluorescence spectrometer (manufactured by JASCO Corporation) provided with a CCD multichannel detector C7041 (manufactured by Hamamatsu Photonics K.K.) as a spectrometer at room temperature, e.g., 25° C. The excitation peak wavelength can be calculated from the resulting excitation spectrum.

Absorption Efficiency

The phosphor of the present invention having a higher absorption efficiency is preferred. The value of the absorption efficiency preferably satisfies requirements (4) and/or (5).

(4) When the phosphor is excited by light having a peak wavelength of 455 nm, the absorption efficiency is usually 60% or more, preferably 70% or more, and more preferably 75% or more.

(5) When the phosphor is excited by light having a peak wavelength of 405 nm, the absorption efficiency is usually 85% or more, preferably 90% or more, and more preferably 92% or more.

An absorption efficiency less than the above-described range is liable to cause an increase in the amount of excitation light required for a predetermined emission and an increase in energy consumption, which is not preferred.

A method for measuring the absorption efficiency will be described below.

Internal Quantum Efficiency

The phosphor of the present invention having a higher internal quantum efficiency is preferred. The value of the internal quantum efficiency preferably satisfies requirements (6) and/or (7).

(6) When the phosphor is excited by light having a peak wavelength of 455 nm, the internal quantum efficiency is usually 64% or more, preferably 66% or more, more preferably 68% or more, and still more preferably 70% or more.

(7) When the phosphor is excited by light having a peak wavelength of 405 nm, the internal quantum efficiency is usually 56% or more, preferably 57% or more, and more preferably 58% or more.

The internal quantum efficiency is the ratio of the number of photons emitted to the number of photons of excitation light absorbed by a phosphor. A low internal quantum efficiency is liable to cause an increase in the amount of excitation light required for a predetermined emission and an increase in energy consumption, which is not preferred.

A method for measuring the internal quantum efficiency will be described below.

External Quantum Efficiency

The phosphor of the present invention having a higher external quantum efficiency is preferred. The value of the external quantum efficiency preferably satisfies requirements (8) and/or (9).

(8) When the phosphor is excited by light having a peak wavelength of 455 nm, the external quantum efficiency is usually 45% or more, preferably 48% or more, and more preferably 50% or more.

(9) When the phosphor is excited by light having a peak wavelength of 405 nm, the external quantum efficiency is usually 48% or more, preferably 50% or more, more preferably 52% or more, and particularly preferably 54% or more.

A low external quantum efficiency is liable to cause an increase in the amount of excitation light required for a predetermined emission and an increase in energy consumption, which is not preferred.

A method for measuring the external quantum efficiency will be described below.

Method for Measuring Absorption Efficiency, Internal Quantum Efficiency, and External Quantum Efficiency Methods for determining the absorption efficiency $\alpha_q$, the internal quantum efficiency $\eta_i$, and the external quantum efficiency $\eta_o$ will be described below.

A phosphor sample (e.g., a powder) to be measured is charged into a cell so as to have a sufficiently smooth surface to maintain measurement accuracy and is attached to a light collector such as an integrating sphere. The reason for using the light collector such as the integrating sphere is that all photons reflected from the phosphor sample and emitted from the phosphor sample by a fluorescence phenomenon are counted. In other words, the reason is that photons which are not counted or fly outside the system of measurement are eliminated.

A light source for exciting the phosphor is attached to the light collector such as the integrating sphere. For example, the light source is a Xe lamp. Light from the light source is adjusted into monochromatic light having an emission peak wavelength of, for example, 405 nm or 455 nm with a filter, a monochromator (grating spectrometer), or the like. The target phosphor sample is irradiated with adjusted light having such an emission peak wavelength. The spectrum including an emitted light component (fluorescence) and a reflected light component is measured with a spectrometer, for example, MCPD2000 or MCPD7000 manufactured by Otsuka Electronics Co., Ltd. In fact, the spectrum measured here includes the reflected light component, which is not absorbed in the phosphor, of light from the excitation light source (hereinafter, simply referred to as "excitation light") and the light component (fluorescence), having another wavelength, emitted from the phosphor when the phosphor absorbs the excitation light. That is, a region close to the excitation light corresponds to a reflection spectrum. A region having wavelengths longer than those of the above region corresponds to a fluorescence spectrum (hereinafter, also referred to as "emission spectrum").

The absorption efficiency $\alpha_q$ is a value obtained by dividing the number of photons Nabs of the excitation light absorbed by the phosphor sample by the total number of photons N of the excitation light.

The latter, i.e., the total number of photons N of the excitation light, is determined as follows. A reflector composed of a material having a reflectance R of substantially 100% to the excitation light, e.g., "Spectralon" manufactured by Labsphere, Inc., (Spectralon has a reflectance R of 98% to 450-nm excitation light) is attached as an object subject to measurement in the light collector such as the integrating sphere in the same arrangement as the phosphor sample. A reflection spectrum $I_{ref}(\lambda)$ is measured with the spectrometer. The value of (Expression I) determined using the reflection spectrum $I_{ref}(\lambda)$ is proportional to N.

[Ex. 1]

$$\frac{1}{R}\int \lambda \cdot I_{ref}(\lambda) d\lambda \qquad \text{(Expression I)}$$

With respect to the integration interval, the integration may be performed over only an interval in which $I_{ref}(\lambda)$ substantially has a significant value.

The number of photons $N_{abs}$ of the excitation light absorbed by the phosphor sample is proportional to an amount determined by (Expression II) described below.

[Ex. 2]

$$\frac{1}{R}\int \lambda \cdot I_{ref}(\lambda) d\lambda - \int \lambda \cdot I(\lambda) d\lambda \qquad \text{(Expression II)}$$

wherein $I(\lambda)$ represents a reflection spectrum when the target phosphor sample with the absorption efficiency $\alpha_q$ to be determined is attached. The integration interval of (Expression II) is the same as the integration interval determined in (Expression I). The limitation of the integration interval allows the second term of (Expression II) to correspond to the number of photons generated by reflection of the excitation light from the target phosphor sample. In other words, the limitation allows the second term to correspond to the remainder of all photons generated from the target phosphor sample except photons derived from the fluorescence phenomenon. Actual spectrum measurements are typically obtained as digital data separated by a finite bandwidth regarding $\lambda$. Thus, the integrals, i.e., (Expression I) and (Expression II), are determined by the finite sum based on the bandwidth.

Accordingly, $\alpha q$ is determined as follows: $\alpha_q = N_{abs}/N =$ (Expression II)/(Expression I).

A method for determining the internal quantum efficiency $\eta_i$ will be described below. $\eta_i$ is a value obtained by dividing the number of photons $N_{PL}$ derived from the fluorescence phenomenon by the number of photons $N_{abs}$ absorbed by the phosphor sample.

Here, $N_{PL}$ is proportional to an amount determined by (Expression III) described below.

[Ex. 3]

$$\int \lambda \cdot I(\lambda) d\lambda \qquad \text{(Expression III)}$$

In this case, the integration interval is limited to the wavelength range of photons derived from the fluorescence phenomenon of the phosphor sample. This is because the influence of photons reflected from the phosphor sample is eliminated. Specifically, the lower limit of the integration interval of (Expression III) is the same as the upper limit of the integration interval of (Expression I). The upper limit of the integration interval of (Expression III) is set in such a manner that the photons derived from the fluorescence are sufficiently included.

Accordingly, the internal quantum efficiency $\eta_i$ is determined as follows: $\eta_i =$ (Expression III)/(Expression II).

Integration of the spectrum obtained as digital data is performed in the same way as in the case where the absorption efficiency $\alpha_q$ is determined.

The external quantum efficiency $\eta_o$ is determined by multiplying the absorption efficiency $\alpha_q$ by the internal quantum efficiency $\eta_i$. Alternatively, the external quantum efficiency $\eta_o$ may be determined from the relationship $\eta_o =$ (Expression III)/(Expression I). $\eta_o$ is a value obtained by dividing the number of photons NPL derived from the fluorescence by the total number of photons N of the excitation light.

Weight Median Diameter ($D_{50}$)

The phosphor of the present invention has a weight median diameter of usually 1 μm or more, preferably 2 μm or more, and more preferably 10 μm or more, and usually 40 μm or less, preferably 30 μm or less, and more preferably 26 μm or less. An excessively small weight median diameter is liable to cause a reduction in luminance and the aggregation of the phosphor particles, which is not preferred. An excessively large weight median diameter is liable to cause nonuniform application and clogging of a dispenser, which is not preferred.

The weight median diameter of the phosphor of the present invention can be measured with an apparatus, for example, a laser diffraction/scattering particle size distribution analyzer.

Characteristics of Color of Light

The phosphor of the present invention usually emits orange to red light.

In the case where the phosphor of the present invention usually emits orange to red light, the color coordinates of the fluorescence are usually coordinates in an area region surrounded by coordinates (x, y)=(0.52, 0.48), (0.44, 0.40), (0.56, 0.20), and (0.72, 0.28), and preferably (x, y)=(0.52, 0.48), (0.48, 0.44), (0.64, 0.24), and (0.72, 0.28).

The color coordinates x and y of the fluorescence can be determined by calculation according to JIS Z 8724 (Method of color measurement—Light-source color) using the emission spectrum of the phosphor. In the present invention, light having a wavelength of 400 nm to 480 nm is used as the excitation light. To eliminate the influence of the excitation light that is not absorbed, the calculation is performed using only a region having wavelengths of 480 nm or more in the emission spectrum.

Composition

The phosphor of the present invention preferably contains Eu and/or Ce as an activation element. From the viewpoint of easily obtaining a phosphor having a high luminous efficiency (internal quantum efficiency and external quantum efficiency), more preferably, Eu is contained in the phosphor, and still more preferably, Eu and Si are contained in the phosphor.

[1-2. Phosphor Represented by Formula [1]]
[1-2-1. Composition]

The phosphor of the present invention has a chemical composition represented by Formula [1]:

$$M^1{}_{3-x-y}Ba_xM^2{}_yM^3{}_aM^4{}_bM^5{}_cM^6{}_d \qquad [1]$$

wherein in Formula [1], $M^1$ represents at least one element selected from the group consisting of Zn and alkaline-earth-metal elements except Ba, $M^2$ represents at least one activation element selected from the group consisting of Eu, Ce, Cr, Mn, Sm, Tm, Tb, Er, and Yb, $M^3$ represents a tetravalent element containing at least Si, M⁴ represents at least one element selected from the group consisting of alkali-metal elements, La, Gd, P, Sb, Al, Pr, Sm, Yb, and Bi, M⁵ represents at least one element selected from halogen elements, M⁶ represents at least one element selected from the group consisting of N, O, and S, x and y represent values that satisfy the following expressions:

$$0<x<3$$

$$0<y<1, \text{ and}$$

$$0<3-x-y, \text{ and}$$

a, b, c, and d represent values that satisfy the following expressions:

$$0.5 \leq a \leq 1.5$$

$$0 \leq b \leq 0.6$$

$$0 \leq c \leq 0.3$$

$$4.5 \leq d \leq 5.5, \text{ and}$$

$$b+c \geq 0.$$

The phosphor represented by Formula [1] is characterized by indispensably containing Ba and by containing at least one alkaline-earth-metal element except Ba.

<M¹>

In Formula [1], M¹ represents at least one element selected from the group consisting of Zn and alkaline-earth-metal elements except Ba. The alkaline-earth-metal elements are Be, Mg, Ca, Sr, Ba, and Ra. M¹ may contain any one of these elements. Alternatively, M¹ may contain a combination of any two or more elements in any proportion. More preferably, M¹ represents one or two or more elements selected from the group consisting of Be, Mg, Ca, Sr, and Ba. Still more preferably, M¹ represents one or two or more elements selected from the group consisting of Mg, Ca, and Sr. In particular, M¹ preferably contains at least Sr. More preferably, M¹ mainly contains Sr. M¹ preferably has a Sr content of 60 mol % or more, more preferably 80 mol % or more, and particularly preferably 100 mol %.

The incorporation of Sr in M¹ improves the durability of the phosphor to withstand hydrolysis.

<M²>

In Formula [1], M² represents an activation element. Specific examples of M² include transition-metal elements, such as Cr and Mn; and rare-earth elements, such as Eu, Sm, Tm, Yb, Ce, Tb, and Er. M² may contain any one of these elements. Alternatively, M² may contain a combination of any two or more elements in any proportion. Among these, preferably, M² represents one or two or more elements selected from the group consisting of Sm, Eu, and Yb. More preferably, M² contains Eu, and still more preferably, M² consists of Eu, because suitable red light is emitted.

<M³>

In Formula [1], M³ represents a tetravalent element containing at least Si. Preferably, M³ is mainly composed of Si. M³ preferably has a Si content of 80% or more, more preferably 95 mol % or more, and most preferably 100 mol %. In M³, Si may be partially replaced with, for example, Ge, Ti, or Zr. The proportion of another element with which Si is replaced is preferably minimized in view of red emission intensity. Specifically, the content of the other element such as Ge is preferably 20 mol % or less and more preferably 5 mol % or less relative to Si.

<M⁴>

In Formula [1], M⁴ represents at least one element selected from the group consisting of alkali-metal elements, La, Gd, P, Sb, Al, Pr, Sm, Yb, and Bi. The alkali-metal elements refer to Li, Na, K, Rb, Cs, and Fr. M⁴ may contain any one of these elements. Alternatively, M⁴ may contain a combination of two or more in any proportion. M⁴ preferably represents one or two or more elements selected from the group consisting of Li, Na, K, Rb, Cs, La, Gd, P, Sb, Al, Pr, Sm, Yb, and Bi. More preferably, M⁴ represents one or two or more selected from the group consisting of Na, K, Rb, Cs, La, Gd, P, Sb, Al, Pr, Sm, Yb, and Bi. Among these, M⁴ preferably represents one or two or more elements selected from the group consisting of P, Sb, and Bi because of a marked effect of improving luminance. Particularly preferably, M⁴ contains Bi.

<M⁵>

In Formula [1], M⁵ represents at least one element selected from halogen elements. The halogen elements refer to F, Cl, Br, I, and At. M⁵ may contain any one of these elements. Alternatively, M⁵ may contain a combination of two or more in any proportion. More preferably, M⁵ represents one or two or more elements selected from the group consisting of F, Cl, Br, and I. M⁵ preferably contains F and/or Cl because of a marked effect of improving luminance by facilitating crystal growth and reducing lattice defects.

<M⁶>

In Formula [1], M⁶ represents at least one element selected from the group consisting of N, O, and S. M⁶ may contain any one of these elements. Alternatively, M⁶ may contain a combination of two or more in any proportion. M⁶ may contain O and may further contain N and/or S in addition to O. Preferably, M⁶ is mainly composed of O. Particularly preferably, M⁶ consists of O.

For example, in the case where M⁶ contains N and/or O, the ratio of O to N(O:N) is preferably 0.9:0.1 to 1:0 and more preferably 0.95:0.05 to 1:0.

<Preferred Range of x and y>

In Formula [1], x represents a value of the number of moles of Ba. Preferably, the value of x is close to 1. The value of x is usually more than zero, preferably 0.5 or more, more preferably 0.7 or more, and particularly preferably 0.8 or more, and usually less than 3, preferably 2.5 or less, more preferably 2 or less, still more preferably 1.5 or less, and particularly preferably 1.2 or less. Adjusting the value of x within the range described above results in a phosphor having a high emission intensity and a high durability.

In Formula [1], y represents a value of the number of moles of M². The value of y is usually more than 0, preferably 0.001 or more, more preferably 0.005 or more, still more preferably 0.01 or more, and most preferably 0.015 or more, and usually less than 1, preferably 0.3 or less, more preferably 0.15 or less, particularly preferably 0.1 or less, and most preferably 0.05 or less. The emission intensity and emission wavelength can be controlled by adjusting the value of y. An excessively small value of y is liable to cause a reduction in emission intensity. An excessively large value of y is liable to cause a reduction in emission intensity by a phenomenon called concentration quenching.

Adjusting the values of x and y within the ranges described above results in a phosphor having a high emission intensity. The case where M¹ consists of Sr alone, the value of x is in the range of 0.9 to 1.1, and 3−x−y, i.e., the number of moles of M¹, is in the range of 1.7 to 2.2, is more preferred because of a particularly high emission intensity. The case where M¹ consists of Sr alone and x=1 is most preferred. The case where a host crystal Sr₂BaSiO₅, in which the molar ratio of M¹ to Ba is 2:1, is partially replaced with the activation element M² is most preferred. In this case, the internal quantum efficiency and emission intensity of the phosphor are significantly high, and the temperature characteristics are also satisfactory. Furthermore, the emission peak wavelength shifts to longer wavelengths. Thus, the height of the emission spectrum at a wavelength of 630 nm is high. That is, a phosphor emitting light having a large amount of the red component is obtained. The phosphor in which x and y are within the specific range has a good balance between luminance and the red component. Therefore, a high-performance light-emitting device can be produced using the phosphor.

Patent Document 5 described above discloses $(Ba_{1-a}Sr_a)_3SiO_5:Eu^{2+}$ which is described as merely a mixed crystal of $Sr_3SiO_5$ and $Ba_3SiO_5$. In such a case, it is generally speculated that characteristics of an intermediate composition change monotonously with compositional change. In the present invention, surprisingly, it was found that the optimal composition ratio of Sr to Ba of the host crystal is 2:1.

the composition ratio (value of y) of the activation element $M^2$ in Formula [1] as well as the molar ratio of $M^1$ to Ba affects improvements in temperature characteristics and internal quantum efficiency. A smaller value of y is liable to lead to further improvement in temperature characteristics and internal quantum efficiency.

A value of x less than the range described above results in longer-wavelength light from the phosphor. In this case, when a light-emitting device is produced, red emission, which has been lacking in a light-emitting device including a known YAG phosphor, is enhanced, thus resulting in a white-light-emitting device having high color rendering properties. In this case, in Formula [1], the value of x is usually 0.2 or more and preferably 0.5 or more, and usually 2 or less, preferably 1.5 or less, more preferably 1 or less, and particularly preferably 0.8 or less.

<Preferred Range of a to d>

In Formula [1], a represents a value of the number of moles of $M^3$. Specifically, the value of a is preferably close to 1. The value of a is usually 0.5 or more, preferably 0.7 or more, and still more preferably 0.9 or more, and usually 1.5 or less, preferably 1.3 or less, and more preferably 1.1 or less. An excessively small or large value of a is liable to lead to a different crystal phase to reduce emission properties.

In Formula [1], b represents a value of the number of moles of $M^4$. Specifically, the value of b is usually 0 or more and preferably $1 \times 10^{-5}$ or more, and usually 0.6 or less, preferably 0.4 or less, and more preferably 0.2 or less.

In Formula [1], c represents a value of the number of moles of $M^5$. Specifically, the value of c is usually 0 or more and preferably $1 \times 10^{-4}$ or more, and usually 0.3 or less, preferably 0.2 or less, and more preferably 0.15 or less.

In Formula [1], d represents a value of the number of moles of $M^6$. Specifically, the value of $M^6$ is preferably close to 5. The value of $M^6$ is usually 4.5 or more, preferably 4.7 or more, more preferably 4.9 or more, and still more preferably 4.95 or more, and usually 5.5 or less, preferably 5.3 or less, more preferably 5.1 or less, and still more preferably 5.05 or less. An excessively small or large value of d is liable to lead to a different crystal phase to reduce emission properties.

<Preferred Chemical Composition>

In particular, the chemical composition of Formula [1] is preferably represented by Formula [1B]:

$$Sr_{3-x-y}Ba_xEu_ySiO_5 \quad [1B]$$

(wherein in Formula [1B], x and y represent values that satisfy $0 \leq x \leq 3$, $0 \leq y \leq 1$, and $0 < 3-x-y$).

In Formula [1B], suitable ranges of x, y, and $0 < 3-x-y$ are the same as those in Formula [1]. Particularly preferably, x=1.

<Specific Example of Preferred Composition>

Among the chemical compositions represented by Formula [1], preferably Formula [1B], preferred examples of the chemical composition will be described below. However, the composition of the phosphor of the present invention is not limited to the examples.

Preferred examples of the chemical composition represented by Formula [1] include $Sr_{1.98}Ba_1SiO_5:Eu_{0.02}$ and $Sr_{1.97}Ba_1SiO_5:Eu_{0.03}$. These have high emission intensity and are thus preferred.

Specific examples of the composition in which light emitted has longer wavelengths include $Sr_{2.18}Ba_{0.8}SiO_5:Eu_{0.02}$ and $Sr_{2.48}Ba_{0.5}SiO_5:Eu_{0.02}$.

[1-2-2. Crystal Structure]

The crystal structures of $Sr_3SiO_5$ and $Ba_3SiO_5$ are known. Tables 1 and 2 show the crystal structure parameters of $Sr_3SiO_5$ and $Ba_3SiO_5$. The two crystal structures have different space groups but substantially the same structure (atomic arrangement). The reason they have the different space groups are that they have slightly different lattice constants, slightly different atomic coordinates of each atom, and in particular, different site symmetries of oxygen atoms.

TABLE 1

<Crystal structure parameters>
Chemical formula: $Ba_3SiO_5$
Crystal system: Tetragonal system
Space group: I4/mcm
Space group No.: 140

| Lattice constant | | | | | |
|---|---|---|---|---|---|
| a (Å) | b (Å) | c (Å) | α (°) | β (°) | γ (°) |
| 7.3023 | 7.3023 | 11.2178 | 90 | 90 | 90 |

| Atomic coordinate | | | | |
|---|---|---|---|---|
| | Site | x | y | z |
| Ba1 | 4a | 0 | 0 | 0.25 |
| Ba2 | 8h | 0.1832 | 0.6832 | 0 |
| Si | 4b | 0 | 0.5 | 0.25 |
| O1 | 16l | 0.1278 | 0.6278 | 0.3367 |
| O2 | 4c | 0 | 0 | 0 |

Source: Acta Cryst., vol. B34, 649-651 (1978)

TABLE 2

<Crystal structure parameters>
Chemical formula: $Sr_3SiO_5$
Crystal system: Tetragonal system
Space group: P4/ncc
Space group No.: 130

| Lattice constant | | | | | |
|---|---|---|---|---|---|
| a (Å) | b (Å) | c (Å) | α (°) | β (°) | γ (°) |
| 6.934 | 6.934 | 10.72 | 90 | 90 | 90 |

| Atomic coordinate | | | | |
|---|---|---|---|---|
| | Site | x | y | z |
| Sr1 | 8f | 0.181 | 0.181 | 0.25 |
| Sr2 | 4c | 0 | 0.5 | 0 |
| Si | 4b | 0 | 0 | 0 |
| O1 | 16g | 0.169 | −0.092 | 0.088 |
| O2 | 4c | 0 | 0.5 | 0.25 |

Source: Acta Cryst., vol. 18, 453-454 (1965)

The inventors have analyzed the crystal structure of the phosphor of the present invention, $Sr_2BaSiO_5:Eu$, in detail by pattern fitting of powder X-ray diffraction data by the Rietveld method. The results demonstrated that a phosphor having a specific intracrystalline distribution of alkaline-earth-metal elements described below particularly had excellent properties such as luminance. The Rietveld analysis was performed with an analysis program RIETAN2000 with reference to "Funmatsu X sen kaiseki no jissai—Rietveld hou nyuumon" (Actuality of Powder X-ray Analysis (Introduction of Rietveld Method) written and edited by Izumi Nakai, Fujio Izumi, published by Asakura Publishing Co., Ltd. (2002)).

The phosphor of the present invention having the representative composition $Sr_2BaSiO_5$:Eu has substantially the same crystal structure as those of $Sr_3SiO_5$ and $Ba_3SiO_5$, and has two different sites occupied by the alkaline-earth-metal atoms in the crystal (hereinafter, referred to as "sites", in some cases). In each of the three phosphors, a site (large site) with a large coordination number and a large coordination distance of oxygen, and a site (small site) with a small coordination number and a small coordination distance are present in the ratio of 1:2. In the $Sr_2BaSiO_5$:Eu phosphor, possibly, the small site is occupied by Sr, and the large site is occupied by Ba, thereby stabilizing the crystal structure and resulting in emission with a high luminance. In particular, the occupancy of the large site by Ba is preferably 50% or more and more preferably 70% or more. The occupancy of the small site by Sr is preferably 50% or more and more preferably 70% or more.

Analysis by the Rietveld method demonstrated that the phosphor of the present invention was a crystal belonging to a space group selected from P4/ncc (No. 130), which was the same space group as that of $Sr_3SiO_5$, and I4/mcm (No. 140), which was the same space group as that of $Ba_3SiO_5$, as described in detail in Examples below. Even supposing that the phosphor belongs to either space group, substantially equivalent fitting data was obtained. Thus, it could not be determined which space group the phosphor belongs to. The space group I4/mcm (No. 140) has slightly higher symmetry. $Cs_3CoCl_5$ belongs to the same space group.

Even when the phosphor of the present invention belongs to either space group, Ba is selectively arranged at the large site, and Sr is selectively arranged at the small site. This may result in the phosphor having excellent properties. In the case of P4/ncc, the large site is a site assigned to 4c in Wyckoff notation, and the small site is a site assigned to 8f in Wyckoff notation. In the case of I4/mcm, the large site is a site assigned to 4a in Wyckoff notation, and the small site is a site assigned to 8 h in Wyckoff notation.

The details regarding the space groups and symmetry of the crystal have been described with reference to International Tables for Crystallography (Third, Revised Edition), Volume A Space-Group Symmetry.

The phosphor of the present invention emits light by, for example, electron beams, X-rays, or electric fields as well as ultraviolet rays or visible light. Thus, the phosphor of the present invention can also be effectively used not only as a phosphor utilizing the excitation means described above but also for a light-emitting device of the present invention including an excitation light source such as an LED or an LD.

With respect to practical characteristics of the phosphor of the present invention other than the emission properties, $Ba_3SiO_5$ has a problem in that it is readily hydrolyzed. However, in the phosphor of the present invention, such a problem does not occur.

[1-2-3. Surface Treatment]

The phosphor of the present invention has excellent hydrolysis resistance as described above. To further improve weather resistance such as moisture resistance thereof or to improve the dispersibility thereof in a resin of a phosphor-containing portion of a light-emitting device described below, another material may be present on the surface of the phosphor by subjecting the phosphor to surface treatment, i.e., by covering the surface of the phosphor with another material.

Examples of a material that can be present on the surface of the phosphor (hereinafter, also referred to as a "surface-treating material") include organic compounds, inorganic compounds, and glass materials.

Examples of the organic compound include thermoplastic polymers, such as acrylic resins, polycarbonates, polyamides, and polyethylenes; latex; and polyorganosiloxanes.

Examples of the inorganic compound include metal oxides, such as magnesium oxide, aluminum oxide, silicon oxide, titanium oxide, zirconium oxide, tin oxide, germanium oxide, tantalum oxide, niobium oxide, vanadium oxide, boron oxide, antimony oxide, zinc oxide, yttrium oxide, and bismuth oxide; metal nitrides, such as silicon nitride and aluminum nitride; orthophosphates; and polyphosphates such as calcium phosphate, barium phosphate, and strontium phosphate.

Examples of the glass material include borosilicates, phosphosilicates, and alkali silicates.

These surface-treating materials may be used in combination of two or more.

The structure of the phosphor obtained by surface treatment described above is exemplified as follows, provided that the surface-treating material is present:

(i) a structure in which the surface-treating material constitutes a continuous film to cover the surface of the phosphor; and (ii) a structure in which many fine particles of the surface-treating material are attached to the surface of the phosphor to cover the surface of the phosphor.

The amount of the surface-treating material attached to or covering the surface of the phosphor is usually 1 percent by weight or more, preferably 5 percent by weight or more, and more preferably 10 percent by weight or more, and usually 50 percent by weight or less, preferably 30 percent by weight or less, and more preferably 20 percent by weight or less, relative to the weight of the phosphor. An excessively large amount of the surface-treating material for the phosphor may degrade the emission properties of the phosphor. An excessively small amount thereof may result in incomplete surface coverage; hence, moisture resistance and dispersibility are not improved, in some cases.

The thickness of the surface-treating-material film (layer) formed by surface treatment is usually 10 nm or more and preferably 50 nm or more, and usually 2,000 nm or less and preferably 1,000 nm or less. An excessively large thickness may degrade the emission properties of the phosphor. An excessively small thickness may result in incomplete surface coverage; hence, moisture resistance and dispersibility are not improved, in some cases.

A surface treatment method is not particularly limited. An example thereof is a coating treatment method with a metal oxide (silicon oxide) described below.

The phosphor of the present invention is added to an alcohol such as ethanol. The mixture is stirred. An alkali aqueous solution such as aqueous ammonia is added thereto. The mixture is stirred. A hydrolyzable alkyl silicate ester, such as tetraethylorthosilicate is added thereto. The mixture is stirred. After the resulting solution is allowed to stand for 3 minutes to 60 minutes, the supernatant including silicon oxide particles that are not attached to the surface of the phosphor is removed with a dropper. After operations of alcohol addition, stirring, standing, and supernatant removal are repeated several times, the resulting mixture is dried at 120° C. to 150° C. for 10 minutes to 5 hours, e.g., 2 hours, under reduced pressure to give a surface-treated phosphor.

Furthermore, examples of an applicable method for treating the surface of the phosphor include known methods, such as a method of attaching fine spherical particles of silicon oxide to a phosphor (Japanese Unexamined Patent Application Publication Nos. H2-209989 and H2-233794), a method of attaching a film composed of a silicon compound to a phosphor (Japanese Unexamined Patent Application Publication No. H3-231987), a method of covering surfaces of fine phosphor particles with fine polymer particles (Japanese Unexamined Patent Application Publication No. H6-314593), a method of coating a phosphor with an organic material, an inorganic material, a glass material, or the like (Japanese Unexamined Patent Application Publication No. 2002-223008), a method of covering the surface of a phosphor by chemical vapor deposition (Japanese Unexamined Patent Application Publication No. 2005-82788), and a method of attaching particles of a metal compound (Japanese Unexamined Patent Application Publication No. 2006-28458).

[1-3. Method for Producing Phosphor]

A method for producing the phosphor of the present invention is not particularly limited. For example, the phosphor can be produced by mixing a material for the metal element $M^1$ (hereinafter, appropriately referred to as an "$M^1$ source"), a material for Ba (hereinafter, appropriately referred to as a "Ba source"), a material for the metal element $M^2$ (hereinafter, appropriately referred to as an "$M^2$ source"), a material for the metal element $M^3$ (hereinafter, appropriately referred to as an "$M^3$ source"), a material for the metal element $M^4$ (hereinafter, appropriately referred to as an "$M^4$ source"), and a material for the metal element $M^5$ (hereinafter, appropriately referred to as an "$M^5$ source") in Formula [1] (mixing step) and firing the resulting mixture (siring step).

<Material>

Examples of the $M^1$ source, the Ba source, the $M^2$ source, the $M^3$ source, the $M^4$ source, and the $M^5$ source that are used for the production of the phosphor of the present invention include oxides, hydroxides, carbonates, nitrates, sulfates, oxalates, carboxylates, and halides of the elements of $M^1$, Ba, $M^2$, $M^3$, $M^4$, and $M^5$. These sources may be appropriately selected from these compounds in view of reactivity to a complex oxide and low amounts of $NO_x$, $SO_x$, etc. generated during firing.

Specific examples of the $M^1$ source are enumerated below by type of $M^1$ metal.

Specific examples a Sr source include SrO, $Sr(OH)_2 \cdot 8H_2O$, $SrCO_3$, $Sr(NO_3)_2$, $SrSO_4$, $Sr(OCO)_2 \cdot H_2O$, $Sr(OCOCH_3)_2 \cdot 0.5H_2O$, and $SrCl_2$. Among these, $SrCO_3$ is preferred because it has good stability in air and is easily decomposed by heating, unnecessary elements do not easily remain, and a high-purity material is easily available.

Specific examples a Mg source include MgO, $Mg(OH)_2$, basic magnesium carbonate ($mMgCO_3 \cdot Mg(OH)_2 \cdot nH_2O$), $Mg(NO_3)_2 \cdot 6H_2O$, $MgSO_4$, $Mg(OCO)_{2-2}H_2O$, $Mg(OCOCH_3)_{2-4}H_2O$, and $MgCl_2$. Among these, MgO and basic magnesium carbonate are preferred.

Specific examples a Ca source and a Be source include CaO, $Ca(OH)_2$, $CaCO_3$, $Ca(NO_3)_2 \cdot 4H_2O$, $CaSO_4 \cdot 2H_2O$, $Ca(OCO)_2 \cdot H_2O$, $Ca(OCOCH_3)_2 \cdot H_2O$, $CaCl_2$, and BeO. Among these, $CaCO_3$, $CaCl_2$, and the like are preferred.

Specific examples a Zn source include zinc compounds (including hydrates thereof), such as ZnO, $ZnF_2$, $ZnCl_2$, and $Zn(OH)_2$. Among these, $ZnF_2 \cdot 4H_2O$ (alternatively, anhydrous $ZnF_2$) and the like are preferred from the viewpoint of having a marked effect of facilitating particle growth.

Specific examples the Ba source include BaO, $Ba(OH)_2 \cdot 8H_2O$, $BaCO_3$, $Ba(NO_3)_2$, $BaSO_4$, $Ba(OCO)_2$—$H_2O$, $Ba(OCOCH_3)_2$, and $BaCl_2$. Among these, $BaCO_3$ is preferred because it has good stability in air, unnecessary elements do not easily remain owing to easy decomposition by heating, and a high-purity material is easily available.

Specific examples of an Eu source as the $M^2$ source include $Eu_2O_3$, $Eu_2(SO_4)_3$, $Eu_2(OCO)_6$, $EuCl_2$, $EuCl_3$, and $Eu(NO_3)_3 \cdot 6H_2O$. Among these, $Eu_2O_3$ and the like are preferred. Specific examples of a Sm source, a Ce source, a Tm source, an Yb source, a Cr source, a Mn source, a Tb source, an Er source, and the like include compounds in which the Eu elements in the compounds exemplified as the Eu source are replaced with Sm, Ce, Tm, Yb, Cr, Mn, Tb, Er, and the like.

Specific examples of a Si source as the $M^3$ source include $SiO_2$, $H_4SiO_4$, and $Si(OCOCH_3)_4$. Among these, $SiO_2$ is preferred because of high reactivity. Specific examples of a Ge source, a Ti source, a Zr source, and the like include compounds in which the Si elements in the compounds exemplified as the Si source are replaced with Ge, Ti, Zr, and the like.

Examples of the $M^4$ source include alkali metal phosphates, alkali metal halides, and compounds of group 15 elements.

Examples of a material of the alkali metal element in the $M^4$ source include fluorides, chlorides, bromides, iodides, hydroxides, carbonates, nitrates, oxalates, acetates, sulfates, phosphates, etc. of Li, Na, K, Rb, and Cs. Specific examples thereof include LiF, NaF, KF, RbF, CsF, LiCl, NaCl, KCl, RbCl, CsCl, LiBr, NaBr, KBr, RbBr, CsBr, LiI, NaI, KI, RbI, CsI, $Li_2CO_3$, $Na_2CO_3$, $K_2CO_3$, $Rb_2CO_3$, $Cs_2CO_3$, LiOH, NaOH, KOH, RbOH, CsOH, $LiNO_3$, $NaNO_3$, $KNO_3$, $RbNO_3$, $CsNO_3$, $Li_2(C_2O_4)$, $Na_2(C_2O_4)$, $K_2(C_2O_4)$, $Rb_2(C_2O_4)$, $Cs_2(C_2O_4)$, $CH_3COOL_i$, $CH_3COONa$, $CH_3COOK$, $CH_3COORb$, $CH_3COOCs$, $Li_2SO_4$, $Na_2SO_4$, $K_2SO_4$, $Rb_2SO_4$, CsX, $Li_3PO_4$, $Na_3PO_4$, $K_3PO_4$, $Rb_3PO_4$, $Cs_3PO_4$, $Na_2HPO_4$, $NaH_2PO_4$, $K_2HPO_4$, and $KH_2PO_4$. Among these, fluorides and chlorides are preferred. KCl, KF, CsCl, and CsF are more preferred.

Examples of a La source, a Gd source, an Sb source, a Pr source, a Sm source, an Yb source, an Al source, and a Bi source include oxides, oxalates, nitrates, acetates, sulfates, fluorides, chlorides, bromides, iodides, etc. of corresponding metals. Specific examples thereof include $La_2O_3$, $Gd_2O_3$, $Sb_2O_3$, $Pr_6O_{11}$, $Sm_2O_3$, $Yb_2O_3$, $Al_2O_3$, and $Bi_2O_3$. Among these, $Bi_2O_3$, $Sb_2O_3$, and the like are preferred.

Specific examples of a P source include $Li_3PO_4$, $Na_3PO_4$, $Na_2HPO_4$, $NaH_2PO_4$, $K_3PO_4$, $K_2HPO_4$, $KH_2PO_4$, $(NH_4)_3PO_4$, $(NH_4)_2HPO_4$, $(NH_4)H_2PO_4$, $Ca_3(PO_4)_2$, $CaHPO_4$, $Ca(H_2PO_4)_2$, $Sr_3(PO_4)_2$, $SrHPO_4$, $Ba_3(PO_4)_2$, and $BaHPO_4$ (including hydrides thereof). Among these, alkali metal phosphates and ammonium phosphates such as $(NH_4)_2HPO_4$ are particularly preferred.

Specific examples of the $M^5$ source include $NH_4F$, $NH_4F \cdot HF$, $NH_4Cl$, $NH_4Br$, $NH_4I$, LiF, LiCl, LiBr, LiI, NaF, NaCl, NaBr, NaI, KF, KCl, KBr, KI, RbF, RbCl, RbBr, RbI, CsF, CsCl, CsBr, CsI, $MgF_2$, $MgCl_2$, $MgBr_2$, $MgI_2$, $CaF_2$, $CaCl_2$, $CaBr_2$, $CaI_2$, $SrF_2$, $SrCl_2$, $SrBr_2$, $SrI_2$, $BaF_2$, $BaCl_2$, $BaBr_2$, $BaI_2$, $ZnF_2$, $ZnCl_2$, $ZnBr_2$, $ZnI_2$, $AlF_3$, $AlCl_3$, $AlBr_3$, $AlI_3$. Specific examples of the $M^5$ source further include fluorides, chlorides, bromides, iodides, etc. of Sc, Y, La, Ce, Pr, Nd, Sm, Eu, Gd, Tb, Dy, Ho, Er, Tm, Yb, Lu, Ga, and In. Among these, alkali metal halides, alkaline-earth metal halides, and Zn halides are preferred. $ZnF_2 \cdot 4H_2O$, $BaF_2$, KCl, CsCl, and CsF are particularly preferred.

These element-source compounds may be used alone or in combination of two or more and in any proportion.

<Mixing Step>

A technique for mixing the $M^1$ source, the Ba source, the M2 source, the $M^3$ source, the $M^4$ source, and the $M^5$ source is not particularly limited. Examples of thereof include methods (A) and (B) described below:

(A) a dry blending method of grinding and mixing the materials, such as the $M^1$ source, the Ba source, the $M^2$ source, the $M^3$ source, the $M^4$ source, and the $M^5$ source, by a combination of grinding using either dry mill, e.g., a hammer mill, a roll mill, a ball mill, or a jet mill, or a mortar and a pestle and mixing using either mixer, e.g., a ribbon blender, a V-blender, or a Henschel mixer, or a mortar and a pestle; and (B) a wet blending method including adding a solvent or a dispersion medium, such as water, to the materials, such as the $M^1$ source, the Ba source, the $M^2$ source, the $M^3$ source, the $M^4$ source, and the $M^5$ source, mixing the mixture with, for example, a grinder, a mortar and a pestle, or an evaporating dish and a stirring rod to form a solution or a slurry, and drying the resulting solution or the slurry by, for example, spray drying, drying by heating, or air drying.

In Item (B), to uniformly mixing Eu, a $Eu(NO_3)_3.6H_2O$ aqueous solution may be mixed with other materials, and the resulting material mixture may be dried by heating.

<Flux>

From the viewpoint of growing a satisfactory crystal, flux may be incorporated in addition to the materials described above. The type of flux is not particularly limited. Examples thereof include ammonium halides, such as $NH_4C_1$ and $NH_4F.HF$; alkali metal carbonates, such as $NaCO_3$ and $LiCO_3$; alkali metal halides, such as LiCl, NaCl, and KCl; alkaline-earth metal halides, such as $CaCl_2$, $CaF_2$, and $BaF_2$; borate compounds, such as $B_2O_3$, $H_3BO_3$, and $NaB_4O_7$; phosphate compounds, such as $Li_3PO_4$ and $NH_4H_2PO_4$; zinc compounds, such as zinc oxide, zinc halides, and zinc sulfide; and compounds of the elements in group 15 of the periodic table, e.g., $Bi_2O_3$. Among these, alkali metal halides, alkaline-earth metal halides, and Zn halides are preferred. Among these halides, fluorides and chlorides are preferred.

The amount of flux used varies depending on the type of material and the material of the flux and is usually 0.01 percent by weight or more and preferably 0.1 percent by weight or more, and usually 20 percent by weight or less and preferably 10 percent by weight or less. An excessively small amount of flux does not show the effect of the flux. An excessively large amount of flux may cause saturation of the effect of the flux, a change in emission color by incorporating the flux into the host crystal, and a reduction in luminance. These fluxes may be used alone or in any combination of two or more and in any proportion.

<Firing Step>

Firing Conditions

The firing step is typically performed by charging the mixture of the materials, such as the $M^1$ source, the Ba source, the $M^2$ source, the $M^3$ source, the $M^4$ source, and the $M^5$ source, obtained in the mixing step described above into a heat-resistant container, such as a crucible or a tray, composed of a material having low reactivity to these materials and heating the mixture.

Examples of the material of the heat-resistant container used during firing include ceramic materials, such as alumina, quartz, and boron nitride; metals, such as platinum, molybdenum, tungsten, tantalum, niobium, iridium, and rhodium; alloy mainly composed of the metals; and carbon (graphite). A heat-resistant container composed of quartz can be used for heat treatment at relatively low temperature, i.e., 1,200° C. or lower. A preferred temperature range at which the quartz container can be used is 1,000° C. or lower.

Among the exemplified materials of the heat-resistant container, a metal or a metal alloy that does not easily react with the component of the phosphor of the present invention is preferably used because contamination of a phosphor with an impurity element can be prevented. In the case of firing in an air atmosphere or a weakly reducing atmosphere, a heat-resistant container composed of platinum is preferably used. In the case of firing in a reducing atmosphere, a heat-resistant container composed of molybdenum, tungsten, tantalum, or the like is preferably used. Boron nitride is a ceramic material that has low reactivity; hence, boron nitride is preferably used for firing in a reducing atmosphere.

With respect to the material of the heat-resistant container, for example, when platinum or molybdenum is selected, the whole heat-resistant container need not be composed of platinum or molybdenum. At least a portion where the heat-resistant container comes into contact with the mixture of the materials for the phosphor may be composed of platinum or molybdenum. For example, platinum foil or molybdenum foil may be placed on the bottom and side of a heat-resistant container composed of alumina.

In the case where the flux is added to the material mixture or where the $M^4$ source and/or the $M^5$ source is added to the material mixture, the heat-resistant container is preferably composed of alumina, magnesia, calcia, zirconia, boron nitride, silicon nitride, silicon carbide, carbon, or the like. More preferably, the heat-resistant container is composed of alumina. In primary firing and secondary firing described below, heat-resistant containers composed of the same material may be used. Alternatively, heat-resistant containers composed of different materials may be used.

The temperature in firing varies depending on the type, a mixed state, a particle size, a shape, and the like of material but is in the range of usually 500° C. or higher, preferably 1,000° C. or higher, more preferably 1,200° C. or higher, still more preferably 1,400° C. or higher, and most preferably 1,500° C. or higher, and usually 1,800° C. or lower, preferably 1,700° C. or lower, and more preferably 1,600° C. or lower. An excessively high temperature during firing may cause a reduction in emission intensity due to reaction with the container containing the materials and evaporation of the material components. An excessively low temperature does not form a target crystal phase because of insufficient reaction between the materials, in some cases. Even if the target crystal phase is obtained, emission intensity may be reduced because of low crystallinity.

The pressure during firing varies depending on the firing temperature and the like but is usually 0.01 MPa or more and preferably 0.08 MPa or more, and usually 1 MPa or less and preferably 0.12 MPa or less. More preferably, the pressure is equal to atmospheric pressure. An excessively lower or higher pressure increases costs of equipment such as an electric furnace and thus is not preferred.

The firing time varies depending on the temperature, pressure, and the like during firing but is in the range of usually 10 minutes or more, preferably 1 hour or more, and more preferably 2 hours or more, and usually 24 hours or less and preferably 10 hours or less.

With respect to an atmosphere during firing, preferably, a necessary atmosphere is selected in such a manner that the activation element has an ionic state (valence) that contributes to emission. For example, in the case where Eu is contained as the activation element, emission requires $Eu^{2+}$. However, a commonly used Eu source, e.g., $Eu_2O_3$, includes Eu in the form of $Eu^{3+}$. Thus, to reduce $Eu^{3+}$ to $Eu^{2+}$, firing is preferably performed in a reducing atmosphere and more preferably a strongly reducing atmosphere.

Specific examples of the atmosphere during firing include a carbon monooxide atmosphere, a hydrogen atmosphere, a hydrogen-containing nitrogen atmosphere, a carbon-containing strongly reducing atmosphere, and a hydrogen-containing argon atmosphere. Among these, a hydrogen-containing nitrogen atmosphere and a carbon-containing strongly reducing atmosphere are preferred. Hydrogen-containing nitrogen is more preferred from an economic viewpoint.

In the case where hydrogen-containing nitrogen is used as an atmosphere during firing, the oxygen concentration in an electric furnace is preferably reduced to 20 ppm or less. The hydrogen content of the atmosphere is preferably 1 percent by volume or more and more preferably 2 percent by volume or more and preferably 5 percent by volume or less. This is because an excessively high hydrogen content of the atmosphere results in explosion hazard and because an excessively low hydrogen content results in insufficient reducing atmosphere.

In the primary firing and the secondary firing described below, the same atmosphere may be used. Alternatively, different atmospheres may be used.

For example, in the case of the primary firing described below, to effectively remove volatile components generated from the material compounds, preferably, heating is performed at a high flow rate of an atmospheric gas. In the secondary firing described below, for example, to reduce $Eu^{3+}$ to $Eu^{2+}$, preferably, heating is performed in a reducing atmosphere containing hydrogen or carbon.

As described above, is a proper reducing atmosphere is selected as the atmosphere during firing. Thereby, the proportion of $Eu^{2+}$ in the total Eu in the phosphor is preferably set to 60% or more, more preferably 80% or more, and still more preferably 90% or more. An excessively low proportion of $Eu^{2+}$ in the total Eu in the phosphor may cause a reduction in emission intensity.

The proportion of $Eu^{2+}$ in the total Eu in the phosphor can be determined by, for example, measurement of the X-ray absorption fine structure. That is, measurement of the L3 absorption edge of the Eu atom demonstrates that $Eu^{2+}$ and $Eu^{3+}$ show different absorption peaks. Thus, the proportion thereof can be determined from the peak areas. Alternatively, the proportion of $Eu^{2+}$ in the total Eu in the phosphor can be determined by electron-spin resonance (ESR).

Primary Firing and Secondary Firing

In the firing step, preferably, firing is performed at 1,200° C. or higher at least once, and final firing is performed at 1,000° C. or higher in a reducing atmosphere. More preferably, the firing step is divided into the primary firing and the secondary firing. That is, preferably, the material mixture obtained in the mixing step is subjected to the primary firing, grinded again with a ball mill or the like, sieved, and subjected to the secondary firing.

That is, in the primary firing, to effectively remove the volatile components from the material mixture, heating is preferably performed at a high flow rate of an atmospheric gas. In the secondary firing, for example, to reduce $Eu^{3+}$ to $Eu^{2+}$, heating is preferably performed in a reducing atmosphere containing hydrogen or carbon. In the secondary firing, furthermore, to improve the crystallinity of the phosphor and sufficiently reduce $Eu^{3+}$ to $Eu^{2+}$, heating is preferably performed at a temperature higher than the temperature of the primary firing.

Post Treatment

After the firing step described above, as needed, treatment, such as milling, washing, classification, or surface treatment, is performed to provide the phosphor of the present invention. For milling, the exemplified mill that can be used in the mixing step of mixing the materials can be used. Washing is performed with, for example, water such as deionized water, an organic solvent such as ethanol, or an alkaline aqueous solution such as aqueous ammonia. Classification can be performed by elutriation or with any of various classifiers such as a various air sifter or vibrating sieve. In particular, a phosphor having a weight median diameter of about 20 μm can be obtained by dry classification with a nylon mesh.

In the case where a light-emitting device is produced by a method described below with the resulting phosphor, as needed, low-temperature annealing and surface treatment with an inorganic material or an organic material may be performed. In particular, preferably, the phosphor is subjected to the surface treatment described in [1-2-3. Surface Treatment] and is then used.

[1-4. Application of Phosphor]

The phosphor of the present invention can be used for any application that uses a phosphor. In particular, the phosphor can be suitably used for various light-emitting devices ("light-emitting device of the present invention" described below) by taking advantage of a feature in which the phosphor can be excited by blue light or near-ultraviolet light. Adjustment of the types and proportions of phosphors combined results in light-emitting devices that emit various colored light beams. In particular, since the phosphor of the present invention is an orange to red phosphor, the phosphor can be combined with a green phosphor and an excitation light source that emits blue light to produce a white-light-emitting device. In this case, an intended emission color can be made by adjusting emission wavelengths of the phosphor of the present invention and the green phosphor. For example, an emission spectrum similar to the emission spectrum of pseudo-white (for example, the emission color of a light-emitting device including a blue LED in combination with a yellow phosphor) can also be obtained. A combination of this white-light-emitting device and a red phosphor (phosphor that emits red fluorescence) provides a light-emitting device having significantly excellent red color rendering properties or a light-emitting device that emits warm white light. A combination of an excitation light source that emits near-ultraviolet light, the phosphor of the present invention, a blue phosphor (phosphor that emits blue fluorescence), and a green phosphor (phosphor that emits green fluorescence) also provides a white-light-emitting device.

The emission color of the light-emitting device is not limited to white. A light-emitting device that emits light of any color can be produced by combining a yellow phosphor (phosphor that emits yellow fluorescence), a blue phosphor, a green phosphor, and another orange to red phosphor and adjusting the types and proportions of the phosphors as needed. The resulting light-emitting device can be used as a light-emitting device in an image display (in particular, as a backlight in a liquid crystal display) or an illumination device.

[1-5. Phosphor-Containing Composition]

In the case where the phosphor of the present invention is used for applications such as a light-emitting device, a dispersion in which the phosphor is dispersed in a liquid medium is preferably used. The dispersion in which the phosphor is dispersed in the liquid medium is appropriately referred to as a "phosphor-containing composition of the present invention". The phosphor-containing composition of the present invention may contain one or two or more of the phosphors of the present invention.

With respect to the liquid medium that can be used for the phosphor-containing composition of the present invention, any liquid medium can be used as long as the liquid medium is liquid under intended conditions of use, suitably disperses the phosphor of the present invention, and does not produce a unfavorable reaction or the like. Examples of the liquid medium include thermosetting resins and photocurable resins before curing. Examples thereof include addition-type silicone resins, condensation-type silicone resins, modified silicone resins, and epoxy resins. Furthermore, a solution prepared by hydrolytic polymerization of a solution containing an inorganic material, e.g., a ceramic precursor polymer or a metal alkoxide, by a sol-gel method can be used. These liquid media may be used alone or in any combination of two or more and in any proportion. The liquid medium may contain an organic solvent.

The amount of the liquid medium used may be appropriately adjusted in response to applications etc. In general, the ratio of the phosphor to the liquid medium of the present invention is in the range of usually 3 percent by weight or more and preferably 5 percent by weight or more, and usually 30 percent by weight or less and preferably 15 percent by weight. An excessively small amount of the liquid medium may cause a reduction in luminance due to excessively strong emission from the phosphor. An excessively large amount of the liquid medium may cause a reduction in luminance due to excessively weak emission from the phosphor.

The phosphor-containing composition of the present invention may further contain any additional component according to an application in addition to the phosphor of the present invention and the liquid medium. Examples of the additional component include diffusing agents, thickening agents, bulking agents, and interference agents. Specific examples thereof include silica fine particles, such as aerosil, and alumina. These additional components may be used alone or in any combination of two or more and in any proportion.

[2. Light-Emitting Device]

A light-emitting device of the present invention will be described below. The light-emitting device of the present invention includes a first illuminant as an excitation light source and a second illuminant that emits visible light by irradiation with light emitted from the first illuminant.

[2-1. First Illuminant]

First Illuminant

The first illuminant in the light-emitting device of the present invention emits light that excites the second illuminant described below. The emission wavelengths of the first illuminant are not particularly limited as long as the emission wavelengths overlap the absorption wavelengths of the second illuminant described below. Various illuminants having a wide emission wavelength range can be used. Usually, an illuminant having emission wavelengths from the ultraviolet region to the blue region is used. Particularly preferably, an illuminant having emission wavelengths from the near-ultraviolet region to the blue region is used. With respect to the specific value of the emission wavelength of the first illuminant, an illuminant having a peak emission wavelength of usually 200 nm or more, preferably 300 nm or more, and more preferably 360 nm or more, and usually 500 nm or less and preferably 480 nm or less is used. In particular, an illuminant that emits light in the near-ultraviolet region of 360 nm to 430 nm and an illuminant that emits light in the blue region of 430 nm to 480 nm are preferred. As the first illuminant, a semiconductor light-emitting element is generally used. Specifically, for example, light-emitting diodes (hereinafter, appropriately referred to as "LEDs") and semiconductor laser diodes (hereinafter, appropriately referred to as "LDs") can be used.

Among these, as the first illuminant, GaN-based LEDs and LD including GaN-based compound semiconductors are preferred. This is because GaN-based LEDs and LD each have markedly large emission power and external quantum efficiency compared with those of SiC-based LEDs and the like, and a combination of either GaN-based LED or LD and the phosphor described above results in very bright emission at ultra-low power. For example, when a current load is 20 mA, usually, GaN-LEDs and LDs each have emission intensity 100 times higher than those of SiC-based LEDs and the like. GaN-LEDs and LDs each including an $Al_XGa_YN$ emission layer, a GaN emission layer, or an $In_XGa_YN$ emission layer are preferred. In GaN-based LEDs, among these, GaN-based LEDs each including an $In_XGa_YN$ emission layer are particularly preferred because of very high emission intensity. In GaN-based LEDs, GaN-based LEDs each having a multiple-quantum-well structure including an $In_XGa_YN$ layer and a GaN layer are particularly preferred because of very high emission intensity.

The value of X+Y is usually in the range of 0.8 to 1.2. In GaN-based LEDs, a doped emission layer obtained by doping the emission layer with Zn or Si and an undoped emission layer are preferred to adjust emission properties.

GaN-based LEDs each includes the emission layer, a p layer, an n layer, electrodes, and a substrate, as fundamental constituents. GaN-based LEDs each having a heterostructure in which the emission layer is arranged between, for example, n- and p-type $Al_XGa_YN$ layers, GaN layers, or $In_XGa_YN$ layers are preferred because of high luminous efficiency. Furthermore, GaN-based LEDs each having a structure in which the heterostructure is replaced with a multiple-quantum-well structure are more preferred because of further high luminous efficiency.

[2-2. Second Illuminant]

The second illuminant in the light-emitting device of the present invention is an illuminant that emits visible light by irradiation with light emitted from the first illuminant. The second illuminant contains the phosphor of the present invention as a first phosphor and optionally contains a second phosphor according to an application and the like. For example, the second illuminant includes the first and second phosphors dispersed in a sealing resin.

Compositions of the phosphors are not particularly limited. The compositions in which metal oxides, such as $Y_2O_3$ and $Zn_2SiO_4$, metal nitrides such as $Sr_2Si_5N_8$, phosphates such as $Ca_5(PO_4)_3Cl$, sulfides, such as ZnS, SrS, and CaS, which serve as crystalline matrices, are combined with ions of rare-earth metals, such as Ce, Pr, Nd, Pm, Sm, Eu, Tb, Dy, Ho, Er, Tm, and Yb, and ions of metals, such as Ag, Cu, Au, Al, Mn, and Sb, as activation elements or coactivation elements, are preferred.

Preferred examples of the crystalline matrices include sulfides, such as (Zn, Cd)S, $SrGa_2S_4$, SrS, and ZnS; oxysulfides such as $Y_2O_2S$; aluminates, such as $(Y,Gd)_3Al_5O_{12}$, $YAlO_3$, $BaMgAl_{10}O_{17}$, $(Ba,Sr)(Mg,Mn)Al_{10}O_{17}$, $(Ba,Sr, Ca)(Mg, Zn,Mn)Al_{10}O_{17}$, $BaAl_{12}O_{19}$, $CeMgAl_{11}O_{19}$, $(Ba,Sr,Mg) O.Al_2O_3$, $BaAl_2Si_2O_8$, $SrAl_2O_4$, $Sr_4Al_{14}O_{25}$, and $Y_3Al_5O_{12}$; silicates, such as $Y_2SiO_5$ and $Zn_2SiO_4$; oxides, such as $SnO_2$ and $Y_2O_3$; borates, such as $GdMgB_5O_{10}$ and $(Y,Gd)BO_3$; halophosphates, such as $Ca_{10}(PO_4)_6(F,Cl)$ and $(Sr,Ca,Ba, Mg)_{10}(PO_4)_6Cl_2$; and phosphates, such as $Sr_2P_2O_7$ and $(La, Ce)PO_4$.

With respect to the crystalline matrices and the activation elements or the coactivation elements, elemental compositions are not particularly limited. The elements in the compositions may be partially replaced with an element in the same group. When the resulting phosphor absorbs light in the near-ultraviolet to visible regions to emit visible light, the phosphor may be used.

Specifically, the following phosphors may be used. These are only examples. Phosphors that can be used in the present invention are not limited thereto. In the following examples, phosphors in which the difference between the phosphors is only part of their structures are described with appropriate omissions. For example, "$Y_2SiO_5:Ce^{3+}$", "$Y_2SiO_5:Tb^{3+}$" and "$Y_2SiO_5:Ce^{3+},Tb^{3+}$" are referred to as "$Y_2SiO_5:Ce^{3+},Tb^{3+}$". "$La_2O_2S:Eu$", "$Y_2O_2S:Eu$", and "$(La,Y)_2O_2S:Eu$" are referred to as "$(La,Y)_2O_2S:Eu$". The omitted portion is divided by a comma (,).

[2-2-1. First Phosphor]

The second illuminant in the light-emitting device of the present invention contains at least the phosphor of the present invention described above as the first phosphor. The phosphors of the present invention may be used alone or in any combination of two or more and in any proportion. Furthermore, as the first phosphor, a phosphor that emits fluorescence of the same color as that of the phosphor of the present invention (same-color combination phosphor) may be used as well as the phosphor of the present invention. The phosphor of the present invention is usually an orange to red phosphor. Thus, an orange to red phosphor serving as the first phosphor can be combined with the phosphor of the present invention.

Orange to red phosphors, serving as the first phosphor, that can be combined with the phosphor of the present invention are exemplified below. These may be used alone or in any combination of two or more and in any proportion.

Examples of the orange to red phosphor that can be combined with the phosphor of the present invention include europium-activated alkaline-earth silicon nitride phosphors constituted by fractured particles having red fracture surfaces, emitting light in the red region, and represented by $(Mg,Ca,Sr,Ba)_2Si_5N_8:Eu$; and europium-activated rare-earth oxychalcogenide phosphors constituted by grown particles each having a substantially spherical shape as a regular crystal growth shape, emitting light in the red region, and represented by $(Y,La,Gd,Lu)_2O_2S:Eu$.

Phosphors, described in Japanese Unexamined Patent Application Publication No. 2004-300247, each containing oxynitride and/or oxysulfide containing at least one element selected from the group consisting of Ti, Zr, Hf, Nb, Ta, W, and Mo, the phosphors each containing the oxynitride having an α-Sialon structure in which the whole or part of Al element is replaced with Ga element, can also be used in an embodiment. These are phosphors each containing oxynitride and/or oxysulfide.

Other examples of the red phosphor that can be used include Eu-activated oxysulfide phosphors such as $(La,Y)_2O_2S:Eu$; Eu-activated oxide phosphors such as $Y(V,P)O_4:Eu$ and $Y_2O_3:Eu$; Eu,Mn-activated silicate phosphors, such as $(Ba,Sr,Ca,Mg)_2SiO_4:Eu,Mn$ and $(Ba,Mg)_2SiO_4:Eu,Mn$; Eu-activated tungstate phosphors, such as $LiW_2O_8:Eu$, $LiW_2O_8$: Eu,Sm, $Eu_2W_2O_9$, $Eu_2W_2O_9:Nb$, and $Eu_2W_2O_9:Sm$; Eu-activated sulfide phosphors such as $(Ca,Sr)S:Eu$; Eu-activated aluminate phosphors such as $YAlO_3:Eu$; Eu-activated silicate phosphors, such as $LiY_9(SiO_4)_6O_2:Eu$ and $Ca_2Y_8(SiO_4)_6O_2$: Eu; Ce-activated aluminate phosphors, such as $(Y,Gd)_3Al_5O_{12}:Ce$ and $(Tb,Gd)_3Al_5O_{12}:Ce$; Eu-activated nitride phosphors, such as $(Ca,Sr,Ba)_2Si_5N_8:Eu$, $(Mg,Ca,Sr,Ba)SiN_2:Eu$, and $(Mg,Ca,Sr,Ba)AlSiN_3:Eu$; Ce-activated nitride phosphors $(Mg,Ca,Sr,Ba)AlSiN_3:Ce$; Eu,Mn-activated halophosphate phosphors such as $(Sr,Ca,Ba,Mg)_{10}(PO_4)_6Cl_2:Eu,Mn$; Eu,Mn-activated silicate phosphors $(Ba_3Mg)Si_2O_8:Eu,Mn$ and $(Ba,Sr,Ca,Mg)_3(Zn,Mg)Si_2O_8:Eu,Mn$; Mn-activated germanate phosphors such as $3.5MgO\ 0.5MgF_2\ GeO_2:Mn$; Eu-activated oxynitride phosphors such as Eu-activated α-Sialon; Eu,Bi-activated oxide phosphors such as $(Gd,Y,Lu,La)_2O_3:Eu,Bi$; Eu,Bi-activated oxysulfide phosphors such as $(Gd,Y,Lu,La)_2O_2S:Eu,Bi$; Eu,Bi-activated vanadate phosphors such as $(Gd,Y,Lu,La)VO_4:Eu,Bi$; Eu, Ce-activated sulfide phosphors such as $SrY_2S_4:Eu,Ce$; Ce-activated sulfide phosphors such as $CaLa_2S_4:Ce$; Eu,Mn-activated phosphate phosphors such as $(Ba,Sr,Ca)Mg_2PO_7:Eu,Mn$ and $(Sr,Ca,Ba,Mg,Zn)_2P_2O_7:Eu,Mn$; Eu,Mo-activated tungstate phosphors such as $(Y,Lu)_2WO_6:Eu,Mo$; Eu, Ce-activated nitride phosphors such as $(Ba,Sr,Ca)_nSi_yN_z:Eu,Ce$ (wherein x, y, and z each represent an integer of one or more); Eu,Mn-activated halophosphate phosphors such as $(Ca,sr,Ba,Mg)_{10}(PO_4)_6(F,Cl,Br,OH):Eu,Mn$; and Ce-activated silicate phosphors such as $((Y,Lu,Gd,Tb)_{1-x}Sc_xCe_y)_2(Ca,Mg)_{1-r}(Mg,Zn)_{2+r}Si_{z-q}Ge_qO_{12+\delta}$.

Examples of the red phosphor that can be used include red organic phosphors each composed of a rare-earth element ion complex having an anionic ligand, e.g., a β-diketonate, a β-diketone, an aromatic carboxylic acid, or a Broensted acid; perylene pigments (e.g., dibenzo{[f,f']-4,4',7,7'-tetraphenyl}diindeno[1,2,3-cd:1',2',3'-lm]perylene); anthraquinone pigments; lake pigments; azo pigments; quinacridone pigments; anthracene pigments; isoindoline pigments; isoindolinone pigments; phthalocyanine pigments; triphenylmethane basic dyes; indanthrone pigments; indophenol pigments; cyanin pigments; and dioxazine pigments.

Among these red phosphors, phosphors each having a peak wavelength of 580 nm or more and preferably 590 nm or more, and 620 nm or less and preferably 610 nm or less can be suitably used as orange phosphors. An example of the orange phosphor is $(Sr,Mg)_3(PO_4)_2:Sn^{2+}$.

[2-2-2. Second Phosphor]

The second illuminant in the light-emitting device of the present invention may contain a phosphor (second phosphor) according to an application in addition to the first phosphor described above. The second phosphor is a phosphor that differs in emission wavelength from the first phosphor. Usually, the second phosphor is used to adjust the emission color of the second illuminant. Thus, a phosphor that emits fluorescence of color different from that of the first phosphor is often used as the second phosphor. As described above, since an orange to red phosphor is usually used as the first phosphor, a phosphor, e.g., a green phosphor, a blue phosphor, or a yellow phosphor, other than the orange to red phosphor is used.

Green Phosphor

In the case where a green phosphor is used as the second phosphor, any red phosphor can be used unless the red phosphor significantly impairs the effect of the present invention. In this case, the emission peak wavelength of the green phosphor is in the range of usually 490 nm or more, preferably 510 nm or more, and more preferably 515 nm or more, and usually 560 nm or less, preferably 540 nm or less, and more preferably 535 nm or less.

Examples of the green phosphor include europium-activated alkaline-earth silicon oxynitride phosphors constituted by fractured particles having fracture surfaces, emitting light in the green region, and represented by $(Mg,Ca,Sr,Ba)Si_2O_2N_2:Eu$; and europium-activated alkaline-earth silicate phosphor constituted by fractured particles having fracture surfaces, emitting light in the green region, and represented by $(Ba,Ca,Sr,Mg)_2SiO_4:Eu$.

Other examples of the green phosphor that can be used include Eu-activated aluminate phosphors, such as $Sr_4Al_{14}O_{25}:Eu$ and $(Ba,Sr,Ca)Al_2O_4:Eu$; Eu-activated silicate phosphors, such as $(Sr,Ba)Al_2Si_2O_8:Eu$, $(Ba,Mg)_2SiO_4$: Eu, $(Ba,Sr,Ca,Mg)_2SiO_4:Eu$, $(Ba,Sr,Ca)_2(Mg,Zn)Si_2O_7:Eu$, and $(Ba,Ca,Sr,Mg)_9(Sc,Y,Lu,Gd)_2(Si,Ge)_6O_{24}:Eu$; Ce,Tb-activated silicate phosphors such as $Y_2SiO_5$:Ce,Tb; Eu-activated borate phosphate phosphors such as $Sr_2P_2O_7$—$Sr_2B_2O_5$:Eu; Eu-activated halosilicate phosphors such as $Sr_2Si_3O_8$-$2SrCl_2$:Eu; Mn-activated silicate phosphors such as $Zn_2SiO_4$:Mn; Tb-activated aluminate phosphors such as $CeMgAl_{11}O_{19}$:Tb, $Y_3Al_5O_{12}$:Tb; Tb-activated silicate phosphors such as $Ca_2Y_8(SiO_4)_6O_2$:Tb and $La_3Ga_5SiO_{14}$:Tb; Eu,Tb,Sm-activated thiogallate phosphors such as (Sr,Ba,Ca)$Ga_2S_4$:Eu,Tb,Sm; Ce-activated aluminate phosphors such as $Y_3(Al,Ga)_5O_{12}$:Ce and $(Y,Ga,Tb,La,Sm,Pr,Lu)_3(Al,Ga)_5O_{12}$:Ce; Ce-activated silicate phosphors such as $Ca_3Sc_2Si_3O_{12}$:Ce and $Ca(Sc,Mg,Na,Li)_2Si_3O_{12}$:Ce; Ce-activated oxide phosphors such as $CaSc_2O_4$:Ce; Eu-activated oxynitride phosphors, such as $SrSi_2O_2N_2$:Eu, (Sr,Ba,Ca)$Si_2O_2N_2$:Eu, Eu-activated β—Sialon, and Eu-activated α-Sialon; Eu,Mn-activated aluminate phosphors such as $BaMgAl_{10}O_{17}$:Eu,Mn; Eu-activated aluminate phosphors such as $SrAl_2O_4$:Eu; Tb-activated oxysulfide phosphors such as $(La,Gd,Y)_2O_2S$:Tb; Ce,Tb-activated phosphate phosphors such as $LaPO_4$:Ce,Tb; sulfide phosphors such as ZnS:Cu,Al and ZnS:Cu,Au,Al; Ce,Tb-activated borate phosphors such as $(Y,Ga,Lu,Sc,La)BO_3$:Ce,Tb, $Na_2Gd_2B_2O_7$:Ce,Tb, and $(Ba,Sr)_2(Ca,Mg,Zn)B_2O_6$:K,Ce,Tb; Eu,Mn-activated halosilicate phosphors such as $Ca_8Mg(SiO_4)_4Cl_2$:Eu,Mn; Eu-activated thioaluminate phosphors and thiogallte phosphors such as (Sr,Ca,Ba)(Al,Ga,In)$_2S_4$:Eu; Eu,Mn-activated halosilicate phosphors such as (Ca,Sr)$_8$(Mg,Zn)(SiO$_4$)$_4$Cl$_2$:Eu,Mn; and Eu-activated oxynitride phosphors, such as $MSi_2O_2N_2$:Eu, $M_3Si_6O_9N_4$:Eu, and $M_2Si_7O_{10}N_4$:Eu (wherein M represents an alkaline-earth metal element).

Furthermore, examples of the green phosphor that can be used include organic phosphors such as fluorescent dyes, e.g., pyridine-phthalimide condensed derivatives, benzoxazinone, quinazolinone, coumarin, quinophthalone, and naphthalic imide; and terbium complexes.

Blue Phosphor

In the case where a blue phosphor is used as the second phosphor, any blue phosphor can be used unless the blue phosphor significantly impairs the effect of the present invention. In this case, the emission peak wavelength of the blue phosphor is in the range of usually 420 nm or more, preferably 430 nm or more, and more preferably 440 nm or more, and usually 490 nm or less, preferably 470 nm or less, and more preferably 460 nm or less.

Examples of the blue phosphor include europium-activated barium magnesium aluminate phosphors constituted by grown particles each having a substantially hexagonal shape as a regular crystal growth shape, emitting light in the blue region, and represented by $BaMgAl_{10}O_{17}$:Eu; europium-activated calcium halophosphate phosphors constituted by grown particles each having a substantially spherical shape as a regular crystal growth shape, emitting light in the blue region, and represented by (Ca,Sr,Ba)$_5$(PO$_4$)$_3$Cl:Eu; europium-activated alkaline-earth chloroborate phosphors constituted by grown particles each having a substantially cubic shape, emitting light in the blue region, and represented by (Ca,Sr,Ba)$_2$B$_5$O$_9$Cl:Eu; and europium-activated alkaline-earth aluminate phosphors constituted by fractured particles having fracture surfaces, emitting light in the blue-green region, and represented by (Sr,Ca,Ba)Al$_2$O$_4$:Eu or (Sr,Ca,Ba)$_4$Al$_{14}$O$_{25}$:Eu.

Other examples of the blue phosphor that can be used include Sn-activated phosphate phosphors such as $Sr_2P_2O_7$:Sn; Eu-activated aluminate phosphors such as $Sr_4Al_{14}O_{25}$:Eu, $BaMgAl_{10}O_{17}$:Eu, and $BaAl_8O_{13}$:Eu; Ce-activated thiogallate phosphors such as $SrGa_2S_4$:Ce and $CaGa_2S_4$:Ce; Eu-activated aluminate phosphors such as (Ba,Sr,Ca)$MgAl_{10}O_{17}$:Eu and $BaMgAl_{10}O_{17}$:Eu,Tb,Sm; Eu,Mn-activated aluminate phosphors such as (Ba,Sr,Ca)$MgAl_{10}O_{17}$:Eu,Mn; Eu-activated halophosphate phosphors such as (Sr,Ca,Ba,Mg)$_{10}$(PO$_4$)$_6$Cl$_2$:Eu and (Ba,Sr,Ca)$_5$(PO$_4$)$_3$(Cl,F,Br,OH):Eu,Mn,Sb; Eu-activated silicate phosphors such as $BaAl_2Si_2O_8$:Eu and (Sr,Ba)$_3MgSi_2O_8$:Eu; Eu-activated phosphate phosphors such as $Sr_2P_2O_7$:Eu; sulfide phosphors such as ZnS:Ag and ZnS:Ag,Al; Ce-activated silicate phosphors such as $Y_2SiO_5$:Ce; tungstate phosphors such as $CaWO_4$; Eu,Mn-activated borate phosphate phosphors such as (Ba,Sr, Ca)$BPO_5$:Eu,Mn, (Sr, Ca)$_{10}$(PO$_4$)$_6$.$nB_2O_3$:Eu, $2SrO.0.84P_2O_5.0.16B_2O_3$:Eu; Eu-activated halosilicate phosphors such as $Sr_2Si_3O_8$.$2SrCl_2$:Eu.

Furthermore, examples of the blue phosphor that can be used include organic phosphors such as fluorescent dyes, e.g., naphthalic imide, benzoxazole, styryl, coumarin, pyrazoline, and triazole compounds; and thulium complexes.

Yellow Phosphor

In the case where a yellow phosphor is used as the second phosphor, any yellow phosphor can be used unless the yellow phosphor significantly impairs the effect of the present invention. In this case, the emission peak wavelength of the yellow phosphor is in the range of usually 530 nm or more, preferably 540 nm or more, and more preferably 550 nm or more, and usually 620 nm or less, preferably 600 nm or less, and more preferably 580 nm or less.

Examples of the yellow phosphor include phosphors of various oxides, nitrides, oxynitrides, sulfides, oxysulfides, and the like.

Specific examples thereof include Ce-activated phosphors, for example, garnet phosphors having a garnet structure, such as $RE_3M_5O_{12}$:Ce (wherein RE represents at least one element selected from the group consisting of Y, Tb, Gd, Lu, and Sm; and M represents at least one element selected from the group consisting of Al, Ga, and Sc) and $M_3^aM_2^bM_3^cO_{12}$:Ce (wherein $M^a$ represents a divalent metal element; $M^b$ represents a trivalent metal element; and $M^C$ represents a tetravalent metal element), orthosilicate phosphors such as $AE_2M^dO_4$:Eu (wherein AE represents at least one element selected from the group consisting of Ba, Sr, Ca, Mg, and Zn; and $M^d$ represents Si and/or Ge), oxynitride phosphors in which oxygen as a constituent of these phosphors is partially replaced with nitrogen, and nitride phosphors having a $CaAlSiN_3$ structure, such as $AEAlSiN_3$:Ce (wherein AE represents at least one element selected from the group consisting of Ba, Sr, Ca, Mg, and Zn).

Other examples of the yellow phosphor that can be used include Eu-activated phosphors, such as sulfide phosphors, e.g., $CaGa_2S_4$:Eu, (Ca,Sr)$Ga_2S_4$:Eu, and (Ca,Sr)(Ga,Al)$_2S_4$:Eu, and oxynitride phosphors having a SiAlON structure, e.g., $Ca_x(Si,Al)_{12}(O,N)_{16}$:Eu.

Other examples of the yellow phosphor that can be used include fluorescent dyes, such as brilliantsulfoflavine FF (colour index number 56205), basic yellow HG (colour index number 46040), eosine (colour index number 45380), and rhodamine 6G (colour index number 45160).

These phosphors that can be used as the second phosphor may be used alone or in any combination of two or more and in any proportion. Any ratio of the first phosphor to the second phosphor may be used unless the ratio significantly impairs the effect of the present invention. Thus, the amount of the second phosphor used, combinations of phosphors used as the second phosphor, the ratios thereof, and the like may be appropriately determined according to, for example, the application of a light-emitting device.

[2-2-3. Physical Properties of Second Phosphor]

Preferably, the weight median diameter of the second phosphor used for the light-emitting device of the present invention is in the range of usually 10 μm or more and particularly 15 μm or more, and usually 30 μm or less and particularly 20 μm or less. An excessively small weight median diameter is liable to cause a reduction in luminance and the aggregation of the phosphor particles, which is not preferred. An excessively large weight median diameter is liable to cause non-uniform application and clogging of a dispenser, which is not preferred.

[2-2-4. Selection of Second Phosphor]

In the light-emitting device of the present invention, the type of second phosphor and whether or not the second phosphor (e.g., the red phosphor, the blue phosphor, or the green phosphor) is used may be appropriately determined according to the application of the light-emitting device. For example, in the case where the light-emitting device of the present invention is used as a light-emitting device that emits orange to red light, only the first phosphor (orange to red phosphor) may be used. In this case, usually, the second phosphor is not required.

In the case where the light-emitting device of the present invention is used as a white-light-emitting device, the first illuminant, the first phosphor (orange to red phosphor), and the second phosphor may be appropriately combined in such a manner that intended white light is obtained. Specifically, preferred examples of combination of the first illuminant, the first phosphor, and the second phosphor when the light-emitting device of the present invention is used as a white-light-emitting device include combinations (i) to (iv) described below.

(i) A blue illuminant (e.g., a blue LED) is used as the first illuminant, a red phosphor (e.g., the phosphor of the present invention) is used as the first phosphor, and a green phosphor is used as the second phosphor.

(ii) A near-ultraviolet illuminant (e.g., a near-ultraviolet LED) is used as the first illuminant, a red phosphor (e.g., the phosphor of the present invention) is used as the first phosphor, and a combination of a blue phosphor and a green phosphor is used as the second phosphor.

(iii) A blue illuminant (e.g., a blue LED) is used as the first illuminant, an orange phosphor (e.g., the phosphor of the present invention) is used as the first phosphor, and a green phosphor is used as the second phosphor.

(iv) A near-ultraviolet illuminant (e.g., a near-ultraviolet LED) is used as the first illuminant, an orange phosphor (e.g., the phosphor of the present invention) is used as the first phosphor, and a combination of a blue phosphor and a green phosphor is used as the second phosphor.

The combinations of the phosphors described above will described below in further detail.

In the present invention, preferably, the light-emitting devices include combinations of semiconductor light-emitting elements and phosphors described below.

In Tables shown below, phosphors in which the difference between the phosphors is only part of their structures are described with appropriate omissions. For example, "$Y_2SiO_5:Ce^{3+}$", "$Y_2SiO_5:Tb^{3+}$" and "$Y_2SiO_5:Ce^{3+},Tb^{3+}$" are referred to as "$Y_2SiO_5:Ce^{3+},Tb^{3+}$". "$La_2O_2S:Eu$", "$Y_2O_2S:Eu$", and "$(La,Y)_2O_2S:Eu$" are referred to as "$(La,Y)_2O_2S:Eu$". In this case, the total of the elements in parentheses is 1 mol. The omitted portion is divided by a comma (,).

TABLE 3a a) White-light-emitting device including combination of blue LED and orange phosphor of the invention.

| Semiconductor light-emitting element | Orange phosphor |
| --- | --- |
| Blue LED | Orange phosphor of the invention |

TABLE 3b b) White-light-emitting device including combination of blue LED, one or two or more phosphors selected from yellow phosphors shown in Table, and orange phosphor of the invention.

| Semiconductor light-emitting element | Yellow phosphor | Orange phosphor |
| --- | --- | --- |
| Blue LED | $(Y,Gd)_3(Al,Ga)_5O_{12}:Ce$<br>$(Tb,Gd)_3(Al,Ga)_5O_{12}:Ce$<br>$(Sr,Ba,Ca,Mg,Eu)_2SiO_4$<br>Eu-activated α-Sialon | Orange phosphor of the invention |

TABLE 3c c) White-light-emitting device including combination of blue LED, one or two or more phosphors selected from green phosphors shown in Table, and orange phosphor of the invention.

| Semiconductor light-emitting element | Green phosphor | Orange phosphor |
| --- | --- | --- |
| Blue LED | $Ca_3(Sc,Mg)_2Si_3O_{12}:Ce$<br>$(Ba,Sr)_2SiO_4:Eu$<br>$(Ca,Sr)Sc_2O_4:Ce$<br>$(Ca,Sr,Ba)Si_2N_2O_2:Eu$<br>$(Ba,Sr)_2Si_7O_{10}N_4:Eu$<br>$(Ba,Sr)_3Si_6O_9N_4:Eu$<br>$(Sr,Ba,Ca)_3Ga_2S_4:Eu$<br>Eu-activated β-Sialon | Orange phosphor of the invention |

TABLE 3d d) White-light-emitting device including combination of blue LED, one or two or more phosphors selected from green phosphors shown in Table, orange phosphor of the invention, and dark-red phosphor shown in Table.

| Semiconductor light-emitting element | Green phosphor | Orange phosphor | Dark-red phosphor |
| --- | --- | --- | --- |
| Blue LED | $Ca_3(Sc,Mg)_2Si_3O_{12}:Ce$<br>$(Ba,Sr)_2SiO_4:Eu$<br>$(Ca,Sr)Sc_2O_4:Ce$<br>$(Ca,Sr,Ba)Si_2N_2O_2:Eu$<br>$(Ba,Sr)_2Si_7O_{10}N_4:Eu$<br>$(Ba,Sr)_3Si_6O_9N_4:Eu$<br>$(Sr,Ba,Ca)_3Ga_2S_4:Eu$<br>Eu-activated β-Sialon | Orange phosphor of the invention | $(Ca,Sr)AlSiNi_3:Eu$ |

TABLE 3e e) Light-emitting device including combination of near-ultraviolet LED and orange phosphor of the invention.

| Semiconductor light-emitting element | Orange phosphor |
| --- | --- |
| Near-ultraviolet LED | Orange phosphor of the invention |

TABLE 3f f) White-light-emitting device including combination of near-ultraviolet LED, one or two or more phosphors selected from blue-green phosphors shown in Table, and orange phosphor of the invention.

| Semiconductor light-emitting element | Blue-green phosphor | Orange phosphor |
|---|---|---|
| Near-ultraviolet LED | $2SrO \cdot 0.84P_2O_5 \cdot 0.16B_2O_3$:Eu<br>$Sr_2Si_3O_8 \cdot 2SrCl_2$:Eu | Orange phosphor of the invention |

TABLE 3g g) White-light-emitting device including combination of near-ultraviolet LED, one or two or more phosphors selected from blue phosphors shown in Table, one or two or more phosphors selected from green phosphors shown in Table, and orange phosphor of the invention.

| Semiconductor light-emitting element | Blue phosphor | Green phosphor | Orange phosphor |
|---|---|---|---|
| Near-ultraviolet LED | $BaMgAl_{10}O_{17}$:Eu<br>$Ba_3MgSi_2O_8$:Eu<br>$(Sr,Ca,Ba,Mg)_5(PO_4)_3Cl$:Eu<br>Ce-activated α-Sialon<br>$2SrO \cdot 0.84P_2O_5 \cdot 0.16B_2O_3$:Eu<br>$Sr_2Si_3O_8 \cdot 2SrCl_2$:Eu | $Ca_3(Sc,Mg)_2Si_3O_{12}$:Ce<br>$(Ba,Sr)_2SiO_4$:Eu<br>$(Ca,Sr)Sc_2O_4$:Ce<br>$(Ca,Sr,Ba)Si_2N_2O_2$:Eu<br>$(Ba,Sr)_2Si_7O_{10}N_4$:Eu<br>$(Ba,Sr)_3Si_6O_9N_4$:Eu<br>$(Sr,Ba,Ca)_3Ga_2S_4$:Eu<br>Eu-activated β-Sialon<br>$BaMgAl_{10}O_{17}$:Eu,Mn<br>$(Sr,Ca,Ba)Al_2O_4$:Eu<br>$(Sr,Ca,Ba)_4Al_{14}O_{25}$:Eu<br>ZnS:Cu,Al<br>ZnS:Au,Cu,Al<br>$2SrO \cdot 0.84P_2O_5 \cdot 0.16B_2O_3$:Eu<br>$Sr_2Si_3O_8 \cdot 2SrCl_2$:Eu | Orange phosphor of the invention |

TABLE 3h h) White-light-emitting device including combination of near-ultraviolet LED, one or two or more phosphors selected from blue phosphors shown in Table, one or two or more phosphors selected from green phosphors shown in Table, orange phosphor of the invention, and one or two or more phosphors selected from dark-red phosphors shown in Table.

| Semiconductor light-emitting element | Blue phosphor | Green phosphor | Orange phosphor | Dark-red phosphor |
|---|---|---|---|---|
| Near-ultraviolet LED | $BaMgAl_{10}O_{17}$:Eu<br>$Ba_3MgSi_2O_8$:Eu<br>$(Sr,Ca,Ba,Mg)_5(PO_4)_3Cl$:Eu<br>$2SrO \cdot 0.84P_2O_5 \cdot 0.16B_2O_3$:Eu<br>$Sr_2Si_3O_8 \cdot 2SrCl_2$:Eu<br>Ce-activated α-Sialon<br>$LaAl(Si_{6-z}Al_z)N_{10-z}O_z$:Ce | $Ca_3(Sc,Mg)_2Si_3O_{12}$:Ce<br>$(Ba,Sr)_2SiO_4$:Eu<br>$(Ca,Sr)Sc_2O_4$:Ce<br>$(Ca,Sr,Ba)Si_2N_2O_2$:Eu<br>$(Ba,Sr)_2Si_7O_{10}N_4$:Eu<br>$(Ba,Sr)_3Si_6O_9N_4$:Eu<br>$(Sr,Ba,Ca)_3Ga_2S_4$:Eu<br>Eu-activated β-Sialon<br>$BaMgAl_{10}O_{17}$:Eu,Mn<br>$(Sr,Ca,Ba)Al_2O_4$:Eu<br>$(Sr,Ca,Ba)_4Al_{14}O_{25}$:Eu<br>ZnS:Cu,Al<br>ZnS:Au,Cu,Al<br>$2SrO \cdot 0.84P_2O_5 \cdot 0.16B_2O_3$:Eu<br>$Sr_2Si_3O_8 \cdot 2SrCl_2$:Eu | Orange phosphor of the invention | $3.5MgO \cdot 0.5MgF_2 \cdot GeO_2$:Mn<br>$La_2O_2S$:Eu<br>$(Ca,Sr)AlSiNi_3$:Eu |

Among these combinations, particularly preferably, the light-emitting devices include combinations of semiconductor light-emitting elements and phosphors described below.

TABLE 3i

| Semiconductor light-emitting element | Orange phosphor |
|---|---|
| Blue LED | Orange phosphor of the invention |

TABLE 3j

| Semiconductor light-emitting element | Yellow phosphor | Orange phosphor |
|---|---|---|
| Blue LED | $(Y,Gd)_3(Al,Ga)_5O_{12}$:Ce | Orange phosphor of the invention |
| Blue LED | $(Tb,Gd)_3(Al,Ga)_5O_{12}$:Ce | Orange phosphor of the invention |
| Blue LED | $(Sr,Ba,Ca,Mg,Eu)_2SiO_4$ | Orange phosphor of the invention |

TABLE 3k

| Semiconductor light-emitting element | Green phosphor | Orange phosphor |
|---|---|---|
| Blue LED | $Ca_3(Sc,Mg)_2Si_3O_{12}$:Ce | Orange phosphor of the invention |
| Blue LED | $(Ba,Sr)_2SiO_4$:Eu | Orange phosphor of the invention |
| Blue LED | $(Ca,Sr)Sc_2O_4$:Ce | Orange phosphor of the invention |
| Blue LED | $(Ca,Sr,Ba)Si_2N_2O_2$:Eu | Orange phosphor of the invention |
| Blue LED | $(Sr,Ba,Ca)_3Ga_2S_4$:Eu | Orange phosphor of the invention |

TABLE 3l

| Semiconductor light-emitting element | Blue phosphor | Orange phosphor | Dark-red phosphor |
|---|---|---|---|
| Blue LED | $Ca_3(Sc,Mg)_2Si_3O_{12}$:Ce | Orange phosphor of the invention | $(Ca,Sr)AlSiNi_3$:Eu |
| Blue LED | $(Ba,Sr)_2SiO_4$:Eu | Orange phosphor of the invention | $(Ca,Sr)AlSiNi_3$:Eu |
| Blue LED | $(Ca,Sr)Sc_2O_4$:Ce | Orange phosphor of the invention | $(Ca,Sr)AlSiNi_3$:Eu |
| Blue LED | $(Ca,Sr,Ba)Si_2N_2O_2$:Eu | Orange phosphor of the invention | $(Ca,Sr)AlSiNi_3$:Eu |
| Blue LED | $(Sr,Ba,Ca)_3Ga_2S_4$:Eu | Orange phosphor of the invention | $(Ca,Sr)AlSiNi_3$:Eu |

TABLE 3m

| Semiconductor light-emitting element | Blue phosphor | Green phosphor | Orange phosphor |
|---|---|---|---|
| Near-ultraviolet LED | $BaMgAl_{10}O_{17}$:Eu | $Ca_3(Sc,Mg)_2Si_3O_{12}$:Ce | Orange phosphor of the invention |
| Near-ultraviolet LED | $BaMgAl_{10}O_{17}$:Eu | $(Ba,Sr)_2SiO_4$:Eu | Orange phosphor of the invention |
| Near-ultraviolet LED | $BaMgAl_{10}O_{17}$:Eu | $(Ca,Sr,Ba)Si_2N_2O_2$:Eu | Orange phosphor of the invention |
| Near-ultraviolet LED | $BaMgAl_{10}O_{17}$:Eu | $2SrO \cdot 0.84P_2O_5 \cdot 0.16B_2O_3$:Eu | Orange phosphor of the invention |
| Near-ultraviolet LED | $BaMgAl_{10}O_{17}$:Eu | $Sr_2Si_3O_8 \cdot 2SrCl_2$:Eu | Orange phosphor of the invention |
| Near-ultraviolet LED | $(Sr,Ca,Ba,Mg)_5(PO_4)_3Cl$:Eu | $(Ba,Sr)_2SiO_4$:Eu | Orange phosphor of the invention |

TABLE 3n

| Semiconductor light-emitting element | Blue phosphor | Green phosphor | Orange phosphor | Dark-red phosphor |
|---|---|---|---|---|
| Near-ultraviolet LED | $BaMgAl_{10}O_{17}$:Eu | $Ca_3(Sc,Mg)_2Si_3O_{12}$:Ce | Orange phosphor of the invention | $3.5MgO \cdot 0.5MgF_2 \cdot GeO_2$:Mn |
| Near-ultraviolet LED | $BaMgAl_{10}O_{17}$:Eu | $(Ba,Sr)_2SiO_4$:Eu | Orange phosphor of the invention | $3.5MgO \cdot 0.5MgF_2 \cdot GeO_2$:Mn |
| Near-ultraviolet LED | $BaMgAl_{10}O_{17}$:Eu | $(Ca,Sr,Ba)Si_2N_2O_2$:Eu | Orange phosphor of the invention | $3.5MgO \cdot 0.5MgF_2 \cdot GeO_2$:Mn |
| Near-ultraviolet LED | $BaMgAl_{10}O_{17}$:Eu | $2SrO \cdot 0.84P_2O_5 \cdot 0.16B_2O_3$:Eu | Orange phosphor of the invention | $3.5MgO \cdot 0.5MgF_2 \cdot GeO_2$:Mn |
| Near-ultraviolet LED | $BaMgAl_{10}O_{17}$:Eu | $Sr_2Si_3O_8 \cdot 2SrCl_2$:Eu | Orange phosphor of the invention | $3.5MgO \cdot 0.5MgF_2 \cdot GeO_2$:Mn |
| Near-ultraviolet LED | $(Sr,Ca,Ba,Mg)_5(PO_4)_3Cl$:Eu | $(Ba,Sr)_2SiO_4$:Eu | Orange phosphor of the invention | $3.5MgO \cdot 0.5MgF_2 \cdot GeO_2$:Mn |

The phosphor of the present invention may be used as a mixture the phosphor of the present invention and another phosphor (wherein the term "mixture" means that the phosphors need not necessarily be mixed with each other but different phosphors are combined). In particular, the phosphors are mixed in the combinations shown in Tables 3a to 3n to obtain preferred phosphor mixture. The types and proportions of the phosphors mixed are not particularly limited.

[2-2-4. Sealing Material]

The second illuminant includes the first phosphor and optionally the second phosphor dispersed in a sealing material.

Examples of the sealing material include thermoplastic resins, thermosetting resins, and photocurable resins. Specific examples thereof include methacrylic resins such as polymethyl methacrylate; styrene resins such as polystyrene and styrene-acrylonitrile copolymers; polycarbonate resins; polyester resins; phenoxy resins; butyral resins; polyvinyl alcohol; cellulose resins, such as ethyl cellulose, cellulose acetate, and cellulose acetate butyrate; epoxy resins; phenolic resins; and silicone resins. Furthermore, an in organic material, e.g., an inorganic material having siloxane bonding which prepared by solidified of a metal alkoxide, a ceramic precursor, a solution containing the metal alkoxide which obtained by hydrolytic polymerization by sol-gel method, or a combination of these starting materials may be used as the sealing material.

Among these, from the viewpoint of achieving good heat resistance, ultraviolet resistance, and the like, silicone resins, a solution prepared by hydrolytic polymerization of a solution containing a metal alkoxide, a ceramic precursor polymer, or a metal alkoxide, by a sol-gel method, and an inorganic material prepared by solidifying the combination of these solutions, e.g., an inorganic material having siloxane bonding, are preferred.

Among these, in the case where the sealing material is used together with the phosphor of the present invention, silicone resins and silicone materials are preferably used. More preferably, silicone resins are used. Examples of the silicone resins include addition-type silicone resins and condensation-type silicone resins. Among these, condensation-type phenyl-group-containing silicone resins are preferred. Silicone resins and silicone materials each having a refractive index of 1.45 or more are more preferred.

Among these sealing materials, silicone materials and silicone resins each having at least one of features <1> to <3> described below are preferred.

<1> In a solid-state Si nuclear magnetic resonance (NMR) spectrum, at least one peak defined by peak (a) and/or peak (b) described below is present:

(a) a peak with a peak top that is located in the chemical shift range of −40 ppm to 0 ppm and with a full width at half maximum of 0.3 ppm to 3.0 ppm.

(b) a peak with a peak top that is located in the chemical shift range from −80 ppm to less than −40 ppm and with a full width at half maximum of 0.3 ppm to 5.0 ppm.

<2> The silicon content is 20 percent by weight or more.

<3> The silanol content is 0.1 percent by weight to 10 percent by weight.

In the present invention, silicone materials and silicone resins each having the feature <2> among the features <1> to <3> are preferred. Silicone materials and silicone resins each having the features <1> and <2> are more preferred. Silicone materials and silicone resins each having all of the features <1> to <3> are particularly preferred.

These features <1> to <3> will be described below. Hereinafter, a silicone material having the features <1> to <3> is referred to as a "silicone material used for the present invention".

Solid-State Si—NMR Spectrum

A compound mainly composed of silicon and represented by the rational formula $SiO_2 \cdot nH_2O$ has a structure in which a tetrahedral arrangement has a silicon atom bonded to oxygen atoms at the apices of the tetrahedron and in which the oxygen atoms are bonded to other silicon atoms to form a network structure. Schematic views described below show network structures of Si—O regardless of the tetrahedral arrangement described above. With respect to the repeating unit Si—O—Si—O—, a repeating unit in which the oxygen atoms thereof are partially replaced with another component, e.g., —H or —$CH_3$, is also present. When attention is focused on a single silicon (Si) atom, there are a silicon atom with four —OSi, i.e., $Si(Q^4)$, as shown in schematic view (A), a silicon atom with three —OSi, i.e., $Si(Q^3)$, as shown in schematic view (B), and the like. In solid-state Si—NMR measurement, peaks based on the silicon (Si) atoms are referred to as, in sequence, a $Q^4$ peak, a $Q^3$ peak, . . . .

[Chem. 1]

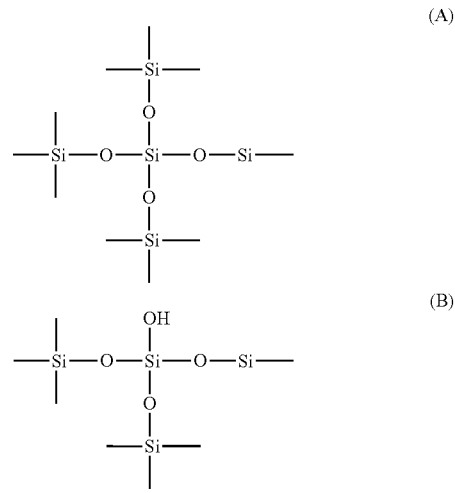

In general, these silicon atoms each bonded to four oxygen atoms are generically called Q-sites. In the present invention, $Q^0$ to $Q^4$ peaks resulting from the Q-sites are referred to as a "$Q^n$ peak group". The $Q^n$ peak group of a film of silica that does not have an organic substituent is usually observed as a continuous multimodal peak in the chemical shift range of −80 ppm to −130 ppm.

In general, silicon atoms each bonded to three oxygen atoms and another atom (usually carbon) are generically called T-sites. In the same way as in the Q-sites, peaks resulting from the T-sites are observed as $T^0$ to $T^3$ peaks. In the present invention, the peaks resulting from the T-sites are referred to as "$T^n$ peak group". The $T^n$ peak group is usually observed as a continuous multimodal peak in higher magnetic fields (in the chemical shift range of usually −80 ppm to −40 ppm) than the $Q^n$ peak group.

In general, silicon atoms each bonded to two oxygen atoms and two other atoms (usually carbon) are generically called D-sites. In the same way as in the peak groups resulting from the Q-sites and T-sites, peaks resulting from the D-sites are observed as $D^0$ to $D^n$ peaks (referred to as "$D^n$ peak group").

The D″ peak group is observed as a continuous multimodal peak in higher magnetic fields (in the chemical shift range of usually 0 ppm to −40 ppm) than the Q″ and T″ peak groups. The proportions of areas of the D″, T″, and Q″ peak groups are equal to the molar proportions of the silicon atoms located in each of the peak groups. Let the total area of the peaks be the total molar amount of the silicon atoms. The total area of the D″ peak group and the T″ peak group corresponds usually to the total molar amount of silicon directly bonded to carbon atoms.

Measurement of the solid-state Si—NMR spectrum of the silicone material used for the present invention demonstrates that the D″ peak group and the T″ peak group resulting from silicon atoms directly bonded to carbon atoms of organic groups and the Q″ peak group resulting from silicon atoms that are not bonded to the carbon atoms of the organic groups appear in different regions. Among these peaks, the peaks observed at less than −80 ppm correspond to the Q″ peaks, and the peaks observed at −80 ppm or more correspond to the D″ and T″ peaks, as described above. In the silicone material used for the present invention, the Q″ peaks are not essential, but at least one, preferably a plurality of peaks are observed in the D″ and T″ peak regions.

The silicone material used for the present invention is characterized in that the full width at half maximum of the peak observed at −80 ppm or more is smaller (narrower) than the full width at half maximum of a known silicone material prepared by a sol-gel method.

The full widths at half maximum are organized by chemical shifts as follows. In the silicone material used for the present invention, the full width at half maximum of the T″ peak group with peak tops observed in the range from −80 ppm to less than −40 ppm is in the range of usually 5.0 ppm or less and preferably 4.0 ppm or less, and usually 0.3 ppm or more and preferably 0.4 ppm or more.

Similarly, the full width at half maximum of the D″ peak group with peak tops observed in the range of −40 ppm to 0 ppm is generally smaller than that of the T″ peak group, because of moderate restriction of molecular motion, and is in the range of usually 3.0 ppm or less and preferably 2.0 ppm or less, and usually 0.3 ppm or more.

In the case where the full width at half maximum of the peak observed in each of the chemical shift regions described above is larger than the range described above, severe restriction of molecular motion increases strain, easily forming cracks. Thus, a member may have poor heat resistance, weather resistance, and durability. Examples of the case where the range of the full width at half maximum is larger than the range described above are as follows: for example, the case in which a large amount of a tetraalkoxy silane is used; and the case in which rapid drying in a drying step results in the accumulation of increased internal stress.

In the case where the full width at half maximum of the peak is smaller than the range described above, Si atoms present in such an environment do not participate in siloxane crosslinking. Thus, for example, a trialkoxy silane remains in an uncrosslinked state. Therefore, a member may have poor heat resistance, weather resistance, and durability compared with those of a material mainly having siloxane bonds.

The composition of the silicone material used for the present invention is limited to the case where crosslinking in the system is mainly formed by inorganic components, such as silica. That is, even if a peak of a silicone material containing a small amount of a Si component in a large amount of an organic component may have a full width at half maximum within the above range at −80 ppm or more, satisfactory heat resistance, light resistance, and application performance cannot be obtained.

The value of the chemical shift of the silicone material used for the present invention can be calculated on the basis of results obtained by performing solid-state Si—NMR measurement according to the following method. Analysis of measurement data (analysis of the full width at half maximum and the amount of silanol) is performed by a method in which peaks are separated and extracted by waveform separation analysis using, for example, the Gaussian function and the Lorenz function.

Solid-State Si—NMR Spectrum Measurement and Calculation of Silanol content

In the case where solid-state Si—NMR spectrum measurement of a silicone material is performed, solid-state Si—NMR spectrum measurement and waveform separation analysis are performed under the conditions described below. The full width at half maximum of each of the peaks of the silicone material is determined on the basis of the resulting waveform data. The proportion (%) of silicon atoms of silanol to the total silicon atoms is determined on the basis of the ratio of a peak area resulting from silanol to the total peak area. In comparison to a silicon content separately analyzed, the silanol content is determined.

{System Conditions}

System: Infinity CMX-400 nuclear magnetic resonance spectrometer, manufactured by Chemagnetics Inc.
$^{29}$Si resonance frequency: 79.436 MHz
Probe: CP/MAS probe with a diameter of 7.5 mm
Temperature during measurement: Room temperature
Number of rotation of sample: 4 kHz
Method for measurement: Single-pulse method
$^1$H decoupling frequency: 50 kHz
$^{29}$Si flip angle: 90°
$^{29}$Si 90° pulse duration: 5.0 µs
Repetition time: 600 s
Number of accumulations: 128
Observation range: 30 kHz
Broadening factor: 20 Hz {Data Treatment}

For a silicone material, 512 points are recorded as measurement data and zero-filled to 8192 points prior to Fourier transformation.

{Waveform Separation Analysis}

For each of the peaks in the spectrum after Fourier transformation, a peak shape is formed using a Lorentz waveform, a Gaussian waveform, or a mixture of both. Optimization calculation is performed by a nonlinear least-squares method using the center position, height, and full width at half maximum of the peak shape as variable parameters.

The peaks are identified with reference to, for example, AIChE Journal, 44(5), p. 1141, 1998.

Silicon Content

The silicone material used for the present invention has a silicon content of 20 percent by weight or more (feature <2>).

The basic skeleton of a known silicone material is of carbon-carbon and carbon-oxygen bonds, and such a silicone material is an organic resin such as an epoxy resin. In contrast, the basic skeleton of the silicone material used for the present invention is of inorganic siloxane bonds and is the same as that of glass (silicate glass). As is clear from Table 1, which is a chemical-bond comparison table, the siloxane bond has the following excellent characteristics as a silicone material.

(I) The bond energy of the siloxane bond is large; hence, the siloxane bond is not easily decomposed by heat or light, leading to satisfactory light resistance.

(II) The siloxane bond is slightly electrically polarized.
(III) The chain structure having a high degree of freedom makes it possible to form a structure with good flexibility. The structure can freely rotate around the siloxane chain.
(IV) The siloxane bond has a high degree of oxidation and thus is not further oxidized.
(V) The siloxane bond has satisfactory electrical insulating properties.

TABLE 4

Chemical-bond comparison table

| Bond | Bond distance (Å) | Bond energy (kcal/mol) | Bond angle (°) |
|---|---|---|---|
| Si—O—Si | 1.64 | 108 | 130~160 |
| C—O—C | 1.43 | 86 | 110 |
| C—C—C | 1.54 | 85 | 109 |

It is understood from these characteristics that a silicone material composed of a silicone having a skeleton in which siloxane bonds are three-dimensionally formed with a high degree of crosslinking behaves like an inorganic material, such as glass or rock, and that a protective film composed of such a silicone material has satisfactory heat resistance and light resistance. In particular, a silicone material having a methyl group as a substituent does not have absorption in the ultraviolet region and thus does not easily decomposed by light. Thereby, such a silicone material has excellent light resistance.

The silicon content of the silicone material used for the present invention is 20 percent by weight or more, as described above, preferably 25 percent by weight or more, and more preferably 30 percent by weight or more. The upper limit is usually 47 percent by weight or less because glass that consists of pure $SiO_2$ has a silicon content of 47 percent by weight.

The silicon content of the silicone material can be calculated on the basis of results obtained by inductively coupled plasma spectrometry (hereinafter, appropriately abbreviated as "ICP") using, for example, the following method.

{Measurement of Silicon Content}

A cured product of a silicone material alone is ground into particles having a particle size of about 100 μm and baked at 450° C. for 1 hour, 750° C. for 1 hour, and 950° C. 1.5 hours in a platinum crucible in air to remove carbon components. Then, sodium carbonate is added to a small portion of the resulting residue in an amount of 10 or more times the amount of the portion of the residue. The mixture is heated with a burner to melt the mixture and then cooled. Desalted water is added thereto. The resulting solution is diluted to a specific volume in such a manner that the concentration of silicon is about several ppm while the pH is adjusted to approximately neutral with hydrochloric acid. Then ICP analysis is performed.

Silanol Content

The silicone material used for the present invention has a silanol content of usually 0.1 percent by weight or more and preferably 0.3 percent by weight or more, and usually 10 percent by weight or less, preferably 8 percent by weight or less, and more preferably 5 percent by weight or less (feature <3>). The silicone material used for the present invention has a low silanol content and thus has excellent performance, i.e., only a small change with time, excellent long-term performance stability, low hygroscopicity and low moisture permeability. However, a member that does not contain silanol at all has poor adhesion. Therefore, the above-described optimum range of the silanol content is set.

The silanol content of a silicone material can be determined as follows: Solid-state Si—NMR spectrum measurement is performed by the method described in "Solid-State Si—NMR Spectrum Measurement and Caluculation of Silanol content" in "Solid-State Si—NMR Spectrum". The proportion (%) of silicon atoms of silanol to the total silicon atoms is determined on the basis of the ratio of a peak area resulting from silanol to the total peak area. In comparison to a silicon content separately analyzed, the silanol content is calculated.

The silicone material used for the present invention contains an appropriate amount of silanol. Thus, silanol is hydrogen-bonded to a polar portion present on a surface of a device, resulting in adhesion. Examples of the polar portion include hydroxy groups and oxygen of metalloxane bonds.

The silicone material used for the present invention is heated in the presence of a proper catalyst to form covalent bonding to the hydroxy groups on a surface of a device by dehydration condensation, thereby resulting in stronger adhesion.

An excessively large amount of silanol may increase the viscosity of the system, which makes application more difficult. Furthermore, an excessively large amount of silanol may increase activity to cause the solidification by heat before low-boiling-point components volatilize, resulting in foaming and an increase in internal stress. This may induce cracking.

Measurement Value of Hardness

The silicone material used for the present invention is preferably elastomeric. Specifically, the measurement value of hardness (Shore A) with a type-A durometer is usually 5 or more, preferably 7 or more, and more preferably 10 or more, and usually 90 or less, preferably 80 or less, and more preferably 70 or less (feature <4>). The silicone material having a measurement value within the above range has advantages in that cracks do not easily form and reflow resistance and temperature-cycle resistance are excellent.

The measurement value of hardness (Shore A) can be measured by a method described in JIS K6253. Specifically, hardness can be measured with a Type A Rubber hardness tester manufactured by Kori Seiki Mfg. Co., Ltd. The term "reflow" refers to a soldering method in which solder paste is applied to a substrate by printing and a component is mounted thereon and bonded by heating. The term "reflow resistance" refers to a property capable of resisting thermal shock at a maximum temperature of 260° C. for 10 seconds.

Other Additives

The silicone material used for the present invention allows the sealing member to contain a metal element that can form a metal oxide having a high refractive index in order to adjust the refractive index of the sealing member. Examples of the metal element that can form a metal oxide having a high refractive index include Si, Al, Zr, Ti, Y, Nb, and B. These metal elements may be used alone or in any combination of two or more and in any proportion.

The existence form of such a metal element is not particularly limited unless the transparency of the sealing member is reduced. For example, the metal element may form metalloxane bonds to form a uniform glass layer. Alternatively, the metal element in the form of particles may be present in the sealing member. In the case where the metal element is present in the form of particles, the internal structure of each particle may be amorphous or crystalline. To obtain a high refractive index, a crystalline structure is preferred. The particle size is usually a size equal to or lower than the emission wavelength of a semiconductor light-emitting element, preferably 100 nm or less, more preferably 50 nm or less, and particularly preferably 30 nm or less, in order not to reduce the transparency of the sealing member. For example, the incorporation of particles of, for example, silicon oxide, aluminum oxide, zirconium oxide, titanium oxide, yttrium oxide, niobium oxide into a silicone material allows the sealing member to contain the metal element in the form of particles.

The silicone material used for the present invention may further contain a known additive such as a diffusing agent, a filler, a viscosity-adjusting agent, and an ultraviolet-ray absorber.

A specific example of the silicone material used for the present invention is a silicone material described in Japanese Patent Application No. 2006-176468.

[2-3. Structure of Light-Emitting Device]

The structure of the light-emitting device of the present invention is not particularly limited as long as it includes the first illuminant and the second illuminant. Usually, the first illuminant and the second illuminant are arranged on an appropriate frame. In this case, the first illuminant and the second illuminant are arranged in such a manner that the second illuminant is excited by the emission of the second illuminant, i.e., the first and second illuminants are excited, to emit light and that light emitted from the first illuminant and/or light emitted from the second illuminant is guided to the outside. In this case, the first phosphor and the second phosphor need not necessarily be incorporated in the same layer. Phosphors that emit light of different colors may be incorporated into different layers. For example, a layer containing the second phosphor may be stacked on a layer containing the first phosphor.

The light-emitting device of the present invention may further include a member other than the first illuminant and the second illuminant. Examples thereof include the sealing materials described in "[2-2-4. Sealing Material]". Specifically, the sealing material can be used to disperse the second phosphor in the light-emitting device. Furthermore, the sealing material can be used to bond the first illuminant, the second illuminant, and the frame.

[2-4. Embodiment of Light-Emitting Device]

While the light-emitting device of the present invention will be described in further detail below by embodiments, the present invention is not limited to the embodiments described below. Various changes may be made without departing from the scope of the invention.

FIG. 1a schematically shows the structure of a light-emitting device according to an embodiment of the present invention. A light-emitting device 1 according to this embodiment includes a frame 2, a blue LED (first illuminant) 3 as a light source, and a phosphor-containing portion (second illuminant) 4 that partially absorbs light emitted from the blue LED 3 and emits light having a wavelength different from that of light emitted from the blue LED 3.

The frame 2 is a metal base that holds the blue LED 3 and the phosphor-containing portion 4. A depression (recess) 2A that opens toward the upper side in FIG. 1a and having a trapezoidal cross section is formed on the upper surface of the frame 2. That is, the frame 2 has a cup shape. This allows light emitted from the light-emitting device 1 to have directivity, so that light emitted can be effectively utilized. Furthermore, the surface of the depression 2A of the frame 2 is subjected to metal plating such as silver plating to increase light reflectance in the entire visible light region. Thus, light incident on the surface of the depression 2A of the frame 2 can travel toward a predetermined direction from the light-emitting device 1.

The blue LED 3 as a light source is mounted on the bottom of the depression 2A of the frame 2. The blue LED 3 is an LED that emits blue light when energized. Part of blue light emitted from the blue LED 3 is absorbed by light-emitting materials (first and second phosphors) in the phosphor-containing portion 4 as an excitation light. Another part of blue light travels toward a predetermined direction from the light-emitting device 1.

The blue LED 3 is mounted on the bottom of the depression 2A of the frame 2 as described above. In this case, the blue LED 3 is bonded to the frame 2 with silver paste (which contains silver particles dispersed in an adhesive) 5. Thereby, the blue LED 3 is mounted on the frame 2. Furthermore, the silver paste 5 plays a role in efficiently dissipating heat generated in the blue LED 3 to the frame 2.

A metal wire 6 that supplies power to the blue LED 3 is attached to the frame 2. That is, an electrode (not shown) arranged on the upper face of the blue LED 3 is connected to the metal wire 6 by wire bonding. Application of power to the metal wire 6 supplies power to the blue LED 3. As a result, the blue LED 3 emits blue light. With respect to the metal wire 6, a single or plurality of wires are attached in response to the structure of the blue LED 3.

The phosphor-containing portion 4 that absorbs part of light emitted from the blue LED 3 and that emits light having a wavelength different from light emitted from the blue LED 3 is provided in the depression 2A of the frame 2. The phosphor-containing portion 4 is composed of a phosphor and a transparent resin (sealing material). The phosphor is a material that is excited by blue light emitted from the blue LED 3 and emits light having a wavelength longer than that of blue light. The phosphor-containing portion 4 may be composed of a single phosphor or a mixture of a plurality of phosphors. This may be selected in such a manner that the total of light emitted from the blue LED 3 and light emitted from the phosphor-containing portion 4 exhibits intended color. The color may be not only white but also yellow, orange, pink, purple, blue-green, or the like. Alternatively, the color may be an intermediate color between white and one of these colors. In this case, for example, an orange phosphor (first phosphor) composed of the phosphor of the present invention and a green phosphor (second phosphor) are used as the phosphors in such a manner that the light-emitting device emits white light.

The transparent resin is a sealing material of the phosphor-containing portion 4. In this case, the above-described sealing resin is used.

A mold portion 7 protects the blue LED 3, the phosphor-containing portion 4, the metal wire 6, and the like from the outside and serves as a lens to control light distribution properties. Typically, the mold portion 7 is composed of a silicone resin.

The light-emitting device according to this embodiment has the structure described above. The emission of the blue LED 3 excites the orange phosphor and the green phosphor in the phosphor-containing portion 4 to emit light. Thereby, the light-emitting device emits white light composed of blue light emitted from the blue LED 3, orange light emitted from the orange phosphor, and green light emitted from the green phosphor.

In the light-emitting device according to this embodiment, the phosphor of the present invention, which has excellent temperature characteristics, is used as the orange phosphor. Thus, even when the blue LED 3 produces heat, the luminance of light emitted from the orange phosphor is not significantly reduced. This can suppress a reduction in the emission intensity of the light-emitting device due to heat produced by the blue LED 3 and prevent a change in the color of light emitted from the light-emitting device due to a reduction in the luminance of orange light. Thus, even when a high-power LED is used as the first illuminant, the phosphor-containing portion 4 containing the phosphor of the present invention results in only a slight reduction in emission intensity and only a slight change in emission color.

The light-emitting device of the present invention is not limited to that according to the embodiment described above. Various changes may be made within the scope of the gist of the invention.

For example, a planar illuminant can be used as the first illuminant, and a film illuminant can be used as the second illuminant. In this case, a structure in which the second illuminant in the form of a film is in directly contact with the light-emitting face of the first illuminant is preferred. The term "contact" defined here refers to a state in which the first illuminant is in complete contact with the second illuminant without air or a gas therebetween. As a result, a light quantity loss in which light from the second illuminant is reflected from the film surface of the second illuminant to emerge to the outside can be prevented, thereby increasing luminous efficiency of the entire device.

Figure 2:
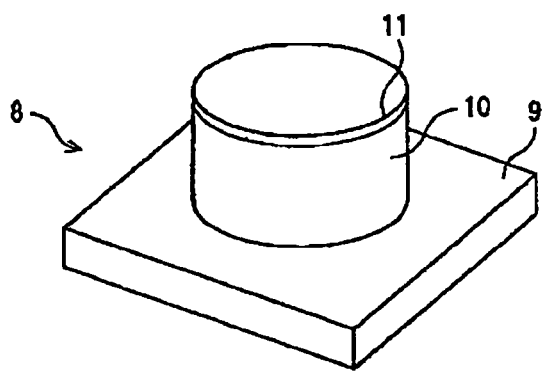
FIG. 2 is a schematic perspective view of a light-emitting device according to another embodiment of the present invention.

FIG. 2 is a schematic perspective view of an exemplary light-emitting device including a planar illuminant as the first illuminant and a film illuminant as the second illuminant. In a light-emitting device 8 shown in FIG. 2, a planar illumination GaN-based LD 10 is arranged on a substrate 9 as the first illuminant, and the planar illumination GaN-based LD 10 is overlaid with a second illuminant 11 in the form of a film. To achieve a contact state, the LD 10 as the first illuminant and the second illuminant 11 may be separately prepared, and then surfaces of them may be brought into contact with each other using an adhesive or another means. Alternatively, the second illuminant 11 may be formed (deposited) on the light-emitting face of the LD10. Thereby, LD 11 is in contact with the second illuminant 11.

The light-emitting device 8 having such a structure has the same advantages as in the embodiment described above and luminous efficiency improved by preventing a light quantity loss.

[2-5. Application of Light-Emitting Device]

Applications of the light-emitting device of the present invention are not particularly limited. The light-emitting device can be used in various fields in which common light-emitting devices are used. The light-emitting device of the present invention is particularly suitably used as an image display or a light source in an illumination apparatus because of satisfactory temperature characteristics. In the case where the light-emitting device of the present invention is used as the light source of the image display, the light-emitting device is preferably used together with a color filter. For example, in the case where a color image display including a color liquid crystal display element is produced as the image display, a combination of the light-emitting device as a backlight, a liquid crystal light valve, and a color filter including red, green, and blue pixels produces an image display.

For example, in the case where the light-emitting device of the present invention is used in an image display as described above, the phosphor of the present invention as the second illuminant and $(Ba,Sr)_2SiO_4$:Eu are preferably used with the color filter. This is because the combination results in significantly excellent color rendering properties owing to an increased red component, excellent light use efficiency, and high luminance, as compared with the case where a light-emitting device using only a yellow phosphor (e.g., a YAG phosphor) is used in an image display.

Figure 3:
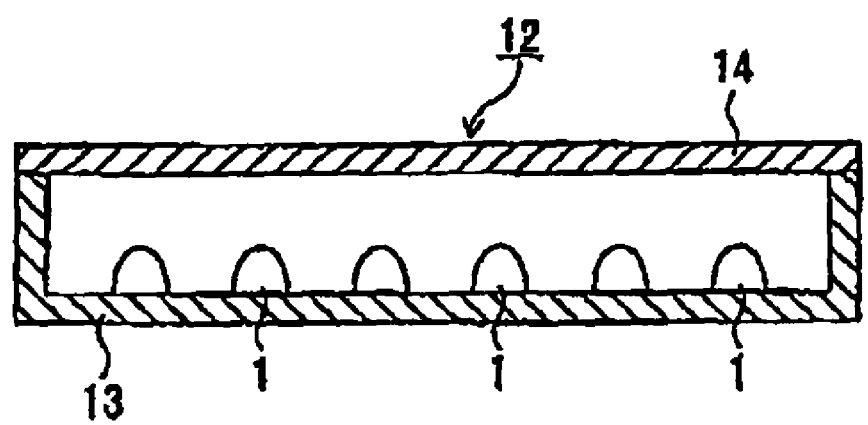
FIG. 3 is a schematic cross-sectional view of an example of a planar illumination apparatus including a light-emitting device of the present invention.

FIG. 3 schematically shows an example of a planar illumination apparatus 12 including the light-emitting devices 1. In the planar illumination apparatus 12, many light-emitting devices 1 are arranged on the bottom of an opaque square case 13 having a smooth white inner surface, a power supply, a circuit, and the like (not shown) that drive the light-emitting devices 1 are arranged outside thereof. To uniformize emission, a diffuser 14, such as a milky white acrylic board, is fixed to a portion corresponding to a lid of the case 13.

When the planar illumination apparatus 12 is used, the light-emitting devices 1 emit light. Light emitted travels toward the upper side in the figure through the diffuser 14. Thereby, illuminating light having uniform brightness is obtained in the plane of the diffuser 14 of the case 13.

EXAMPLE

While the present invention will be described in further detail below by examples, the present invention is not limited to examples described below within a range in which the scope of the invention is not impaired.

[Measurement, Evaluation, etc. of Phosphor]

In each of examples and comparative examples, various evaluations of phosphor particles were made by the following methods.

Emission Spectrum

The emission spectrum of a phosphor was measured with a fluorescence spectrometer (manufactured by JASCO Corporation) provided with a 150-W xenon lamp as an excitation light source and a CCD multichannel detector C7041 (manufactured by Hamamatsu Photonics K.K.) as a spectrometer. Light from the excitation light source was passed through a grating spectrometer with the focal length of 10 cm. The phosphor was irradiated with only an excitation light having a wavelength of 400 nm, 405 nm, 455 nm, or 460 nm through an optical fiber. Light emitted from the phosphor by irradiation with the excitation light was dispersed into a spectrum with a grating spectrometer with the focal length of 25 cm. Emission intensities at wavelengths in the range of 300 nm to 800 nm were measured with the spectrometer. Signal processing such as sensitivity correction with a personal computer was performed to obtain an emission spectrum.

Emission Peak Wavelength, Emission Peak Intensity, and Full Width at Half Maximum The emission peak wavelength and full width at half maximum were read from the resulting emission spectrum. The emission peak intensity was represented by a relative value with reference to the peak intensity of a phosphor (P46-Y3, manufactured by Kasei Optonix, Ltd.) in COMPARATIVE EXAMPLE 3.

Color Coordinates

Color coordinates x and y in the XYZ colorimetric system defined by JIS Z8701 were calculated from the data in the wavelength range of 420 nm to 800 nm (in the case of excitation wavelengths of 400 nm and 405 nm) or 480 nm to 800 nm (in the case of excitation wavelengths of 455 nm and 460 nm) of the emission spectrum.

Relative Luminance

The relative value of the stimulus value Y was defined as a relative luminance because the stimulus value Y defined by JIS Z8701 was proportional to luminance. The phosphor in COMPARATIVE EXAMPLE 3 was used as a standard.

Excitation Spectrum

The excitation spectrum was measured with a fluorescence spectrophotometer F4500 manufactured by Hitachi, Ltd.

Emission-Intensity Maintenance Ratio and Luminance-Maintenance Ratio

Emission-intensity maintenance ratio and luminance maintenance ratio were measured with a multichannel spectrophotometer MCPD7000, as an emission spectrometer, manufactured by Otsuka Electronics Co., Ltd., a luminance calorimeter BM5A as a luminance measuring apparatus, a stage including a cooling mechanism with a Peltier element and a heating mechanism with a heater, and an apparatus provided with a 150-W xenon lamp as a light source.

A cell into which a phosphor sample was charged is placed on the stage. The temperature was changed in the range of 20° C. to 150° C. It was checked that the surface of the phosphor had a constant temperature of 20° C., 25° C., 100° C., 125° C., or 150° C. The phosphor was excited by 405-nm, 455-nm, or 465-nm light obtained by dispersing light from the light source with a diffraction grating, and an emission spectrum and luminance were measured. The emission peak intensity was determined from the measured emission spectrum.

Corrected values obtained by using temperature values measured with a radiation thermometer and a thermocouple were used as the measurements of the surface temperature of the phosphor.

The relative value of the luminance value at a temperature measured with the luminance measuring apparatus to the luminance value at 20° C. was defined as the luminance-maintenance ratio.

The relative value of the emission peak intensity determined from the emission spectrum measured with the spectrometer to the emission peak intensity at 20° C. or 25° C. was defined as the emission-intensity maintenance ratio.

For example, the emission-intensity maintenance ratio when a phosphor is excited by 455-nm light at 125° C. may be determined as follows.

When an emission peak intensity obtained by exciting the phosphor by light having a peak wavelength of 455 nm at 25° C. is referred to as $R_{455}(25)$ and when an emission peak intensity obtained by exciting the phosphor by light having a peak wavelength of 455 nm at 125° C. is referred to as $R_{455}(125)$, the value of the following expression is defined as the emission-intensity maintenance ratio when the phosphor is excited by 455-nm light at 125° C.

$$\{R_{455}(125)/R_{455}(25)\} \times 100$$

In Table shown below, $\{R_{455}(100)/R_{455}(25)\} \times 100$ and $\{R_{405}(100)/R_{405}(25)\} \times 100$ are each referred to as an "emission-intensity maintenance ratio 100° C.". $\{R_{455}(125)/R_{455}(25)\} \times 100$ and $\{R_{405}(125)/R_{405}(25)\} \times 100$ are each referred to as an "emission-intensity maintenance ratio 125° C.". $\{R_{455}(150)/R_{455}(25)\} \times 100$ and $\{R_{405}(150)/R_{405}(25)\} \times 100$ are each referred to as an "emission-intensity maintenance ratio 150° C.".

Internal Quantum Efficiency, External Quantum Efficiency, and Absorption Efficiency The absorption efficiency $\alpha_q$, the internal quantum efficiency $\eta_i$, and the external quantum efficiency $\eta_o$ were determined as follows.

A phosphor sample to be measured was charged into a cell so as to have a sufficiently smooth surface to maintain measurement accuracy and was an integrating sphere.

Light from a light source (150-W Xe lamp) for exciting the phosphor was introduced into the integrating sphere with an optical fiber. Light from the light source was adjusted into monochromatic light having an emission peak wavelength of, for example, 405 nm or 455 nm with a monochromator (grating spectrometer). The target phosphor sample was irradiated with the monochromatic light as an excitation light. The spectrum including an emitted light component (fluorescence) and a reflected light component was measured with a spectrometer MCPD7000 manufactured by Otsuka Electronics Co., Ltd. Light in the integrating sphere was guided to the spectrometer with an optical fiber.

The absorption efficiency $\alpha_q$ is a value obtained by dividing the number of photons $N_{abs}$ of the excitation light absorbed by the phosphor sample by the total number of photons N of the excitation light.

The latter, i.e., the total number of photons N of the excitation light, is proportional to the value of (Expression I).

A reflector composed of a material having a reflectance R of substantially 100% to the excitation light, e.g., "Spectralon" manufactured by Labsphere, Inc., (Spectralon had a reflectance R of 98% to 450-nm excitation light) was attached as an object subject to measurement in integrating sphere in the same arrangement as the phosphor sample. The reflector was irradiated with the excitation light to measure a reflection spectrum $I_{ref}(\lambda)$ with the spectrometer. The value of (Expression I) was determined.

[Ex. 4]

$$\frac{1}{R}\int \lambda \cdot I_{ref}(\lambda)d\lambda \qquad \text{(Expression I)}$$

When the excitation wavelength was 405 nm, the integration interval was set in the range of 351 nm to 442 nm. When the excitation wavelength was 455 nm, the integration interval was set in the range of 410 nm to 480 nm.

The number of photons $N_{abs}$ of the excitation light absorbed by the phosphor sample is proportional to an amount determined by (Expression II) described below.

[Ex. 5]

$$\frac{1}{R}\int \lambda \cdot I_{ref}(\lambda)d\lambda - \int \lambda \cdot I(\lambda)d\lambda \qquad \text{(Expression II)}$$

$I(\lambda)$ that represents a reflection spectrum when the target phosphor sample with the absorption efficiency $\alpha_q$ to be determined was attached was determined. The integration interval of (Expression II) was the same as the integration interval determined in (Expression I). Actual spectrum measurements were typically obtained as digital data separated by a finite bandwidth regarding $\lambda$. Thus, the integrals, i.e., (Expression I) and (Expression II), were determined by the finite sum based on the bandwidth.

Thereby, $\alpha_q = N_{abs}/N = $(Expression II)/(Expression I) was calculated.

The internal quantum efficiency $\eta_i$ was determined as follows. The internal quantum efficiency $\eta_i$ is a value obtained by dividing the number of photons $N_{PL}$ derived from the fluorescence phenomenon by the number of photons $N_{abs}$ absorbed by the phosphor sample.

Here, $N_{PL}$ is proportional to an amount determined by (Expression III) described below. Thus, the value of (Expression III) was determined.

[Ex. 6]

$$\int \lambda \cdot I(\lambda)d\lambda \qquad \text{(Expression III)}$$

When the excitation wavelength was 405 nm, the integration interval was set in the range of 443 nm to 800 nm. When the excitation wavelength was 455 nm, the integration interval was set in the range of 481 nm to 800 nm.

Accordingly, $\eta_i$=(Expression III)/(Expression II) was calculated to determine the internal quantum efficiency $\eta_i$.

Integration of the spectrum obtained as digital data was performed in the same way as in the case where the absorption efficiency $\alpha_q$ was determined.

The external quantum efficiency $\eta_o$ was determined by multiplying the absorption efficiency $\alpha_q$ by the internal quantum efficiency $\eta_i$.

Weight Median Diameter

The weight median diameter was measured with a laser diffraction/scattering particle size distribution analyzer LA-300 manufactured by Horiba, Ltd. with ethanol as a dispersion medium.

Powder X-Ray Diffraction Measurement

Powder X-ray diffraction was precisely measured with a powder X-ray diffractometer X'Pert manufactured by PANalytical. Measurement conditions are as follows.

CuKα tube
X-ray output: 40 kV, 30 mA
Soller slit: 0.04 rad
Divergence slit: Automatically controlled (the width of a sample irradiated with X-ray was fixed to 10 mm)
Detector: Semiconductor array detector X'Celerator, Ni filter
Scan range: 2θ=5° to 155°
Scan step: 0.015°
Counting time: 99.7 second

[Production of Phosphor I]

Examples 1 and 2 and Comparative Examples 1 and 2

$SrCO_3$, $BaCO_3$, $SiO_2$, and $Eu_2O_3$ were weighed in such a manner that the proportion of Sr:Ba:Si:Eu achieves the molar proportion shown in Table 6, and were ground and mixed together with ethanol using an agate mortar. Removal of ethanol by evaporation afforded a material mixture. The resulting material mixture was formed into pellets each having a diameter of 10 mm and reacted on molybdenum foil by heating at a heating temperature (maximum temperature) for a heating time shown in Table 5 in a hydrogen-containing nitrogen atmosphere (hydrogen:nitrogen=3:97 (volume ratio)). Subsequently, the resulting fired product was subjected to grinding treatment to produce a phosphor.

In any case, firing was performed at atmospheric pressure. Also in EXAMPLES AND COMPARATIVE EXAMPLES described below, firing was performed at atmospheric pressure.

TABLE 5

| | Heating condition | |
|---|---|---|
| EXAMPLE | Temperature (° C.) | Time (hr) |
| EXAMPLE 1 | 1450 | 6 |
| EXAMPLE 2 | 1250 | 6 |
| COMPARATIVE EXAMPLE 1 | 1200 | 6 |
| COMPARATIVE EXAMPLE 2 | 1450 | 10 |

Comparative Example 3

A commercially available yellow phosphor $(Y,Gd,Ce)_3Al_5O_{12}$ (Type P46-Y3, manufactured by Kasei Optonix, Ltd.) was used as a phosphor in COMPARATIVE EXAMPLE 3.

Examples 3 to 8

$SrCO_3$, $BaCO_3$, $SiO_2$, and $Eu_2O_3$ were weighed in such a manner that the proportion of Sr:Ba:Si:Eu achieves the molar proportion shown in Table 6, and were ground and mixed together with ethanol using an agate mortar. Removal of ethanol by evaporation afforded a material mixture. The resulting material mixture was formed into pellets each having a diameter of 10 mm and reacted on molybdenum foil by heating at 1,450° C. for 6 hours in a hydrogen-containing nitrogen atmosphere (hydrogen:nitrogen=3:97 (volume ratio)). Subsequently, the resulting fired product was subjected to grinding treatment to produce a phosphor, and the resulting phosphor was evaluated.

Example 9

$SrCO_3$, $BaCO_3$, $SiO_2$, and $Eu_2O_3$ were weighed in such a manner that Sr:Ba:Si:Eu=1.98:1:1:0.02, and sufficiently dry-mixed to afford a material mixture. The resulting material mixture was charged into an alumina crucible with the bottom and side that were overlaid with platinum foil and heated at 1,400° C. for 6 hours in a muffle furnace under a stream of nitrogen gas. The resulting fired product was sufficiently ground, charged into an alumina crucible, and heated at 1,550° C. for 6 hours in a hydrogen-containing nitrogen atmosphere (hydrogen:nitrogen=4:96 (volume ratio)). The resulting fired product was subjected to grinding treatment and passed through a nylon mesh having an aperture of 37 μm to produce a phosphor. The phosphor had a weight median diameter $(D_{50})$ of 19.8 μm.

Example 10

A phosphor was produced as in EXAMPLE 9, except that the material mixture was directly charged into the alumina crucible without platinum foil in the first firing.

Examples 11 to 16 and comparative example 4

$SrCO_3$, $BaCO_3$, $SiO_2$, and $Eu_2O_3$ were weighed in such a manner that the molar proportion shown in Table 6 was achieved, and sufficiently dry-mixed to afford a material mixture. The resulting material mixture was charged into an alumina crucible with the bottom and side that were overlaid with platinum foil and heated at 1,400° C. for 3 hours in a muffle furnace under a stream of nitrogen gas. The resulting fired product was sufficiently ground, charged into an alumina crucible with the bottom and side that were overlaid with platinum foil, and heated at 1,550° C. for 3 hours in a hydrogen-containing nitrogen atmosphere (hydrogen:nitrogen=4:96 (volume ratio)). The resulting fired product was subjected to grinding treatment and passed through a nylon mesh having an aperture of 37 μm to produce a phosphor.

Examples 17 to 19

A phosphor in each of EXAMPLES 17 to 19 was produced as in EXAMPLE 9, except that the composition ratio of the phosphor (Sr/Ba/Eu ratio) was changed to the values shown in Table 6.

Example 20

SrCO$_3$, BaCO$_3$, SiO$_2$, and Eu$_2$O$_3$ were weighed in such a manner that Sr:Ba:Si:Eu=1.98:1:1:0.02, and sufficiently dry-mixed to afford a material mixture. The resulting material mixture was charged into an alumina crucible with the bottom and side that were overlaid with platinum foil and heated at 1,400° C. for 6 hours in a hydrogen-containing nitrogen atmosphere (hydrogen:nitrogen=4:96 (volume ratio)). The resulting fired product was sufficiently ground, charged into an alumina crucible, and heated at 1,550° C. for 6 hours in a hydrogen-containing nitrogen atmosphere (hydrogen:nitrogen=4:96 (volume ratio)). The resulting fired product was subjected to grinding treatment and passed through a nylon mesh having an aperture of 37 μm to produce a phosphor.

Example 21

SrCO$_3$, BaCO$_3$, SiO$_2$, and Eu$_2$O$_3$ were weighed in such a manner that Sr:Ba:Si:Eu=1.98:1:1:0.02, and sufficiently dry-mixed to afford a material mixture. The resulting material mixture was charged into an alumina crucible with the bottom and side that were overlaid with platinum foil and heated at 1,400° C. for 6 hours in a muffle furnace under a stream of nitrogen gas. The resulting fired product was sufficiently ground, charged into an alumina crucible, and heated at 1,550° C. for 6 hours in a hydrogen-containing nitrogen atmosphere (hydrogen:nitrogen=4:96 (volume ratio)). The resulting fired product was subjected to grinding treatment and passed through a nylon mesh having an aperture of 37 μm to produce a phosphor.

Example 22

The phosphor produced in EXAMPLE 21 was added into water that weighs five times as much as the phosphor, sufficiently stirred, and filtrated. After the same operation was performed once again, the phosphor was dried at 120° C. in air.

[Evaluation of Phosphor I-A]
<Emission Properties at 405-nm Excitation and 455-nm Excitation>

The emission peak wavelength, emission peak intensity, full width at half maximum, luminance, color coordinates, emission-intensity maintenance ratio, internal quantum efficiency, external quantum efficiency, absorption efficiency, and weight median diameter (D$_{50}$) of each of the phosphors produced in EXAMPLES 1 to 22 and COMPARATIVE EXAMPLES 2 and 4 when the phosphors were excited by 405-nm light and 455-nm light according to the method described above were measured. Tables 7 and 8 show the results.

Tables 7 and 8 demonstrate that the phosphors produced in EXAMPLES 1 to 22 have high emission-intensity maintenance ratios at high temperatures and excellent temperature characteristics.

The results of EXAMPLES 3 to 8 demonstrated that with respect to the content of Eu serving as an activation element, in the case where the molar amount of Eu (y in Formula [1]) was 0.02 and where the total molar amount of Sr, Ba, and Eu was 3, the maximum emission intensity was obtained. That is, it is understood that the phosphor is preferably produced in such a manner that the amount of Eu is about this value.

The results of EXAMPLES 11 to 19 demonstrated that with respect to the molar ratio of Sr to Ba, in the case where Sr/Ba molar ratio was about 2/1 to 2.2/0.8, the maximum emission peak intensity was obtained. A further decrease in the amount of Ba slightly reduces emission peak intensity. However, the emission peak wavelength shifts to longer wavelengths (the value of x is increased, and the value of y is reduced). In this case, the resulting phosphor has slightly large amount of a red component. The phosphor is suitably used for applications that require a large amount of the red component and high color rendering properties.

As in EXAMPLE 22, washing the phosphor with water can remove impurities attached to the surface of the phosphor and remove fine particles generated by grinding and the like, which is practically preferred.

As in EXAMPLE 20, in the case where firing was performed twice, the first firing may also be performed in a reducing atmosphere (mixed gas of nitrogen and hydrogen) in the same way as in the second firing.

TABLE 6

|  | Composition | | | |
| --- | --- | --- | --- | --- |
|  | Sr | Ba | Si | Eu |
| EXAMPLE 1 | 1.98 | 1 | 1 | 0.02 |
| EXAMPLE 2 | 1.485 | 1.5 | 1 | 0.15 |
| COMPARATIVE EXAMPLE 1 | 0 | 2.97 | 1 | 0.03 |
| COMPARATIVE EXAMPLE 2 | 2.97 | 0 | 1 | 0.03 |
| EXAMPLE 3 | 1.997 | 1 | 1 | 0.003 |
| EXAMPLE 4 | 1.985 | 1 | 1 | 0.015 |
| EXAMPLE 5 | 1.98 | 1 | 1 | 0.02 |
| EXAMPLE 6 | 1.94 | 1 | 1 | 0.06 |
| EXAMPLE 7 | 1.85 | 1 | 1 | 0.15 |
| EXAMPLE 8 | 1.7 | 1 | 1 | 0.3 |
| EXAMPLE 9 | 1.98 | 1 | 1 | 0.02 |
| EXAMPLE 10 | 1.98 | 1 | 1 | 0.02 |
| EXAMPLE 11 | 1.98 | 1 | 1 | 0.02 |
| EXAMPLE 12 | 2.079 | 0.9 | 1 | 0.021 |
| EXAMPLE 13 | 2.178 | 0.8 | 1 | 0.022 |
| EXAMPLE 14 | 2.277 | 0.7 | 1 | 0.023 |
| EXAMPLE 15 | 2.376 | 0.6 | 1 | 0.024 |
| EXAMPLE 16 | 2.475 | 0.5 | 1 | 0.025 |
| COMPARATIVE EXAMPLE 4 | 2.97 | 0 | 1 | 0.03 |
| EXAMPLE 17 | 1.98 | 1 | 1 | 0.02 |
| EXAMPLE 18 | 2.178 | 0.8 | 1 | 0.022 |
| EXAMPLE 19 | 2.475 | 0.5 | 1 | 0.025 |
| EXAMPLE 20 | 1.98 | 1 | 1 | 0.02 |
| EXAMPLE 21 | 1.98 | 1 | 1 | 0.02 |
| EXAMPLE 22 | 1.98 | 1 | 1 | 0.02 |

TABLE 7

| | 455-nm Excitation | | | | | | | | | | | |
| --- | --- | --- | --- | --- | --- | --- | --- | --- | --- | --- | --- | --- |
| | Emission peak wavelength | Relative emission peak intensity | Color coordinates | | Luminance | Full width at half maximum | Emission-intensity maintenance ratio | | | Internal quantum efficiency | External quantum efficiency | Absorption efficiency |
| | | | x | y | | | 100° C. | 125° C. | 150° C. | | | |
| EXAMPLE 1 | 595 | 172 | 0.568 | 0.428 | 100 | 81 | 94 | 90 | 83 | 70.7 | 53.9 | 76.1 |
| EXAMPLE 2 | 592 | 73 | 0.540 | 0.447 | 49 | 89 | 95 | 90 | 82 | 72.8 | 27.3 | 37.5 |

TABLE 7-continued

| | 455-nm Excitation | | | | | | | | | | | |
|---|---|---|---|---|---|---|---|---|---|---|---|---|
| | Emission peak wavelength | Relative emission peak intensity | Color coordinates x | y | Luminance | Full width at half maximum | Emission-intensity maintenance ratio 100° C. | 125° C. | 150° C. | Internal quantum efficiency | External quantum efficiency | Absorption efficiency |
| COMPARATIVE EXAMPLE 2 | 582 | 109 | 0.520 | 0.471 | 71 | 72 | 83 | 70 | 55 | 56.1 | 31.8 | 56.6 |
| EXAMPLE 3 | 592 | 73 | 0.542 | 0.445 | 47 | 84 | 96 | 93 | 88 | 73.3 | 26.3 | 36.0 |
| EXAMPLE 4 | 593 | 128 | 0.557 | 0.437 | 79 | 82 | 94 | 91 | 87 | 71.2 | 43.1 | 60.5 |
| EXAMPLE 5 | 597 | 174 | 0.567 | 0.429 | 101 | 82 | 95 | 92 | 86 | 72.7 | 54.2 | 74.6 |
| EXAMPLE 6 | 597 | 156 | 0.566 | 0.430 | 92 | 83 | 95 | 93 | 86 | 72.4 | 51.1 | 70.6 |
| EXAMPLE 7 | 596 | 144 | 0.562 | 0.433 | 86 | 83 | 93 | 87 | 83 | 71.8 | 47.3 | 65.8 |
| EXAMPLE 8 | 597 | 116 | 0.556 | 0.437 | 72 | 85 | 92 | 89 | 84 | 68.0 | 39.8 | 58.6 |
| EXAMPLE 9 | 597 | 172 | 0.566 | 0.430 | 100 | 81 | 92 | 89 | 84 | 70.4 | 53.5 | 76.0 |
| EXAMPLE 10 | 597 | 100 | 0.562 | 0.432 | 60 | 83 | 89 | 85 | 79 | 48.0 | 32.3 | 67.4 |
| EXAMPLE 11 | 593 | 123 | 0.559 | 0.436 | 75 | 84 | 92 | 91 | 86 | 53.2 | 38.5 | 72.4 |
| EXAMPLE 12 | 595 | 132 | 0.562 | 0.434 | 79 | 83 | 93 | 90 | 85 | 55.1 | 39.8 | 72.3 |
| EXAMPLE 13 | 595 | 145 | 0.567 | 0.429 | 84 | 81 | 91 | 89 | 83 | 59.6 | 43.9 | 73.6 |
| EXAMPLE 14 | 597 | 142 | 0.570 | 0.426 | 81 | 81 | 91 | 85 | 81 | 56.9 | 42.4 | 74.6 |
| EXAMPLE 15 | 598 | 140 | 0.574 | 0.422 | 79 | 81 | 90 | 85 | 75 | 56.7 | 41.7 | 73.6 |
| EXAMPLE 16 | 598 | 139 | 0.578 | 0.418 | 76 | 81 | 89 | 84 | 72 | 56.9 | 41.5 | 73.1 |
| COMPARATIVE EXAMPLE 4 | 581 | 106 | 0.518 | 0.474 | 70 | 71 | 83 | 74 | 58 | 47.9 | 29.0 | 60.5 |
| EXAMPLE 17 | 595 | 179 | 0.567 | 0.429 | 104 | 82 | 95 | 91 | 84 | 71.9 | 55.3 | 76.9 |
| EXAMPLE 18 | 597 | 188 | 0.572 | 0.425 | 106 | 80 | 94 | 89 | 83 | 71.4 | 55.6 | 77.9 |
| EXAMPLE 19 | 601 | 177 | 0.583 | 0.414 | 94 | 79 | 89 | 86 | 75 | 70.6 | 53.7 | 76.1 |
| EXAMPLE 20 | 594 | 161 | 0.562 | 0.433 | 96 | 81 | 94 | 91 | 88 | 69.4 | 50.5 | 72.7 |
| EXAMPLE 21 | 595 | 157 | 0.563 | 0.432 | 93 | 82 | 94 | 92 | 87 | 69.6 | 49.9 | 71.8 |
| EXAMPLE 22 | 596 | 170 | 0.565 | 0.431 | 100 | 81 | 94 | 92 | 85 | 71.8 | 54.0 | 75.2 |

TABLE 8

| | 405-nm Excitation | | | | | | | | | | | | |
|---|---|---|---|---|---|---|---|---|---|---|---|---|---|
| | Emission peak wavelength | Relative emission peak intensity | Color coordinates x | y | Luminance | Full width at half maximum | Emission-intensity maintenance ratio 100° C. | 125° C. | 150° C. | Internal quantum efficiency | External quantum efficiency | Absorption efficiency | Weight median diameter $D_{50}$ |
| EXAMPLE 1 | 595 | 165 | 0.563 | 0.427 | 96 | 81 | 94 | 91 | 86 | 58.8 | 55.8 | 95.0 | 16.7 |
| EXAMPLE 2 | 592 | 81 | 0.532 | 0.436 | 54 | 89 | 94 | 91 | 86 | 36.2 | 31.1 | 85.9 | 12.1 |
| COMPARATIVE EXAMPLE 2 | 582 | 116 | 0.517 | 0.463 | 75 | 72 | 82 | 72 | 56 | 38.6 | 35.2 | 91.1 | 11.4 |
| EXAMPLE 3 | 592 | 77 | 0.534 | 0.431 | 49 | 83 | 94 | 92 | 90 | 33.5 | 28.4 | 84.8 | 19.0 |
| EXAMPLE 4 | 595 | 129 | 0.552 | 0.432 | 79 | 83 | 96 | 94 | 87 | 50.9 | 46.5 | 91.4 | 17.5 |
| EXAMPLE 5 | 596 | 167 | 0.563 | 0.427 | 98 | 81 | 93 | 90 | 85 | 60.0 | 56.9 | 94.8 | 17.6 |
| EXAMPLE 6 | 597 | 152 | 0.562 | 0.426 | 90 | 83 | 94 | 92 | 88 | 56.6 | 53.1 | 93.8 | 17.7 |
| EXAMPLE 7 | 597 | 144 | 0.558 | 0.429 | 86 | 84 | 95 | 90 | 87 | 53.6 | 49.8 | 92.8 | 17.6 |
| EXAMPLE 8 | 595 | 119 | 0.543 | 0.436 | 76 | 86 | 95 | 92 | 87 | 48.1 | 43.9 | 91.1 | 17.5 |
| EXAMPLE 9 | 597 | 165 | 0.562 | 0.428 | 97 | 82 | 94 | 91 | 87 | 58.2 | 55.3 | 95.2 | 19.8 |
| EXAMPLE 10 | 596 | 97 | 0.556 | 0.428 | 58 | 82 | 91 | 87 | 80 | 35.5 | 33.1 | 93.5 | 19.0 |
| EXAMPLE 11 | 592 | 123 | 0.554 | 0.433 | 75 | 83 | 95 | 93 | 89 | 42.7 | 40.3 | 94.4 | 20.4 |
| EXAMPLE 12 | 592 | 130 | 0.558 | 0.430 | 78 | 83 | 95 | 92 | 88 | 44.6 | 42.1 | 94.2 | 19.8 |
| EXAMPLE 13 | 595 | 140 | 0.564 | 0.426 | 82 | 81 | 94 | 92 | 86 | 48.0 | 45.5 | 94.7 | 19.3 |
| EXAMPLE 14 | 597 | 136 | 0.567 | 0.422 | 77 | 81 | 94 | 91 | 85 | 46.9 | 44.4 | 94.7 | 22.3 |
| EXAMPLE 15 | 597 | 134 | 0.571 | 0.418 | 75 | 81 | 92 | 88 | 82 | 45.5 | 42.9 | 94.4 | 22.1 |
| EXAMPLE 16 | 597 | 132 | 0.575 | 0.413 | 72 | 81 | 93 | 86 | 78 | 45.6 | 43.1 | 94.5 | 24.2 |
| COMPARATIVE EXAMPLE 4 | 580 | 116 | 0.515 | 0.467 | 76 | 72 | 85 | 75 | 62 | 36.7 | 33.8 | 92.0 | 15.4 |
| EXAMPLE 17 | 595 | 173 | 0.564 | 0.428 | 101 | 81 | 92 | 87 | 85 | 60.4 | 57.6 | 95.3 | 21.2 |
| EXAMPLE 18 | 597 | 179 | 0.570 | 0.422 | 101 | 80 | 94 | 89 | 84 | 59.0 | 56.4 | 95.6 | 19.8 |
| EXAMPLE 19 | 600 | 165 | 0.580 | 0.411 | 88 | 80 | 94 | 89 | 79 | 56.8 | 53.9 | 94.9 | 18.9 |
| EXAMPLE 20 | 596 | 156 | 0.558 | 0.431 | 94 | 82 | 95 | 93 | 89 | 55.5 | 52.4 | 94.5 | 25.1 |
| EXAMPLE 21 | 594 | 152 | 0.559 | 0.429 | 90 | 81 | 94 | 93 | 85 | 55.4 | 52.3 | 94.4 | 22.2 |
| EXAMPLE 22 | 595 | 164 | 0.561 | 0.429 | 97 | 81 | 94 | 93 | 88 | 59.0 | 56.1 | 95.1 | 22.5 |

[Evaluation of Phosphor I-B]
Powder X-ray Diffraction Pattern

Figure 4A:
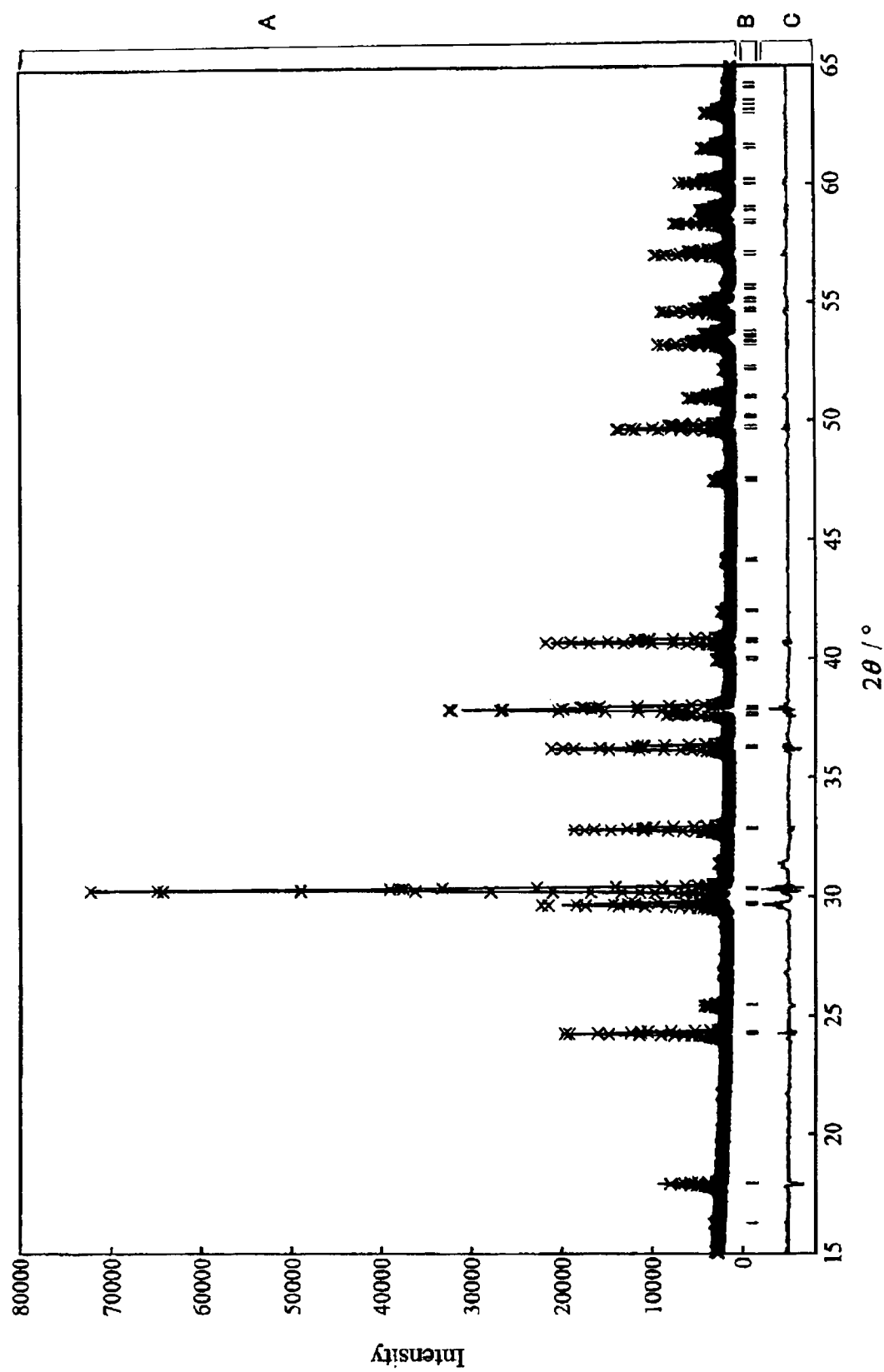
FIG. 4a shows a powder X-ray diffraction pattern (X-ray source: CuKα) of a phosphor in Example 1 and the result of pattern fitting by the Rietveld method.
Figure 4B:
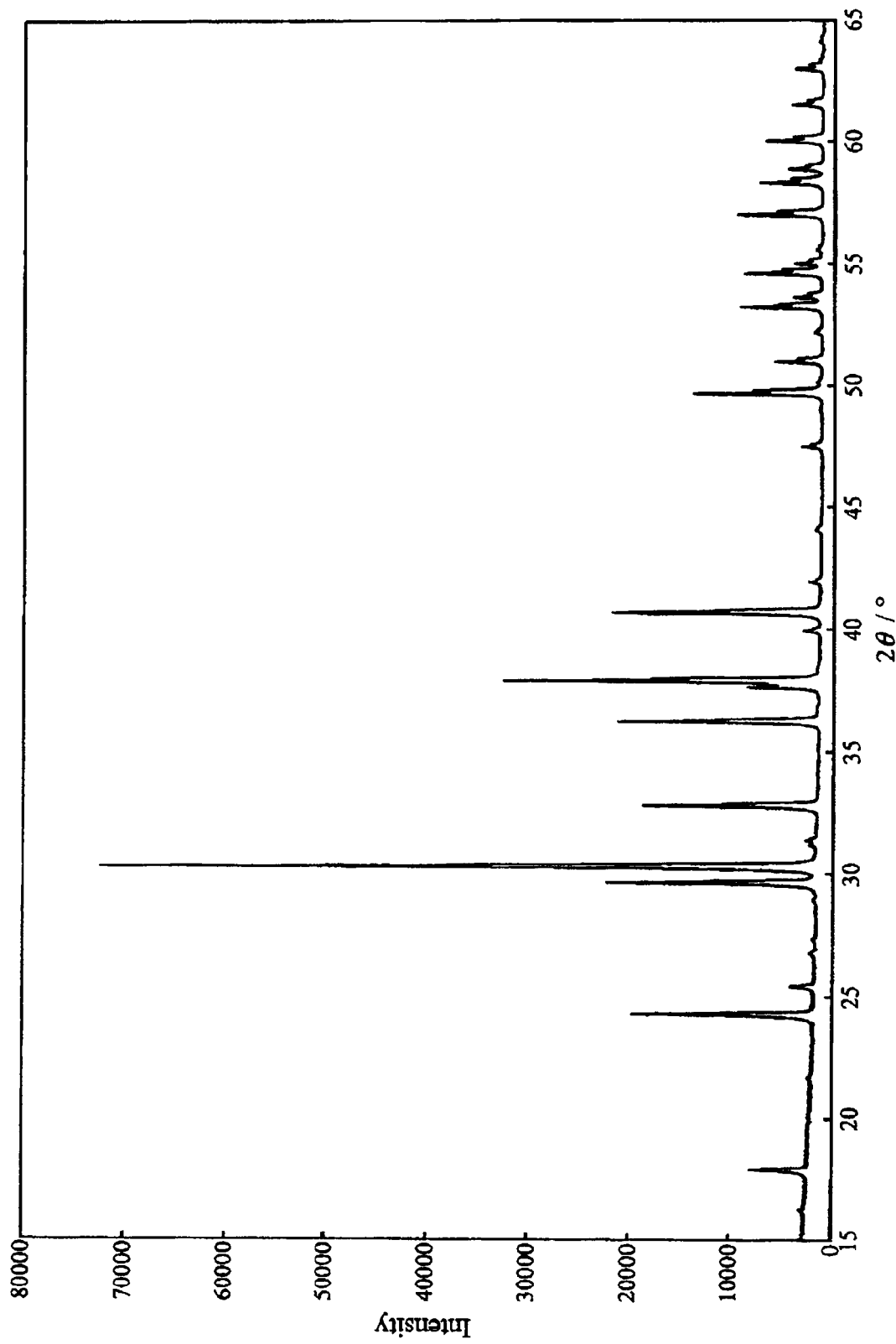
FIG. 4b is a graph drawn by connecting the data observed in the phosphor shown in FIG. 4a with a solid line.

FIG. 4a shows the measurement result of the phosphor produced in EXAMPLE 1 together with the analytical result by the Rietveld method. In this figure, in the top region (A in FIG. 4a), the measured values (x) of the diffraction intensity of the phosphor are superposed on the diffraction intensity data (solid line) determined by pattern fitting. The longitudinal lines in the middle region (B in FIG. 4a) indicate positions where the diffraction peaks are present from the results of pattern fitting. The curve in the bottom region (C in FIG. 4a) indicates the difference between the measured values of the diffraction intensity of the phosphor and the results of pattern fitting. FIG. 4b is a graph drawn by connecting the measured values of the diffraction intensity of the phosphor with a solid line.

In the Rietveld analysis, pattern fitting was performed on the assumption that the space group of the phosphor produced in EXAMPLE 1 is I4/mcm (No. 140). Pattern fitting (not shown) could be performed with the same accuracy even on the assumption that the space group of the phosphor produced in EXAMPLE 1 is P4/ncc (No. 130). Thus, the phosphor produced in EXAMPLE 1 is believed to belong to the space group I4/mcm (No. 140) or the space group P4/ncc (No. 130).

Tables 9a to 9e each show the Miller indices of each diffraction peak obtained by pattern fitting, diffraction angles (2θ), interplanar spacing, measured intensity, and calculated intensity. In the measured data of the diffraction intensity of the phosphor, a peak of an impurity phase not resulting from the crystal of the phosphor produced in EXAMPLE 1 was determined. This is not shown in the tables. Let the lattice constants of the a-axis, b-axis, and c-axis of a tetragonal system be a, b, and c, respectively. Let the Miller indices be (hkl). The calculated values were determined from Formula [8] described below. Tables 9a to 9e show that each of the measured values and a corresponding one of the calculated values of the diffraction intensity agree substantially with each other.

$$2\theta = 2\sin^{-1}[0.5\lambda(h^2/a^2 + k^2/b^2 + l^2/c^2)^{0.5}] \quad [8]$$

wherein λ is 1.54056 Å, which is the wavelength of the CuKα line used as an X-ray source.

Table 10 summarizes the crystal structure parameters, such as lattice constants and atomic coordinates, obtained by pattern fitting.

TABLE 9a

| Peak No. | Miller indices | | | 2θ ° | Lattice spacing Å | Measured intensity Arbitrary unit | Calculated intensity Arbitrary unit |
|---|---|---|---|---|---|---|---|
| | h | k | l | | | | |
| 1 | 0 | 0 | 2 | 16.226 | 5.45831 | 2158 | 309 |
| 2 | 1 | 1 | 0 | 17.877 | 4.95771 | 8181 | 8519 |
| 3 | 1 | 1 | 2 | 24.233 | 3.66988 | 21003 | 23264 |
| 4 | 2 | 0 | 0 | 25.386 | 3.50563 | 3548 | 3851 |
| 5 | 2 | 1 | 1 | 29.618 | 3.01368 | 26081 | 25568 |
| 6 | 2 | 0 | 2 | 30.276 | 2.94967 | 100000 | 97596 |
| 7 | 0 | 0 | 4 | 32.789 | 2.72916 | 26404 | 26497 |
| 8 | 2 | 2 | 0 | 36.208 | 2.47886 | 29910 | 30496 |
| 9 | 1 | 1 | 4 | 37.59 | 2.39084 | 10039 | 9964 |
| 10 | 2 | 1 | 3 | 37.845 | 2.37534 | 48161 | 47236 |
| 11 | 2 | 2 | 2 | 39.911 | 2.25701 | 2612 | 2566 |
| 12 | 3 | 1 | 0 | 40.66 | 2.21716 | 32694 | 32492 |
| 13 | 2 | 0 | 4 | 41.917 | 2.15351 | 1835 | 1805 |
| 14 | 3 | 1 | 2 | 44.048 | 2.05416 | 1552 | 1164 |
| 15 | 3 | 2 | 1 | 47.452 | 1.91444 | 3609 | 3527 |
| 16 | 2 | 2 | 4 | 49.643 | 1.83494 | 23095 | 22723 |
| 17 | 0 | 0 | 6 | 50.095 | 1.81944 | 830 | 804 |

TABLE 9a-continued

| Peak No. | Miller indices | | | 2θ ° | Lattice spacing Å | Measured intensity Arbitrary unit | Calculated intensity Arbitrary unit |
|---|---|---|---|---|---|---|---|
| | h | k | l | | | | |
| 18 | 2 | 1 | 5 | 50.924 | 1.79174 | 8021 | 7765 |
| 19 | 4 | 0 | 0 | 52.139 | 1.75282 | 1536 | 1496 |
| 20 | 3 | 1 | 4 | 53.183 | 1.72085 | 14971 | 15162 |
| 21 | 3 | 2 | 3 | 53.377 | 1.71505 | 13 | 13 |
| 22 | 1 | 1 | 6 | 53.613 | 1.70805 | 5474 | 5466 |
| 23 | 4 | 1 | 1 | 54.574 | 1.68022 | 14722 | 14519 |
| 24 | 4 | 0 | 2 | 54.976 | 1.66888 | 5178 | 5050 |
| 25 | 3 | 3 | 0 | 55.565 | 1.65257 | 967 | 938 |
| 26 | 2 | 0 | 6 | 56.979 | 1.61489 | 16590 | 16105 |
| 27 | 3 | 3 | 2 | 58.289 | 1.58167 | 12259 | 12218 |
| 28 | 4 | 2 | 0 | 58.857 | 1.56777 | 7151 | 7153 |
| 29 | 4 | 1 | 3 | 60.001 | 1.54057 | 10961 | 11167 |
| 30 | 4 | 2 | 2 | 61.488 | 1.50684 | 6601 | 6709 |
| 31 | 4 | 0 | 4 | 62.972 | 1.47483 | 5566 | 5734 |
| 32 | 2 | 2 | 6 | 63.36 | 1.46675 | 645 | 680 |
| 33 | 3 | 2 | 5 | 64.073 | 1.45212 | 855 | 880 |

TABLE 9b

| Peak No. | Miller indices | | | 2θ ° | Lattice spacing Å | Measured intensity Arbitrary unit | Calculated intensity Arbitrary unit |
|---|---|---|---|---|---|---|---|
| | h | k | l | | | | |
| 34 | 3 | 3 | 4 | 66.038 | 1.41361 | 278 | 299 |
| 35 | 3 | 1 | 6 | 66.415 | 1.40649 | 175 | 188 |
| 36 | 2 | 1 | 7 | 66.961 | 1.39634 | 2444 | 2622 |
| 37 | 4 | 3 | 1 | 67.262 | 1.39083 | 927 | 965 |
| 38 | 5 | 1 | 0 | 68.14 | 1.37502 | 572 | 593 |
| 39 | 0 | 0 | 8 | 68.734 | 1.36458 | 3460 | 3629 |
| 40 | 4 | 2 | 4 | 69.031 | 1.35943 | 7776 | 8175 |
| 41 | 4 | 1 | 5 | 70.083 | 1.34158 | 6499 | 6731 |
| 42 | 5 | 1 | 2 | 70.579 | 1.33336 | 5914 | 6139 |
| 43 | 1 | 1 | 8 | 71.675 | 1.31565 | 722 | 728 |
| 44 | 4 | 3 | 3 | 72.13 | 1.30846 | 751 | 715 |
| 45 | 5 | 2 | 1 | 73.145 | 1.2928 | 647 | 511 |
| 46 | 2 | 0 | 8 | 74.566 | 1.27164 | 222 | 206 |
| 47 | 4 | 0 | 6 | 75.211 | 1.26232 | 4487 | 4144 |
| 48 | 4 | 4 | 0 | 76.851 | 1.23943 | 2180 | 2123 |
| 49 | 5 | 1 | 4 | 77.701 | 1.22797 | 223 | 215 |
| 50 | 5 | 2 | 3 | 77.86 | 1.22586 | 1850 | 1802 |
| 51 | 3 | 3 | 6 | 78.055 | 1.22329 | 6772 | 6619 |
| 52 | 3 | 2 | 7 | 78.567 | 1.2166 | 743 | 729 |
| 53 | 4 | 4 | 2 | 79.184 | 1.20866 | 2335 | 2302 |
| 54 | 5 | 3 | 0 | 79.676 | 1.20242 | 4905 | 4853 |
| 55 | 2 | 2 | 8 | 80.237 | 1.19542 | 3007 | 2944 |
| 56 | 4 | 2 | 6 | 80.869 | 1.18767 | 2884 | 2867 |
| 57 | 4 | 3 | 5 | 81.516 | 1.17987 | 558 | 552 |
| 58 | 5 | 3 | 2 | 81.988 | 1.17427 | 1112 | 1086 |
| 59 | 6 | 0 | 0 | 82.477 | 1.16854 | 4000 | 3957 |
| 60 | 3 | 1 | 8 | 83.034 | 1.16211 | 4434 | 4382 |
| 61 | 4 | 1 | 7 | 84.165 | 1.14935 | 4126 | 4101 |
| 62 | 6 | 1 | 1 | 84.443 | 1.14627 | 2112 | 2081 |
| 63 | 6 | 0 | 2 | 84.773 | 1.14265 | 35 | 33 |
| 64 | 2 | 1 | 9 | 85.831 | 1.13126 | 3404 | 3191 |
| 65 | 4 | 4 | 4 | 86.091 | 1.1285 | 1487 | 1379 |
| 66 | 5 | 2 | 5 | 87.079 | 1.11823 | 482 | 465 |

TABLE 9c

| Peak No. | Miller indices | | | 2θ ° | Lattice spacing Å | Measured intensity Arbitrary unit | Calculated intensity Arbitrary unit |
|---|---|---|---|---|---|---|---|
| | h | k | l | | | | |
| 67 | 6 | 2 | 0 | 88.031 | 1.10858 | 289 | 289 |
| 68 | 5 | 3 | 4 | 88.861 | 1.10036 | 9513 | 9766 |

TABLE 9c-continued

| Peak No. | Miller indices h | k | l | 2θ ° | Lattice spacing Å | Measured intensity Arbitrary unit | Calculated intensity Arbitrary unit |
|---|---|---|---|---|---|---|---|
| 69 | 6 | 1 | 3 | 89.016 | 1.09884 | 707 | 728 |
| 70 | 5 | 1 | 6 | 89.206 | 1.09699 | 2224 | 2291 |
| 71 | 0 | 0 | 10 | 89.759 | 1.09166 | 7 | 7 |
| 72 | 5 | 4 | 1 | 89.985 | 1.08951 | 1005 | 1057 |
| 73 | 6 | 2 | 2 | 90.313 | 1.0864 | 7330 | 7737 |
| 74 | 4 | 0 | 8 | 91.35 | 1.07675 | 1310 | 1401 |
| 75 | 6 | 0 | 4 | 91.627 | 1.07422 | 5596 | 5980 |
| 76 | 1 | 1 | 10 | 92.526 | 1.06612 | 549 | 585 |
| 77 | 3 | 3 | 8 | 94.12 | 1.05222 | 260 | 271 |
| 78 | 5 | 4 | 3 | 94.554 | 1.04853 | 1013 | 1022 |
| 79 | 4 | 3 | 7 | 95.248 | 1.04272 | 411 | 413 |
| 80 | 2 | 0 | 10 | 95.299 | 1.0423 | 3984 | 4011 |
| 81 | 6 | 3 | 1 | 95.526 | 1.04042 | 52 | 52 |
| 82 | 4 | 2 | 8 | 96.899 | 1.02929 | 3208 | 3322 |
| 83 | 3 | 2 | 9 | 96.917 | 1.02916 | 40 | 41 |
| 84 | 6 | 2 | 4 | 97.179 | 1.02708 | 431 | 444 |
| 85 | 4 | 4 | 6 | 97.527 | 1.02434 | 600 | 623 |
| 86 | 6 | 1 | 5 | 98.173 | 1.01932 | 1331 | 1382 |
| 87 | 6 | 3 | 3 | 100.135 | 1.00456 | 368 | 421 |
| 88 | 5 | 3 | 6 | 100.328 | 1.00315 | 345 | 395 |
| 89 | 5 | 2 | 7 | 100.838 | 0.99945 | 203 | 230 |
| 90 | 2 | 2 | 10 | 100.89 | 0.99907 | 169 | 191 |
| 91 | 7 | 1 | 0 | 101.949 | 0.99154 | 488 | 527 |
| 92 | 5 | 5 | 0 | 101.949 | 0.99154 | 110 | 118 |
| 93 | 4 | 1 | 9 | 102.532 | 0.98748 | 2873 | 3085 |
| 94 | 6 | 0 | 6 | 103.153 | 0.98322 | 33 | 35 |
| 95 | 3 | 1 | 10 | 103.721 | 0.97938 | 115 | 122 |
| 96 | 5 | 4 | 5 | 103.811 | 0.97878 | 829 | 881 |
| 97 | 5 | 5 | 2 | 104.293 | 0.97558 | 2412 | 2557 |
| 98 | 7 | 1 | 2 | 104.293 | 0.97558 | 376 | 399 |
| 99 | 6 | 4 | 0 | 104.793 | 0.97229 | 1016 | 1076 |

TABLE 9d

| Peak No. | Miller indices h | k | l | 2θ ° | Lattice spacing Å | Measured intensity Arbitrary unit | Calculated intensity Arbitrary unit |
|---|---|---|---|---|---|---|---|
| 100 | 5 | 1 | 8 | 105.365 | 0.96857 | 137 | 144 |
| 101 | 7 | 2 | 1 | 106.824 | 0.95935 | 2228 | 2336 |
| 102 | 6 | 4 | 2 | 107.167 | 0.95722 | 2401 | 2514 |
| 103 | 6 | 2 | 6 | 108.912 | 0.94669 | 5982 | 6036 |
| 104 | 2 | 1 | 11 | 109.003 | 0.94616 | 1571 | 1582 |
| 105 | 6 | 3 | 5 | 109.59 | 0.94273 | 83 | 82 |
| 106 | 5 | 5 | 4 | 111.492 | 0.93194 | 103 | 96 |
| 107 | 7 | 1 | 4 | 111.492 | 0.93194 | 1860 | 1724 |
| 108 | 7 | 2 | 3 | 111.659 | 0.93102 | 1442 | 1311 |
| 109 | 6 | 1 | 7 | 112.405 | 0.92694 | 1731 | 1552 |
| 110 | 4 | 0 | 10 | 112.461 | 0.92664 | 914 | 821 |
| 111 | 7 | 3 | 0 | 113.589 | 0.92062 | 369 | 337 |
| 112 | 4 | 4 | 8 | 114.193 | 0.91747 | 1262 | 1173 |
| 113 | 4 | 3 | 9 | 114.212 | 0.91737 | 366 | 341 |
| 114 | 6 | 4 | 4 | 114.497 | 0.9159 | 2314 | 2155 |
| 115 | 3 | 3 | 10 | 115.488 | 0.91087 | 2960 | 2763 |
| 116 | 0 | 0 | 12 | 115.718 | 0.90972 | 1858 | 1736 |
| 117 | 7 | 3 | 2 | 116.104 | 0.9078 | 1933 | 1806 |
| 118 | 5 | 3 | 8 | 117.264 | 0.90215 | 7095 | 6767 |
| 119 | 5 | 4 | 7 | 118.536 | 0.89614 | 885 | 863 |
| 120 | 4 | 2 | 10 | 118.595 | 0.89587 | 1725 | 1680 |
| 121 | 1 | 1 | 12 | 118.831 | 0.89478 | 157 | 153 |
| 122 | 6 | 5 | 1 | 118.852 | 0.89468 | 541 | 527 |
| 123 | 6 | 0 | 8 | 120.423 | 0.88758 | 5025 | 4861 |
| 124 | 5 | 2 | 9 | 120.443 | 0.88749 | 946 | 914 |
| 125 | 3 | 2 | 11 | 121.248 | 0.88396 | 212 | 208 |
| 126 | 7 | 2 | 5 | 121.898 | 0.88115 | 2195 | 2211 |
| 127 | 2 | 0 | 12 | 122.04 | 0.88055 | 54 | 55 |
| 128 | 8 | 0 | 0 | 123.026 | 0.87641 | 9 | 9 |
| 129 | 7 | 3 | 4 | 124.021 | 0.87233 | 250 | 256 |
| 130 | 6 | 5 | 3 | 124.209 | 0.87157 | 89 | 91 |

TABLE 9d-continued

| Peak No. | Miller indices h | k | l | 2θ ° | Lattice spacing Å | Measured intensity Arbitrary unit | Calculated intensity Arbitrary unit |
|---|---|---|---|---|---|---|---|
| 131 | 5 | 5 | 6 | 124.439 | 0.87065 | 3070 | 3134 |
| 132 | 7 | 1 | 6 | 124.439 | 0.87065 | 754 | 769 |

TABLE 9e

| Peak No. | Miller indices h | k | l | 2θ ° | Lattice spacing Å | Measured intensity Arbitrary unit | Calculated intensity Arbitrary unit |
|---|---|---|---|---|---|---|---|
| 133 | 6 | 3 | 7 | 125.049 | 0.86822 | 34 | 35 |
| 133 | 6 | 3 | 7 | 125.049 | 0.86822 | 34 | 35 |
| 134 | 7 | 4 | 1 | 125.388 | 0.86689 | 3773 | 3819 |
| 135 | 8 | 1 | 1 | 125.388 | 0.86689 | 108 | 109 |
| 136 | 8 | 0 | 2 | 125.792 | 0.86532 | 6339 | 6434 |
| 137 | 6 | 2 | 8 | 127.081 | 0.86043 | 314 | 326 |
| 138 | 6 | 4 | 6 | 127.866 | 0.85752 | 2620 | 2718 |
| 139 | 4 | 1 | 11 | 127.974 | 0.85713 | 3155 | 3275 |
| 140 | 5 | 1 | 10 | 128.569 | 0.85497 | 2769 | 2885 |
| 141 | 2 | 2 | 12 | 128.834 | 0.85402 | 2988 | 3120 |
| 142 | 8 | 2 | 0 | 129.91 | 0.85024 | 4342 | 4518 |
| 143 | 8 | 1 | 3 | 131.207 | 0.84582 | 146 | 150 |
| 144 | 7 | 4 | 3 | 131.207 | 0.84582 | 3891 | 4021 |
| 145 | 3 | 1 | 12 | 132.481 | 0.84163 | 3776 | 3898 |
| 146 | 8 | 2 | 2 | 132.954 | 0.84011 | 75 | 78 |
| 147 | 6 | 1 | 9 | 134.411 | 0.83555 | 780 | 804 |
| 148 | 8 | 0 | 4 | 134.777 | 0.83444 | 255 | 261 |
| 149 | 6 | 5 | 5 | 136.182 | 0.83026 | 540 | 523 |
| 150 | 6 | 6 | 0 | 137.574 | 0.82629 | 2589 | 2481 |
| 151 | 7 | 3 | 6 | 139.346 | 0.82145 | 1488 | 1443 |
| 152 | 7 | 2 | 7 | 140.121 | 0.81942 | 3375 | 3273 |
| 153 | 4 | 4 | 10 | 140.202 | 0.81921 | 1850 | 1793 |
| 154 | 8 | 3 | 1 | 140.556 | 0.8183 | 24 | 23 |
| 155 | 6 | 6 | 2 | 141.076 | 0.81698 | 53 | 50 |
| 156 | 7 | 5 | 0 | 141.853 | 0.81504 | 1696 | 1623 |
| 157 | 5 | 4 | 9 | 142.785 | 0.81278 | 1330 | 1281 |
| 158 | 8 | 2 | 4 | 143.217 | 0.81176 | 11781 | 11393 |
| 159 | 2 | 1 | 13 | 143.475 | 0.81115 | 1673 | 1621 |
| 160 | 4 | 3 | 11 | 143.943 | 0.81007 | 542 | 529 |
| 161 | 5 | 3 | 10 | 144.744 | 0.80825 | 1488 | 1471 |
| 162 | 7 | 4 | 5 | 144.896 | 0.80791 | 5397 | 5345 |
| 163 | 8 | 1 | 5 | 144.896 | 0.80791 | 162 | 160 |
| 164 | 4 | 0 | 12 | 145.104 | 0.80745 | 809 | 800 |
| 165 | 7 | 5 | 2 | 145.716 | 0.80611 | 467 | 460 |

TABLE 10

Chemical formula: $Sr_2BaSiO_5$
Crystal system: Tetragonal system
Space group: I4/mcm
Space group No.: 140

Lattice constant

| a (Å) | b (Å) | c (Å) | α (°) | β (°) | γ (°) |
|---|---|---|---|---|---|
| 7.01126 | 7.01126 | 10.91660 | 90 | 90 | 90 |

Atomic coordinate

| Site | x | y | z |
|---|---|---|---|
| Sr | 8h | 0.18373 | 0.31627 | 0.25 |
| Ba | 4a | 0 | 0 | −0.25000 |
| Si | 4b | 0 | 0.50000 | −0.25000 |
| O1 | 16l | 0.12712 | 0.37288 | 0.65956 |
| O2 | 4c | 0 | 0 | 0 |

<Emission Properties at 400-nm Excitation and 460-nm Excitation I>

The emission properties of the phosphors produced in EXAMPLES 1 and 2 (and EXAMPLE 23 described below) and COMPARATIVE EXAMPLES 1 and 2 were measured at 400-nm excitation and 460-nm excitation.

Figure 5:
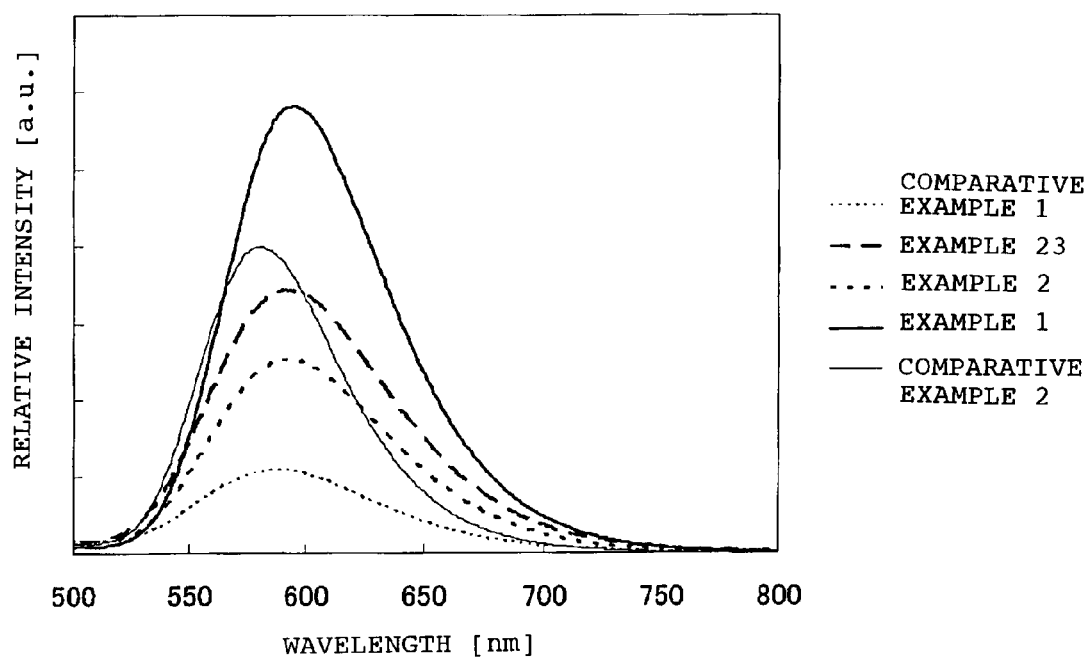
FIG. 5 shows the emission spectra (excitation light wavelength: 460 nm) of phosphors in EXAMPLES 1, 2, and 23 and COMPARATIVE EXAMPLES 1 and 2.
Figure 6:
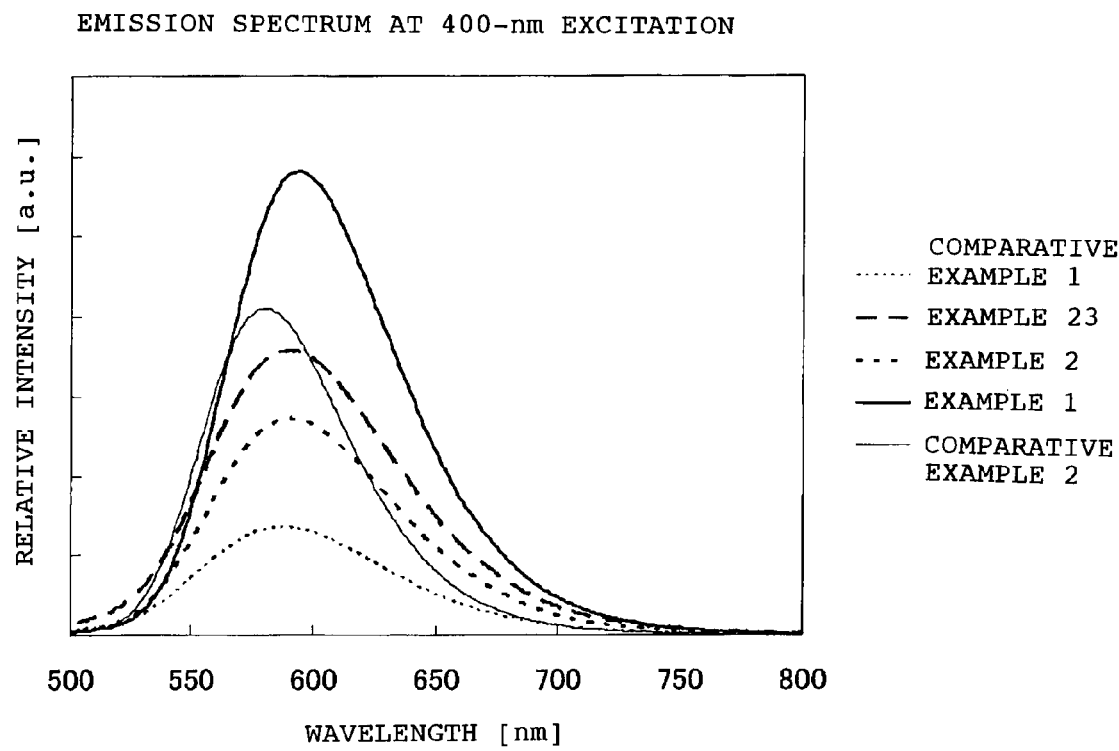
FIG. 6 shows the emission spectra (excitation light wavelength: 400 nm) of the phosphors in EXAMPLES 1, 2, and 23 and COMPARATIVE EXAMPLES 1 and 2.

FIGS. 5 (460-nm excitation) and 6 (400-nm excitation) show the emission spectra of EXAMPLES 1 and 2 (and EXAMPLE 23 described below) and COMPARATIVE EXAMPLES 1 and 2.

Tables 11 and 12 summarize the emission peak wavelength, relative emission peak intensity, color coordinates, and relative luminance of the phosphors produced in EXAMPLES 1 and 2 (and EXAMPLE 23 described below) and COMPARATIVE EXAMPLES 1 and 2.

Table 11 shows the relative emission peak intensity and relative luminance calculated from the emission spectrum when the phosphors are excited by light having a peak wavelength of 460 nm. The relative emission peak intensity and relative luminance are relative values determined with reference to the emission peak intensity and luminance of the phosphor, produced in COMPARATIVE EXAMPLE 3, excited by light having a wavelength of 460 nm, the emission peak intensity and luminance being defined as 102.

Table 12 shows the relative emission peak intensity and relative luminance calculated from the emission spectrum when the phosphors are excited by light having a peak wavelength of 400 nm. The relative peak intensity and relative luminance are relative values determined with reference to the emission peak intensity and luminance of the phosphor, produced in COMPARATIVE EXAMPLE 3, excited by light having a wavelength of 460 nm, the emission peak intensity and luminance being defined as 100.

These measurement results demonstrate that the phosphor having a composition of $Sr_{1.98}BaEu_{0.02}SiO_5$ (EXAMPLE 1) has the highest emission intensity.

TABLE 11

Table showing emission properties at 460-nm excitation

| | Emission peak wavelength (nm) | Relative emission peak intensity (%) | Color coordinates x | Color coordinates y | Relative luminance (%) |
|---|---|---|---|---|---|
| COMPARATIVE EXAMPLE 1 | 585 | 28 | 0.505 | 0.464 | 21 |
| EXAMPLE 23 | 591 | 90 | 0.540 | 0.450 | 61 |
| EXAMPLE 2 | 592 | 66 | 0.537 | 0.449 | 45 |
| EXAMPLE 1 | 595 | 152 | 0.563 | 0.433 | 89 |
| COMPARATIVE EXAMPLE 2 | 581 | 104 | 0.516 | 0.475 | 68 |
| COMPARATIVE EXAMPLE 3 | 561 | 102 | 0.446 | 0.531 | 102 |

TABLE 12

Table showing emission properties at 400-nm excitation

| | Emission peak wavelength (nm) | Relative emission peak intensity (%) | Color coordinates x | Color coordinates y | Relative luminance (%) |
|---|---|---|---|---|---|
| COMPARATIVE EXAMPLE 1 | 590 | 35 | 0.503 | 0.441 | 25 |
| EXAMPLE 23 | 591 | 92 | 0.527 | 0.451 | 64 |
| EXAMPLE 2 | 590 | 70 | 0.531 | 0.442 | 47 |
| EXAMPLE 1 | 594 | 148 | 0.560 | 0.432 | 88 |
| COMPARATIVE EXAMPLE 2 | 580 | 105 | 0.514 | 0.469 | 68 |
| COMPARATIVE EXAMPLE 3 | 553 | 4 | 0.397 | 0.436 | 4 |
| COMPARATIVE EXAMPLE 3* | 561 | 100 | 0.446 | 0.531 | 100 |

COMPARATIVE EXAMPLE 3* represents the case where the phosphor produced in COMPARATIVE EXAMPLE 3 is excited by 460-nm light.

<Emission Properties at 400-nm Excitation and 460-nm Excitation II>

The emission peak wavelength, relative emission peak intensity, color coordinates, and relative luminance of the phosphors produced in EXAMPLES 3 to 8 were measured. Tables 13 and 14 show the results.

Table 13 shows the relative emission peak intensity and relative luminance calculated from the emission spectrum when the phosphors are excited by light having a peak wavelength of 460 nm. The relative peak intensity and relative luminance are relative values determined with reference to the simultaneously-measured emission peak intensity and luminance of the phosphor, produced in COMPARATIVE EXAMPLE 3, excited by light having a wavelength of 460 nm, the emission peak intensity and luminance being defined as 100.

Table 14 shows the relative emission peak intensity and relative luminance calculated from the emission spectrum when the phosphors are excited by light having a peak wavelength of 400 nm. The relative peak intensity and relative luminance are relative values determined with reference to the emission peak intensity and luminance of the phosphor, produced in COMPARATIVE EXAMPLE 3, excited by light having a wavelength of 460 nm, the emission peak intensity and luminance being defined as 100.

TABLE 13

Table showing emission properties at 460-nm excitation

| | Amount of Eu y(mol) | Emission peak wavelength (nm) | Relative emission peak intensity (%) | Color coordinates x | Color coordinates y | Relative luminance (%) |
|---|---|---|---|---|---|---|
| COMPARATIVE EXAMPLE 3 | | 556 | 100 | 0.448 | 0.530 | 100 |
| EXAMPLE 3 | 0.003 | 591 | 67 | 0.541 | 0.446 | 43 |
| EXAMPLE 4 | 0.015 | 593 | 117 | 0.555 | 0.438 | 72 |
| EXAMPLE 5 | 0.02 | 594 | 162 | 0.566 | 0.430 | 94 |
| EXAMPLE 6 | 0.06 | 596 | 144 | 0.564 | 0.431 | 85 |
| EXAMPLE 7 | 0.15 | 597 | 129 | 0.561 | 0.433 | 78 |
| EXAMPLE 8 | 0.3 | 597 | 97 | 0.557 | 0.436 | 60 |

TABLE 14

Table showing emission properties at 400-nm excitation

|  | Amount of Eu y(mol) | Emission peak wavelength (nm) | Relative emission peak intensity (%) | Color coordinates x | Color coordinates y | Relative luminance (%) |
|---|---|---|---|---|---|---|
| COMPARATIVE EXAMPLE 3 |  | 560 | 4 | 0.445 | 0.527 | 4 |
| EXAMPLE 3 | 0.003 | 592 | 66 | 0.548 | 0.448 | 42 |
| EXAMPLE 4 | 0.015 | 592 | 113 | 0.557 | 0.441 | 69 |
| EXAMPLE 5 | 0.02 | 595 | 149 | 0.566 | 0.432 | 88 |
| EXAMPLE 6 | 0.06 | 595 | 136 | 0.565 | 0.433 | 81 |
| EXAMPLE 7 | 0.15 | 595 | 126 | 0.562 | 0.435 | 76 |
| EXAMPLE 8 | 0.3 | 597 | 99 | 0.548 | 0.445 | 64 |

Figure 10:
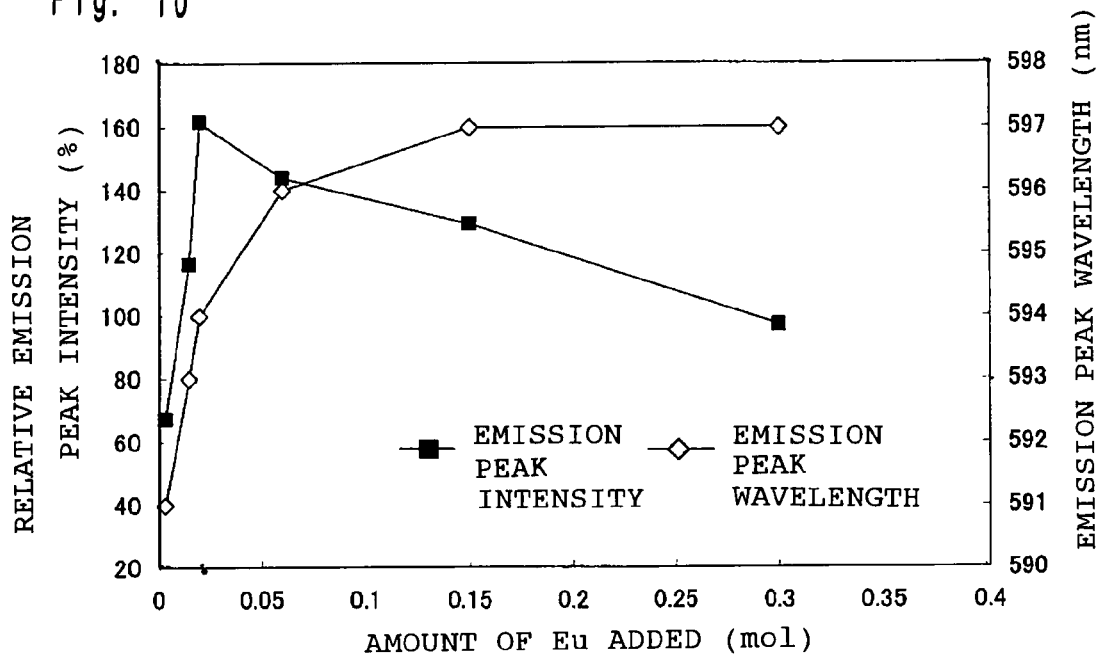
FIG. 10 shows graphs of the relationships between the amount of Eu added and the emission peak wavelength and between the amount of Eu added and the relative emission peak intensity of phosphors produced in EXAMPLE 3 to 8 at an excitation wavelength of 460 nm.
Figure 11:
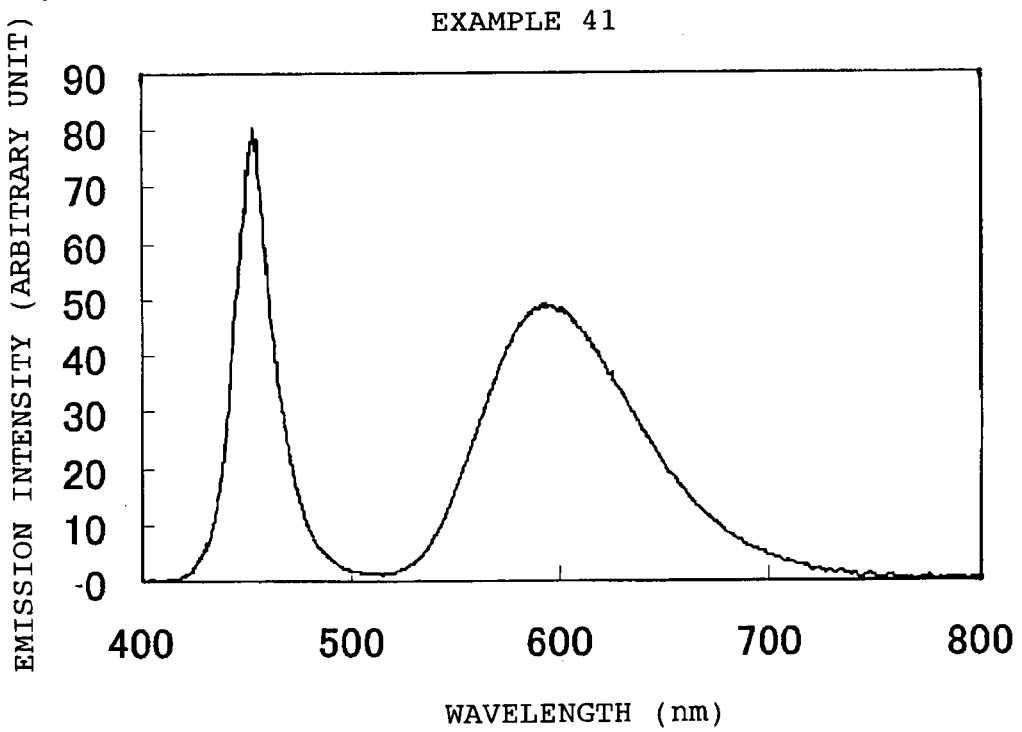
FIG. 11 shows the emission spectrum of a white-light-emitting device produced in EXAMPLE 41.
Figure 12:
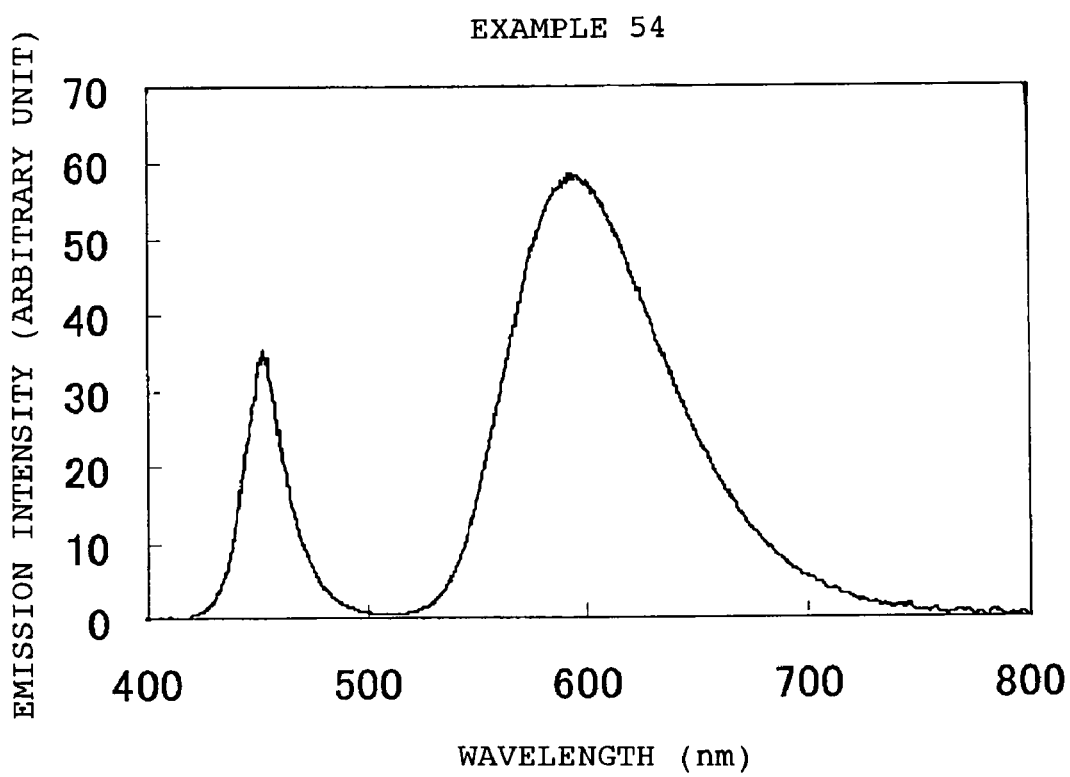
FIG. 12 shows the emission spectrum of a white-light-emitting device produced in EXAMPLE 54.
Figure 13:
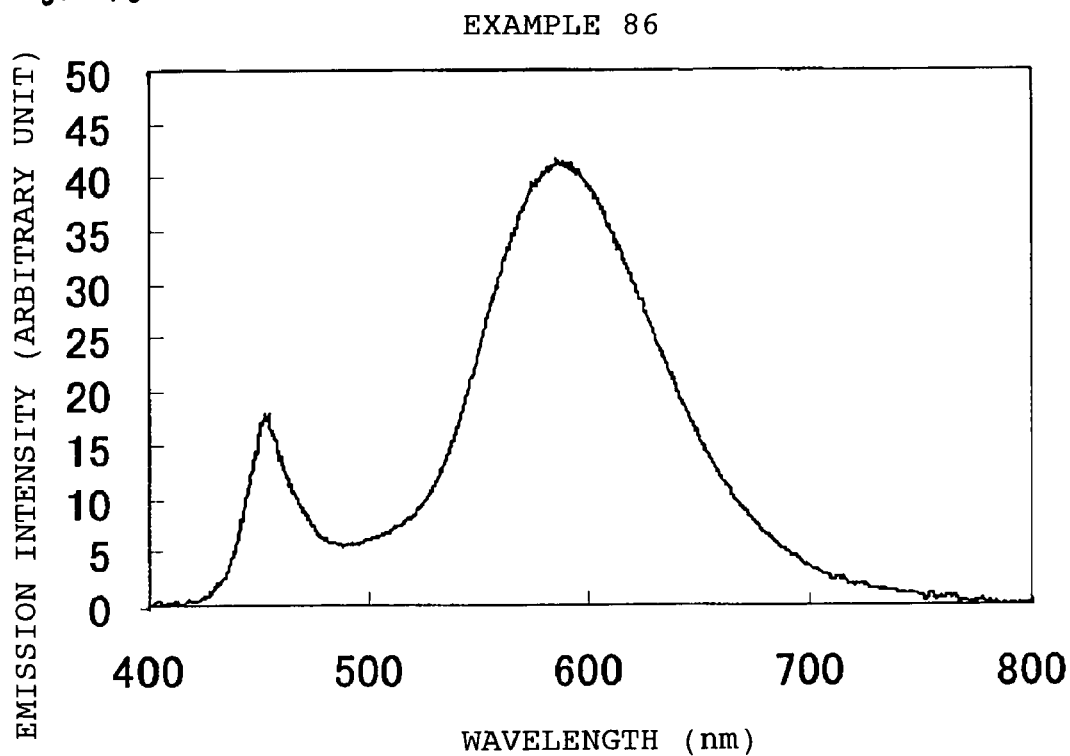
FIG. 13 shows the emission spectrum of a white-light-emitting device produced in EXAMPLE 86.
Figure 14:
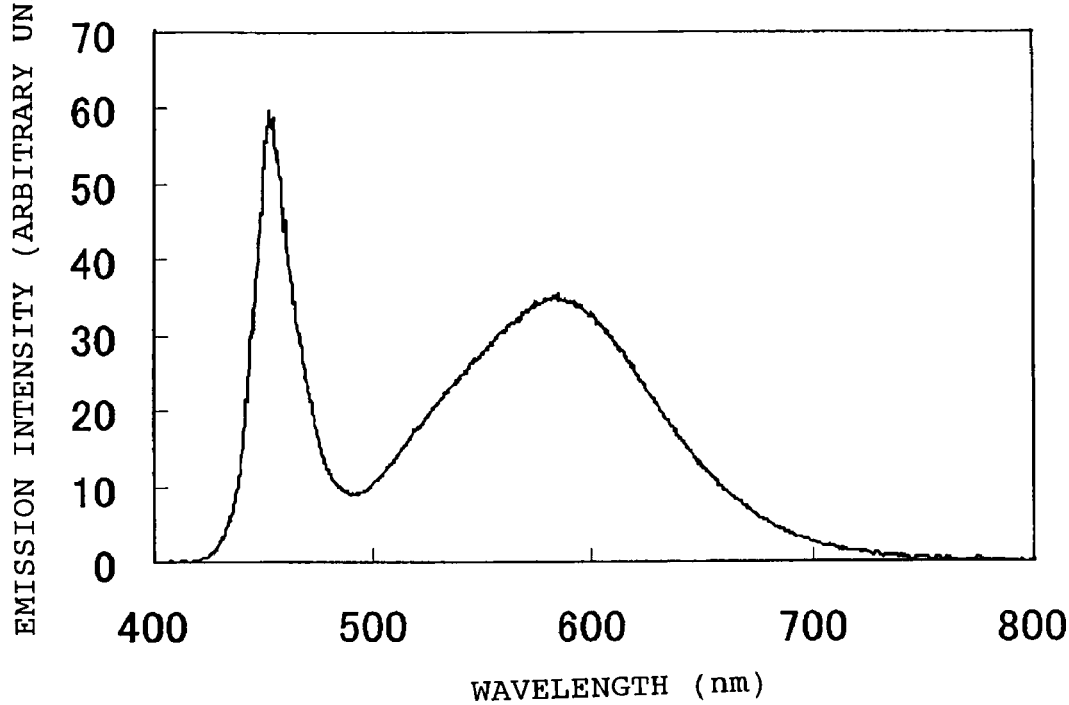
FIG. 14 shows the emission spectrum of a white-light-emitting device produced in EXAMPLE 108.
Figure 15:
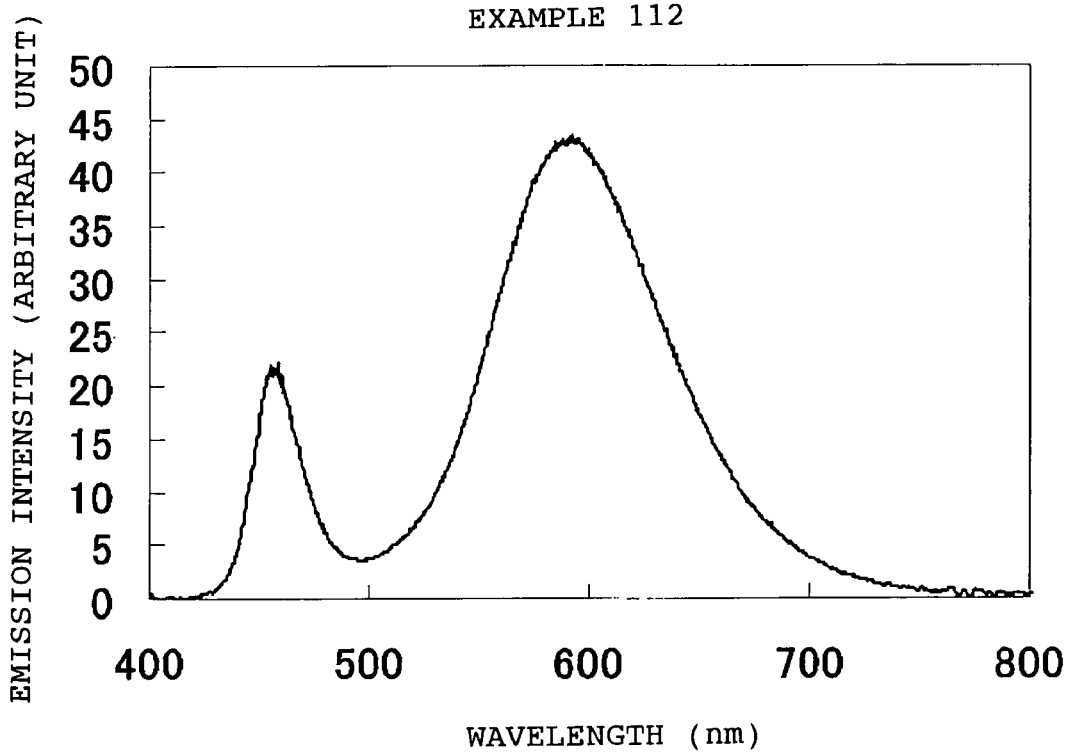
FIG. 15 shows the emission spectrum of a white-light-emitting device produced in EXAMPLE 112.
Figure 16:
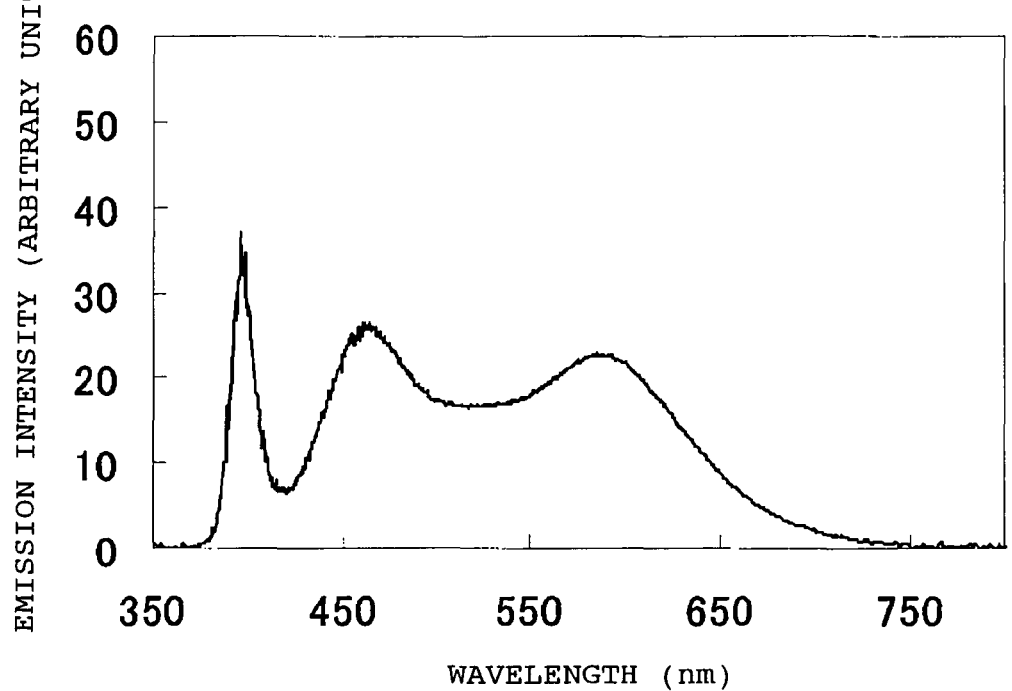
FIG. 16 shows the emission spectrum of a white-light-emitting device produced in EXAMPLE 127.
Figure 17:
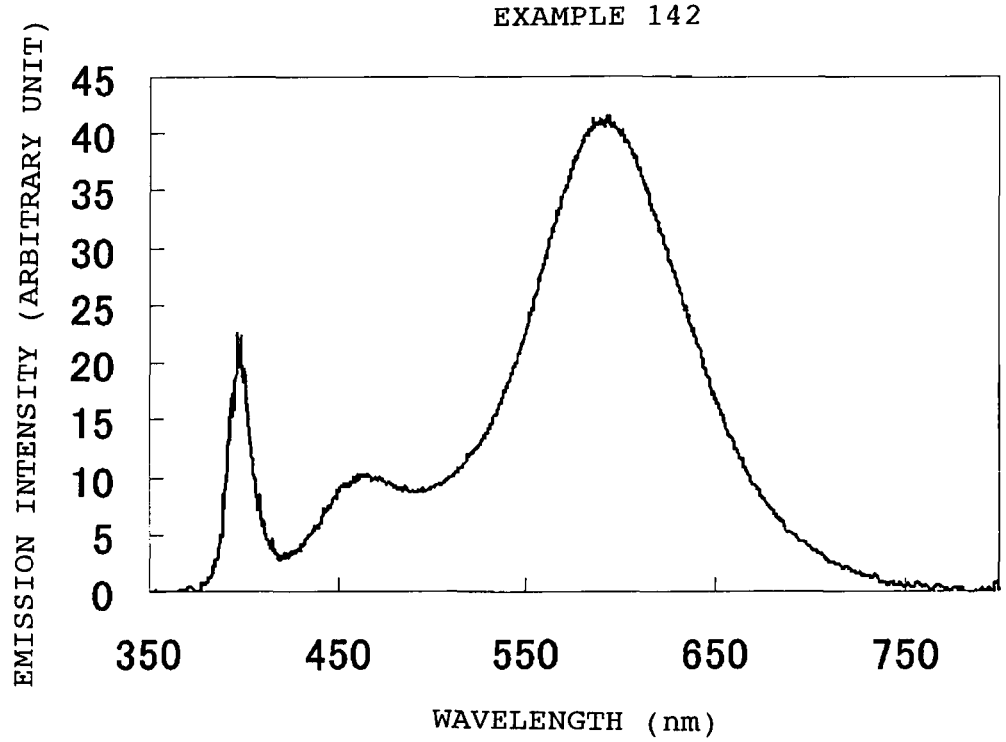
FIG. 17 shows the emission spectrum of a white-light-emitting device produced in EXAMPLE 142.
Figure 18:
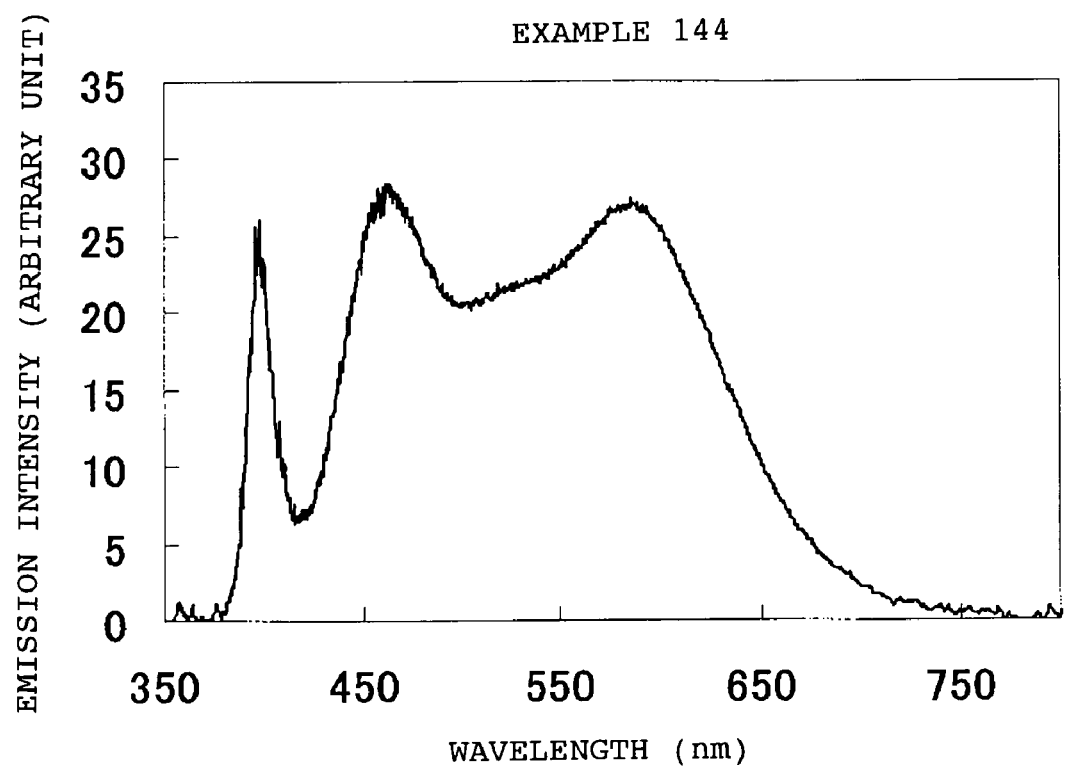
FIG. 18 shows the emission spectrum of a white-light-emitting device produced in EXAMPLE 144.
Figure 19:
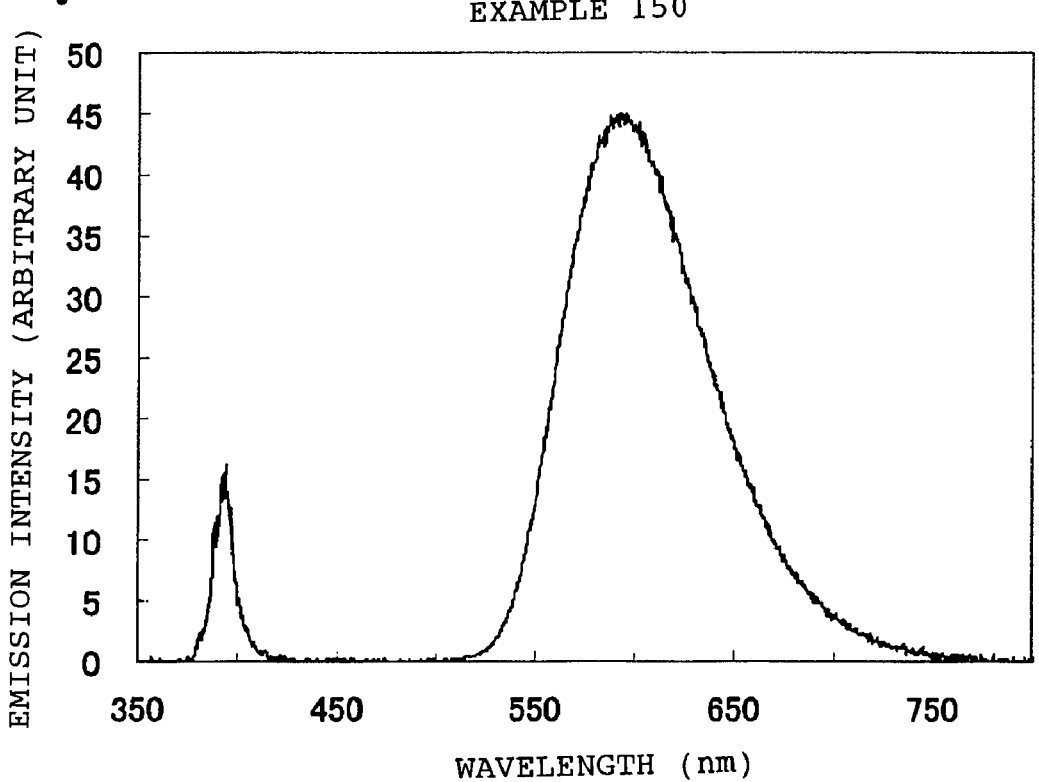
FIG. 19 shows the emission spectrum of a light-emitting device produced in EXAMPLE 150.

FIG. 10 shows graphs of the relationships between the amount of Eu added and the emission peak wavelength and between the amount of Eu added and the relative emission peak intensity at an emission wavelength of 460 nm.

The results of EXAMPLES 3 to 8 demonstrated that with respect to the content of Eu serving as an activation element, in the case where the molar amount of Eu (y in Formula [1]) was 0.02 and where the total molar amount of Sr, Ba, and Eu was 3, the maximum emission intensity was obtained. That is, it is understood that the phosphor is preferably produced in such a manner that the amount of Eu is about this value.

<Emission Properties at 455-nm Excitation>

The emission peak wavelength, relative emission peak intensity, color coordinates, and relative luminance of the phosphors produced in EXAMPLES 9 and 10 when the phosphors were excited by 455 nm were measured. Table 15 shows the results.

The relative peak intensity and relative luminance are relative values determined with reference to the simultaneously-measured emission peak intensity and luminance of the phosphor, produced in COMPARATIVE EXAMPLE 3, excited by light having a wavelength of 460 nm, the emission peak intensity and luminance being defined as 100.

TABLE 15

Table showing emission properties at 455-nm excitation

|  | Emission peak wavelength (nm) | Relative emission peak intensity (%) | Color coordinates x | Color coordinates y | Relative luminance (%) |
|---|---|---|---|---|---|
| COMPARATIVE EXAMPLE 3 | 556 | 100 | 0.447 | 0.531 | 100 |
| EXAMPLE 9 | 595 | 170 | 0.563 | 0.433 | 100 |
| EXAMPLE 10 | 594 | 99 | 0.559 | 0.435 | 60 |

The emission peak intensity of the phosphor produced in EXAMPLE 10 was smaller than that of the phosphor produced in EXAMPLE 9. This may be because high-temperature heat treatment at 1,400° C. in the alumina crucible without platinum foil causes the material mixture of the phosphor to react with alumina to contaminate the phosphor with the Al component.

The Al contents of these phosphors were measured. The phosphor produced in EXAMPLE 10 contained 380 μg of Al per gram. The phosphor produced in EXAMPLE 9 contained 30 μg of Al per gram. Thus, the phosphor produced in EXAMPLE 10 is believed to be contaminated with Al originating from the alumina crucible.

<Excitation Spectrum>

Figure 7:
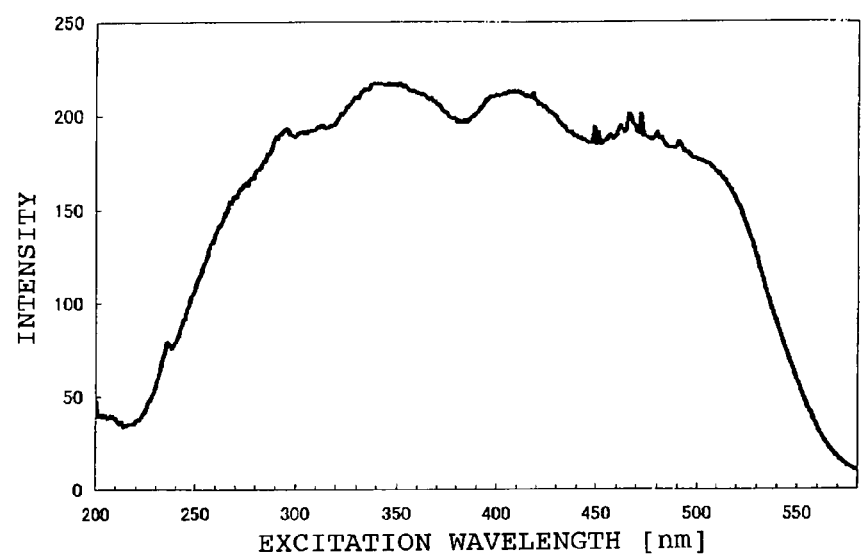
FIG. 7 shows the excitation spectrum of the phosphor in EXAMPLE 1 (emission detecting wavelength: 593 nm).

FIG. 7 shows an excitation spectrum of the phosphor produced in EXAMPLE 1. This figure demonstrates that the phosphor produced in EXAMPLE 1 can be excited by light having a wavelength of 300 nm to 500 nm and, in particular, emits light by efficiently absorbing light in the ultraviolet region, near-ultraviolet region, and visible light region with a wavelength of less than 500 nm.

<Emission-Intensity Maintenance Ratio and Luminance-Maintenance Ratio At Excitation Wavelength of 465 nm>

The emission-intensity maintenance ratio and luminance-maintenance ratio of the phosphor produced in EXAMPLE 1 were measured when the temperature was changed.

Figure 9:
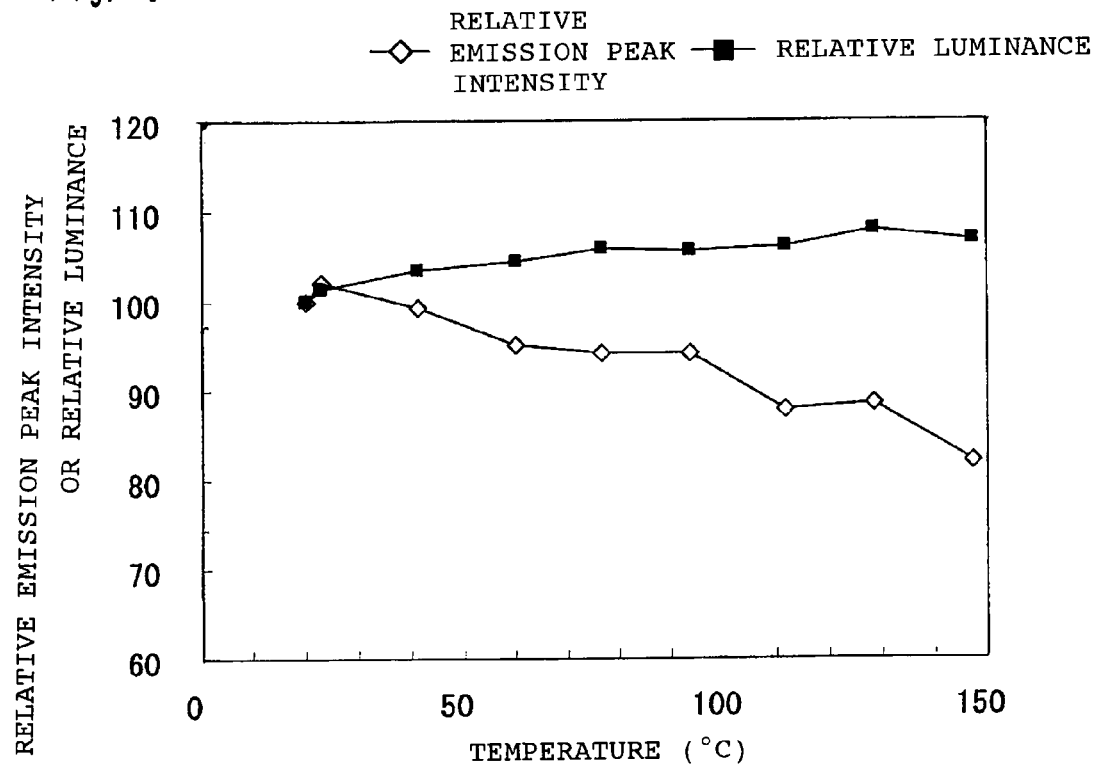
FIG. 9 shows graphs of the dependence of the emission intensity of the phosphor in EXAMPLE 1 on temperature.

The luminance value measured with the luminance meter was normalized by the luminance at 20° C. FIG. 9 shows the normalized values.

The emission peak intensity measured with the spectrometer was normalized by the emission peak intensity at 20° C. FIG. 9 shows the normalized values.

FIG. 9 demonstrated that in this phosphor, substantially no temperature quenching occurs in the temperature range of room temperature (20° C.) to about 150° C.

[Production of Phosphor II]

Example 23

$SrCO_3$, $BaCO_3$, $SiO_2$, and $Eu_2O_3$ were weighed in such a manner that the proportion of Sr:Ba:Si:Eu achieves the molar proportion shown in Table 16, and were ground and mixed together with ethanol using an agate mortar. Removal of ethanol by evaporation afforded a material mixture. The resulting material mixture was formed into pellets each having a diameter of 10 mm and reacted on molybdenum foil by heating at a heating temperature (maximum temperature) of 1,250° C. for a heating time of 6 hours in a hydrogen-containing nitrogen atmosphere (hydrogen:nitrogen=3:97 (volume ratio)). Subsequently, the resulting fired product was subjected to grinding treatment to produce a phosphor.

Examples 24 to 27

$SrCO_3$, $BaCO_3$, $SiO_2$, and $Eu_2O_3$ were weighed in such a manner that the molar proportion shown in Table 6 was achieved, and sufficiently dry-mixed to afford a material mixture. The resulting material mixture was charged into an alumina crucible with the bottom and side that were overlaid with platinum foil and heated at 1,400° C. for 3 hours in a muffle furnace under a stream of nitrogen gas. The resulting fired product was sufficiently ground, charged into an alumina crucible with the bottom and side that were overlaid with platinum foil, and heated at 1,550° C. for 3 hours in a hydrogen-containing nitrogen atmosphere (hydrogen:nitrogen=4:96 (volume ratio)). The resulting fired product was subjected to grinding treatment and passed through a nylon mesh having an aperture of 37 μm to produce a phosphor.

[Evaluation of Phosphor II]

<emission properties at 405-nm Excitation and 455-nm Excitation>

The emission peak wavelength, emission peak intensity, full width at half maximum, luminance, color coordinates, emission-intensity maintenance ratio, internal quantum efficiency, external quantum efficiency, absorption efficiency, and weight median diameter ($D_{50}$) of each of the phosphors produced in EXAMPLES 23 to 27 when the phosphors were excited by 405-nm light and 455-nm light according to the method described above were measured. Tables 17 and 18 show the results.

When the molar ratio of Sr/Ba exceeds 2.5/0.5, i.e., when Sr is increased, the emission wavelength shifts to short wavelengths as Sr increases. When Sr/Ba is about to 2.6/0.4, the longest emission peak wavelength is obtained. To increase the red component, the Sr/Ba ratio is preferably adjusted within this range.

These results demonstrate that when the ratio x of Ba is in the range of 0.5 to 0.8, a phosphor having a relatively longer emission peak wavelength and significantly high emission peak intensity can be obtained.

TABLE 16

| | Composition | | | |
|---|---|---|---|---|
| | Sr | Ba | Si | Eu |
| EXAMPLE 23 | 1 | 1.98 | 1 | 0.02 |
| EXAMPLE 24 | 2.574 | 0.4 | 1 | 0.026 |
| EXAMPLE 25 | 2.673 | 0.3 | 1 | 0.027 |
| EXAMPLE 26 | 2.772 | 0.2 | 1 | 0.028 |
| EXAMPLE 27 | 2.871 | 0.1 | 1 | 0.029 |

[Surface Treatment and Evaluation of Durability]

Example 28

A white-light-emitting device was produced by the following procedure using the orange phosphor obtained in EXAMPLE 1 and a green phosphor $(Ba_{1.39}Sr_{0.46}Eu_{0.15})SiO_4$.

An LED chip "C460-MB290" (emission wavelength: 461 nm) manufactured by Cree, Inc. was mounted by bonding on an SMD LED package "TY-SMD1202B" manufactured by Toyo Denpa Co. Ltd.

An epoxy resin "YL-7301" and a curing agent "YLH-1230", which were manufactured by Japan Epoxy Resins Co., Ltd., were mixed in a ratio of 100 parts by weight: 80 parts by weight. Then, 5.3 parts by weight of the orange phosphor, 5.8 parts by weight of the green phosphor, and 1.0 part by weight of a filler "RY200" manufactured by Nippon Aerosil Co., Ltd. were added to 100 parts by weight of the resulting mixture. The resulting mixture was kneaded for 3 minutes with a mixer "Awatori Rentaro AR-100" manufactured by Thinky Corporation to afford a phosphor-containing composition.

TABLE 17

| | 455-nm Excitation | | | | | | | | | | | |
|---|---|---|---|---|---|---|---|---|---|---|---|---|
| | Emission peak wavelength | Relative emission peak intensity | Color coordinates x | y | Luminance | Full width at half maximum | Emission-intensity maintenance ratio 100° C. | 125° C. | 150° C. | Internal quantum efficiency | External quantum efficiency | Absorption efficiency |
| EXAMPLE 23 | 593 | 93 | 0.541 | 0.449 | 63 | 92 | 81 | 72 | 61 | 69.1 | 28.9 | 41.8 |
| EXAMPLE 24 | 599 | 129 | 0.575 | 0.421 | 71 | 80 | 89 | 83 | 70 | 53.5 | 38.6 | 72.1 |
| EXAMPLE 25 | 595 | 131 | 0.567 | 0.428 | 75 | 79 | 86 | 80 | 69 | 54.0 | 38.9 | 72.0 |
| EXAMPLE 26 | 592 | 134 | 0.556 | 0.439 | 80 | 77 | 87 | 79 | 66 | 54.1 | 38.5 | 71.2 |
| EXAMPLE 27 | 589 | 121 | 0.540 | 0.454 | 76 | 76 | 85 | 76 | 62 | 50.2 | 34.3 | 68.3 |

TABLE 18

| | 405-nm Excitation | | | | | | | | | | | | |
|---|---|---|---|---|---|---|---|---|---|---|---|---|---|
| | Emission peak wavelength | Relative emission peak intensity | Color coordinates x | y | Luminance | Full width at half maximum | Emission-intensity maintenance ratio 100° C. | 125° C. | 150° C. | Internal quantum efficiency | External quantum efficiency | Absorption efficiency | Weight median diameter (D$_{50}$) |
| EXAMPLE 23 | 592 | 100 | 0.528 | 0.446 | 70 | 91 | 90 | 80 | 69 | 35.7 | 31.2 | 87.4 | 19.4 |
| EXAMPLE 24 | 598 | 122 | 0.571 | 0.416 | 68 | 80 | 91 | 85 | 75 | 41.8 | 39.3 | 94.0 | 23.2 |
| EXAMPLE 25 | 595 | 128 | 0.563 | 0.424 | 73 | 79 | 91 | 83 | 70 | 44.0 | 41.4 | 94.1 | 20.4 |
| EXAMPLE 26 | 592 | 132 | 0.552 | 0.435 | 79 | 77 | 89 | 81 | 68 | 42.9 | 40.3 | 94.0 | 22.5 |
| EXAMPLE 27 | 588 | 124 | 0.536 | 0.450 | 78 | 75 | 88 | 78 | 61 | 40.1 | 37.5 | 93.6 | 20.9 |

The above-described results demonstrate that the phosphor satisfying Formula [1] has satisfactory temperature characteristics, high internal quantum efficiency, and high emission peak intensity. Furthermore, the phosphor has a good balance between luminance and the red component. Thus, the use of the phosphor enables a high-performance light-emitting device to be produced.

The resulting composition was filled into the LED-chip-mounted package until the composition reached the top surface of the package. The composition was cured by heating at 100° C. for 3 hours and then 140° C. for 3 hours.

The resulting light-emitting device was driven at 20 mA at room temperature (about 24° C.), and the CIE color coordinate x was measured.

Next, the light-emitting device was left standing for 500 hours under high-temperature and high-humidity conditions, i.e., at 85° C. and 85% RH. Then, similarly, the CIE color coordinate x was measured.

The ratio (x maintenance ratio: %) of the chromaticity coordinate x after exposure to high temperature and high humidity for 500 hours to the chromaticity coordinate x immediately after the production of the light-emitting device was calculated. Table 19 shows the results.

Example 29

Into a 50-mL flask, 3 g of the orange phosphor obtained in EXAMPLE 1 and 20 mL of ethanol were charged. The mixture was stirred. Then 6.7 g of 28 wt % aqueous ammonia was added thereto. The mixture was stirred for 1 minute with a magnetic stirrer.

Next, 20 mL of tetraethylorthosilicate was gradually added in two portions while the mixture was vigorously stirred. Stirring was continued for 90 minutes with the magnetic stirrer.

After the resulting solution was allowed to stand for 3 minutes, the supernatant was removed with a dropper.

The operation of the addition of 30 mL of ethanol, stirring for 1 minute, standing for 3 minutes, and the removal of the supernatant was repeated until the supernatant was clear and colorless.

The resulting precipitate was dried at 150° C. for 2 hours under reduced pressure in a vacuum dryer to provide a surface-treated orange phosphor.

A silicon oxide film was attached to the surface-treated orange phosphor in an amount of 13.8 percent by weight with respect to the weight of the phosphor. The film had a thickness of about 100 nm.

A white-light-emitting device was produced as in EXAMPLE 28, except that the surface-treated orange phosphor was used as the orange phosphor. Similarly, the color coordinate x immediately after the production of the light-emitting device, the chromaticity coordinate x after exposure to high temperature and high humidity for 500 hours, and the x maintenance ratio were checked. Table 19 shows the results.

As a first illuminant (21), a blue LED 460-MB (manufactured by Cree, Inc.) that emits light having a wavelength of 460 nm was used. The blue LED (21) was mounted by die bonding on a terminal (26) at the bottom of the depression of the frame (23) with a silver paste as an adhesive. Then an electrode of the blue LED (21) was connected to a terminal (25) of the frame (23) by wire bonding. A gold wire having a diameter of 25 μm was used as a wire (24).

The orange phosphor produced in EXAMPLE 1 and a Ce-activated $Ca_3(Sc,Mg)_2Si_3O_{12}$ green phosphor were used as a light-emitting material of a phosphor-containing portion (22). A silicone resin was used as a sealing resin.

These two phosphors were mixed with the silicone resin. The resulting mixture of the phosphors and the silicone resin was filled into the depression of the frame (23) on which the blue LED (21) was mounted by bonding, and was then maintained at 150° C. for 2 hours to cure the silicone resin. Thereby, the phosphor-containing portion (22) was formed to produce the surface-mounting white-light-emitting device.

The mixing ratio of the orange phosphor to the green phosphor, and the mixing ratio of the silicone resin to the total weight of the phosphors are as follows.

<Mixing Ratio>
Orange phosphor:green phosphor=72:18 (weight ratio)
Total of phosphors:silicone resin=9:100(weight ratio)
The Ce-activated $Ca_3(Sc,Mg)_2Si_3O_{12}$ green phosphor was synthesized as follows.

$CaCO_3$, $Mg(OH)_2 \cdot 3MgCO_3 \cdot 3H_2O$, $Sc_2O_3$, $SiO_2$ and $Ce(NO_3)_3$ (aqueous solution) were placed in an agate mortar together with a small amount of ethanol, sufficiently mixed, and dried to afford a material mixture. The material mixture was wrapped in platinum foil and fired at 1,500° C. for 3 hours under atmospheric pressure and a stream of a hydrogen-containing nitrogen gas (hydrogen:nitrogen=4:96 (volume ratio)). The resulting fired product was ground and classified to give the green phosphor.

<Material>
$CaCO_3$: 0.0297 mol
$Mg(OH)_2 \cdot 3MgCO_3 \cdot 3H_2O$: 0.0006 mol as Mg
$Sc_2O_3$: 0.0097 mol

TABLE 19

| | | Color coordinate x | | |
| --- | --- | --- | --- | --- |
| | Amount of silicon oxide film attached to orange phosphor (wt %) | Immediately after production | After exposure to high temperature and high humidity | x maintenance ratio (%) |
| EXAMPLE 28 | 0 | 0.360 | 0.323 | 90 |
| EXAMPLE 29 | 13.8 | 0.343 | 0.327 | 95 |

The results of EXAMPLES 28 and 29 clearly demonstrate that the white-light-emitting device including the surface-treated phosphor of the present invention has further excellent durability against exposure to a high-temperature and high-humidity environment.

[Production and Evaluation of Light-Emitting Device]

Example 30

Figure 1B:
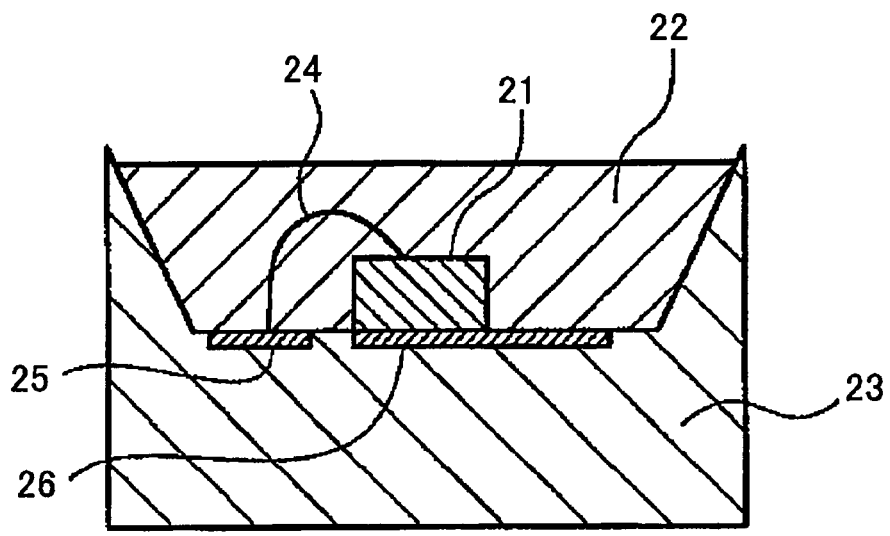
FIG. 1b is a schematic cross-sectional view of a surface-mounting white-light-emitting device produced in each of EXAMPLES 30 to 154.

A surface-mounting white-light-emitting device having the structure shown in FIG. 1b was produced by the following procedure. Elements in EXAMPLE 30 corresponding to the elements in FIG. 1b are designated using the same reference numerals in parentheses.

$SiO_2$: 0.03 mol
$Ce(NO_3)_3$ (aqueous solution): 0.0003 mol

The resulting white-light-emitting device was driven by passing a current of 20 mA through the LED (21) to emit light at room temperature (about 24° C.). The whole of light emitted from the white-light-emitting device was collected by a integrating sphere and guided into a spectrometer through an optical fiber. Then an emission spectrum and total luminous flux were measured.

Figure 8:
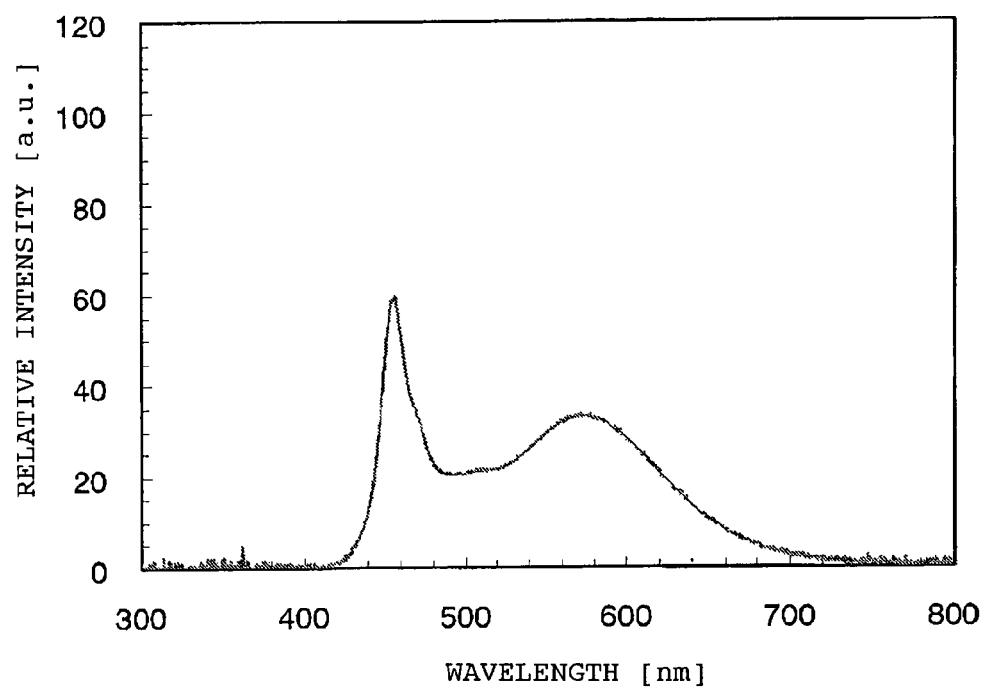
FIG. 8 shows the emission spectrum of a white-light-emitting device produced in EXAMPLE 12.

FIG. 8 shows an emission spectrum of the white-light-emitting device. The CIE color coordinates x and y were determined to be x=0.33 and y=0.34, on the basis of the values of emission intensity in the wavelength range of 380 nm to 780 nm of the measurement results of the emission spectrum.

The total luminous flux was 2 lumens (lm), and the luminous efficiency was 29 μm/W.

Comparative Example 5

A white-light-emitting device was produced as in EXAMPLE 12, except that a yellow phosphor (Y,Gd, Ce)$_3$Al$_5$O$_{12}$ (Type P46-Y3, manufactured by Kasei Optonix, Ltd., phosphor used in COMPARATIVE EXAMPLE 3) was used as the phosphor. Evaluations were made as in EXAMPLE 12. The CIE color coordinates x and y were x=0.33 and y=0.32. The total luminous flux was 1.6 lumens (lm). The luminous efficiency was 23 lm/W.

The results of EXAMPLE 30 and COMPARATIVE EXAMPLE 5 clearly demonstrate that the white-light-emitting device including the orange phosphor obtained in EXAMPLE 1 and the Ce-activated Ca$_3$(Sc,Mg)$_2$Si$_3$O$_{12}$ green phosphor has excellent luminous efficiency compared with that of the white-light-emitting device including the yellow phosphor (Y,Gd, Ce)$_3$Al$_5$O$_{12}$.

Examples 31 to 112

Surface-mounting white-light-emitting devices were produced by the following procedure.

Some white-light-emitting devices did not emit "white" light in a strict sense. However, such devices were also generically referred to as "white-light-emitting device".

Phosphors used were as follows.
Orange phosphor A: Phosphor obtained in EXAMPLE 9
Yellow phosphor 2: Y$_3$Al$_5$O$_{12}$:Ce$^{3+}$,Tb$^{3+}$
Green phosphor 1: Ca$_3$(Sc,Mg)$_2$Si$_3$O$_{12}$:Ce$^{3+}$ (green phosphor identical to that used in EXAMPLE 30)
Green phosphor 2: Ba$_{1.39}$Sr$_{0.46}$Eu$_{0.15}$SiO$_4$
Blue phosphor 1: Ba$_{0.7}$Eu$_{0.3}$MgAl$_{10}$O$_{17}$ The yellow phosphor 2, the green phosphor 2, and the blue phosphor 1 were synthesized as follows.

<Yellow Phosphor 2>

Predetermined amounts of Y$_2$O$_3$, Tb$_4$O$_7$, CeO$_2$ and Al$_2$O$_3$, which were materials, were sufficiently mixed with BaF$_2$, which was flux, charged into an alumina crucible, and fired at 1,450° C. for 2 hours in a hydrogen-containing nitrogen atmosphere (hydrogen:nitrogen=4:96 (volume ratio)). The resulting fired product was ground, washed, classified, and dried to provide the yellow phosphor 2 Y$_3$Al$_5$O$_{12}$:Ce$^{3+}$,Tb$^{3+}$.

<Green Phosphor 2>

BaCO$_3$, SrCO$_3$, SiO$_2$, and Eu$_2$O$_3$ were weighed in such a manner that Sr:Ba:Si:Eu=1.39:0.46:0.15:1 (molar ratio) were placed in an agate mortar together with a small amount of ethanol, sufficiently mixed, and dried to afford a material mixture. The material mixture was charged into an alumina crucible and fired at 1,200° C. for 6 hours in a hydrogen-containing nitrogen atmosphere (hydrogen:nitrogen=4:96 (volume ratio)). The resulting fired product was ground and classified to provide the green phosphor 2A Ba$_{1.39}$Sr$_{0.46}$Eu$_{0.15}$SiO$_4$.

A green phosphor having another production lot was also synthesized by the same method described above and was referred to as a green phosphor 2B Ba$_{1.39}$Sr$_{0.46}$Eu$_{0.15}$SiO$_4$.

<Blue Phosphor>

BaCO$_3$, Eu$_2$O$_3$, basic magnesium carbonate (MgCO$_3$.nMg(OH)$_2$), and γ-Al$_2$O$_3$ were weighed in such a manner that Ba:Eu:Mg:Al=0.7:0.3:1:10 (molar ratio), and charged into an agate mortar. AlF$_3$ was added thereto in an amount of 0.3 percent by weight with respect to the total weight of the above materials. The mixture together with a small amount of ethanol was sufficiently mixed and dried to afford a material mixture. The material mixture was charged into an alumina crucible and fired at 1,450° C. for 3 hours in a hydrogen-containing nitrogen atmosphere (hydrogen:nitrogen=4:96 (volume ratio)). The resulting fired product was ground and classified to provide the blue phosphor 1 Ba$_{0.7}$Eu$_{0.3}$MgAl$_{10}$O$_{17}$.

A surface-mounting white-light-emitting device having the structure shown in FIG. 1b was produced by the following procedure. Elements corresponding to the elements in FIG. 1b are designated using the same reference numerals in parentheses.

As a first illuminant (21), a blue LED 460-MB (manufactured by Cree, Inc.) that emits light having a wavelength of 460 nm was used. The blue LED (21) was mounted by die bonding on a terminal (26) at the bottom of the depression of the frame (23) with a silver paste as an adhesive. Then an electrode of the blue LED (21) was connected to a terminal (25) of the frame (23) by wire bonding. A gold wire having a diameter of 25 μm was used as a wire (24).

The above-described orange phosphor and one or two or more of the yellow phosphor 2, the green phosphor 1, the green phosphor 2A, the green phosphor 2B, and the blue phosphor 1 were used as a light-emitting material of a phosphor-containing portion (22). An epoxy resin was used as a sealing material.

The above-described orange phosphor, one or two or more of the yellow phosphor 2, the green phosphor 1, the green phosphor 2A, the green phosphor 2B, and the blue phosphor 1, an epoxy resin (YL7301, manufactured by Japan Epoxy Resins Co., Ltd.), an epoxy-resin curing agent (YLH1230, manufactured by Japan Epoxy Resins Co., Ltd.), and an additive (AEROSIL (registered trademark), AEROSIL 130, manufactured by Nippon Aerosil Co., Ltd.) were sufficiently mixed.

The mixing ratio of the epoxy resin:epoxy resin curing agent:additive=100:80:3.6 (weight ratio). The mixing ratio of the phosphors with respect to the total weight of the epoxy resin and the epoxy resin curing agent was shown in Tables 20 to 27.

The resulting mixture was filled into the depression of the frame (23) on which the blue LED (21) was mounted by bonding. The mixture was heated at 100° C. for 3 hours and then 140° C. for 3 hours to cure the epoxy resin. Thereby, the phosphor-containing portion (22) was formed to produce the surface-mounting white-light-emitting device.

Evaluations, described below, of the white-light-emitting device were made. Tables 20 to 27 shows the results.

Examples 113 to 154

Surface-mounting white-light-emitting devices were produced as in EXAMPLES 31 to 112, except that a near-ultraviolet LED that emits light having a wavelength of 395 nm were used in place of the blue LED, the combinations and mixing ratios of the phosphors were changed, a silicone resin was used as the sealing material, and the heating conditions during the formation of the phosphor-containing portion were changed, as described below.

Near-ultraviolet LED: C395-MB, manufactured by Cree, Inc.

Combination and mixing ratio of phosphors: See Tables 28 to 32 (the mixing ratio refers to the mixing ratio of the phosphor to the weight of the silicone resin)

Sealing material: Silicone resin (6101, manufactured by Dow Corning Toray Co., Ltd.)

Heating conditions: 150° C. for 2 hours

Evaluations, described below, of the produced light-emitting devices were made. Tables 28 to 32 show the results.

[Evaluation of Light-Emitting Device (EXAMPLES 113 to 154)]

Emission spectrum: Emission spectrum was measured as in EXAMPLE 30. The emission spectra of the light-emitting devices produced in EXAMPLES 41, 54, 86, 108, 112, 127, 142, 144, and 150 were shown in FIGS. 11 to 19.

CIE color coordinates x and y: The CIE color coordinates x and y were calculated from the emission spectrum of the light-emitting device according to JIS Z8701.

Total luminous flux (unit: lm): The total luminous flux was measured as in EXAMPLE 30.

Luminous power (unit: lm/W): A value obtained by dividing the total luminous flux by the radiant flux W1 when the blue LED or near-ultraviolet LED before the formation of the phosphor-containing portion was driven by passing a current of 20 mA therethrough to emit light.

Luminous efficiency (unit: lm/W): A value obtained by dividing the total luminous flux by the power consumption W2 when the blue LED or near-ultraviolet LED before the formation of the phosphor-containing portion was driven by passing a current of 20 mA therethrough to emit light.

General color rendering index Ra: The general color rendering index was calculated according to the definition of JIS Z8726.

W1 (unit: mW): To determine a lot-to-lot variation of the LEDs, W1 represents radiant flux when the blue LED or near-ultraviolet LED before the formation of the phosphor-containing portion was driven by passing a current of 20 mA therethrough.

Voltage when energized (unit: V): A voltage across terminals when the blue LED or near-ultraviolet LED was driven by passing a current of 20 mA therethrough.

W2 (unit: mW): Consumption power determined by multiplying the voltage by the current when energized.

Table 20 shows the properties of the light-emitting devices each including the blue LED and the orange phosphor A alone. The light-emitting devices each including the blue LED and the orange phosphor of the present invention emit, light of purple, pink, amber, orange, red, etc., and have high luminance; hence, the light-emitting devices can be suitably used as various image displays and automotive-use light sources.

Table 21 shows the properties of the light-emitting devices each including the blue LED, the orange phosphor A, and the yellow phosphor 2. The light-emitting devices each including the blue LED, the orange phosphor A, and the yellow phosphor 2 emit light of white to warm white and have excellent color rendering properties owing to a large proportion of the red component compared with that of a white-light-emitting device including a yellow phosphor alone; hence, the white-light-emitting device can be suitably used as illumination apparatuses. Furthermore, such white-light-emitting devices can be suitably used as image displays and, in particular, backlights for used in liquid crystal displays.

Table 22 shows the properties of the light-emitting devices each including the blue LED, the orange phosphor A, and the green phosphor 1.

Table 23 shows the properties of the light-emitting devices each including the blue LED, the orange phosphor A, and the green phosphor 1. The mixing ratio of the orange phosphor A in each of the white-light-emitting devices shown in Table 23 is larger than that in each of the white-light-emitting devices shown in Table 22. This results in the white-light-emitting devices that emit light of warm white.

As described above, the light-emitting devices each including the blue LED, the orange phosphor A, and the green phosphor emit light of white to warm white and have excellent color rendering properties owing to large proportions of the red component and the blue-green component compared with those of a white-light-emitting device including a yellow phosphor alone; hence, the white-light-emitting device can be suitably used as illumination apparatuses. Furthermore, such white-light-emitting devices can be suitably used as image displays and, in particular, backlights for used in liquid crystal displays.

Table 24 shows the properties of the light-emitting devices each including the blue LED, the orange phosphor A, and the green phosphor 2A.

Table 25 shows the properties of the light-emitting devices each including the blue LED, the orange phosphor A, and the green phosphor 2A. The mixing ratio of the orange phosphor A in each of the white-light-emitting devices shown in Table 25 is larger than that in each of the white-light-emitting devices shown in Table 24. This results in the white-light-emitting devices that emit light of warm white.

Table 26 shows the properties of the light-emitting devices each including the blue LED, the orange phosphor A, and the green phosphor 2B.

Table 27 shows the properties of the light-emitting devices each including the blue LED, the orange phosphor A, and the green phosphor 2B. The mixing ratio of the orange phosphor A in each of the white-light-emitting devices shown in Table 27 is larger than that in each of the white-light-emitting devices shown in Table 26. This results in the white-light-emitting devices that emit light of warm white.

As described above, the white-light-emitting devices each including the blue LED, the orange phosphor A, and the green phosphor emit light of white to warm white and have excellent color rendering properties owing to a large proportion of the red component compared with that of a white-light-emitting device including a yellow phosphor alone. Furthermore, the white-light-emitting devices have high luminance; hence, the white-light-emitting device can be suitably used as illumination apparatuses. Furthermore, such white-light-emitting devices can be suitably used as image displays and, in particular, backlights for used in liquid crystal displays.

Table 28 shows the properties of the light-emitting devices each including the near-ultraviolet LED, the orange phosphor A, the green phosphor 2A, and the blue phosphor 1.

Table 29 shows the properties of the light-emitting devices each including the near-ultraviolet LED, the orange phosphor A, the green phosphor 2A, and the blue phosphor 1. The mixing ratio of the orange phosphor A in each of the white-light-emitting devices shown in Table 29 is larger than that in each of the white-light-emitting devices shown in Table 28. This results in the white-light-emitting devices that emit light of warm white.

Table 30 shows the properties of the light-emitting devices each including the near-ultraviolet LED, the orange phosphor A, the green phosphor 2A, and the blue phosphor 1.

Table 31 shows the properties of the light-emitting devices each including the near-ultraviolet LED, the orange phosphor A, the green phosphor 2A, and the blue phosphor 1. The mixing ratio of the orange phosphor A in each of the white-light-emitting devices shown in Table 31 is larger than that in each of the white-light-emitting devices shown in Table 30. This results in the white-light-emitting devices that emit light of warm white.

As described above, the white-light-emitting devices each including the near-ultraviolet LED, the orange phosphor A, the green phosphor, and the blue phosphor emit light of white to warm white and have a low nonuniformity in color and excellent color rendering properties compared with those of a white-light-emitting device including a blue LED; hence, the white-light-emitting device can be suitably used as illumination apparatuses. Furthermore, such white-light-emitting devices can be suitably used as image displays and, in particular, backlights for used in liquid crystal displays.

In the white-light-emitting device including the blue LED as the first illuminant, the proportion of outgoing blue light affects the emission color of the white-light-emitting device. In contrast, when the near-ultraviolet LED is used as the first illuminant, the emission color of the white-light-emitting device can be controlled by only the mixing ratio of the phosphors. Thus, the color is easily controlled compared with the blue LED is used.

Table 32 shows the properties of the light-emitting devices each including the near-ultraviolet LED and the orange phosphor A.

The light-emitting devices each including the near-ultraviolet LED and the orange phosphor of the present invention emit light of orange and pink and have high luminance; hence, the light-emitting devices can be suitably used as various image displays and automotive-use light sources.

TABLE 20

| | White-light-emitting device | | | | | | | Blue LED | | |
|---|---|---|---|---|---|---|---|---|---|---|
| | Mixing ratio of orange phosphor A | CIE color coordinates | | Total luminous flux | Luminous power [total luminous flux/W1] | Luminous efficiency [total luminous flux/W2] | General color rendering index Ra | W1 | Voltage when energized | Current when energized | W2 [voltage when energized * current when energized] |
| | (wt %) | x | y | (lm) | (lm/W) | (lm/W) | | (mW) | (V) | (mA) | (mW) |
| EXAMPLE 31 | 3.2 | 0.236 | 0.124 | 1.07 | 193.2 | 14.8 | 12.9 | 5.54 | 3.617 | 20.0 | 72.34 |
| EXAMPLE 32 | 3.2 | 0.238 | 0.122 | 0.97 | 192.9 | 14.1 | 16.5 | 5.05 | 3.456 | 20.0 | 69.12 |
| EXAMPLE 33 | 3.2 | 0.246 | 0.128 | 1.12 | 210.2 | 16.2 | 23.5 | 5.35 | 3.476 | 20.0 | 69.52 |
| EXAMPLE 34 | 6 | 0.305 | 0.189 | 1.44 | 263.0 | 19.9 | 51.0 | 5.47 | 3.608 | 20.0 | 72.16 |
| EXAMPLE 35 | 6 | 0.310 | 0.194 | 1.46 | 279.3 | 20.9 | 53.9 | 5.21 | 3.478 | 20.0 | 69.56 |
| EXAMPLE 36 | 6 | 0.313 | 0.199 | 1.51 | 290.6 | 21.8 | 56.4 | 5.19 | 3.455 | 20.0 | 69.10 |
| EXAMPLE 37 | 8.7 | 0.378 | 0.255 | 1.70 | 334.2 | 24.6 | 50.2 | 5.10 | 3.465 | 20.0 | 69.30 |
| EXAMPLE 38 | 8.7 | 0.353 | 0.237 | 1.54 | 288.8 | 22.3 | 52.4 | 5.34 | 3.453 | 20.0 | 69.06 |
| EXAMPLE 39 | 8.7 | 0.354 | 0.237 | 1.76 | 303.2 | 23.9 | 53.0 | 5.81 | 3.687 | 20.0 | 73.74 |
| EXAMPLE 40 | 11.5 | 0.416 | 0.297 | 1.87 | 363.6 | 26.9 | 49.2 | 5.15 | 3.484 | 20.0 | 69.68 |
| EXAMPLE 41 | 11.5 | 0.394 | 0.275 | 1.77 | 326.4 | 24.5 | 49.8 | 5.43 | 3.626 | 20.0 | 72.52 |
| EXAMPLE 42 | 11.5 | 0.410 | 0.288 | 1.86 | 350.0 | 26.8 | 48.7 | 5.30 | 3.462 | 20.0 | 69.24 |
| EXAMPLE 43 | 14.2 | 0.432 | 0.309 | 1.83 | 350.5 | 26.4 | 47.2 | 5.23 | 3.468 | 20.0 | 69.36 |
| EXAMPLE 44 | 14.2 | 0.413 | 0.292 | 1.89 | 352.4 | 27.2 | 49.0 | 5.35 | 3.473 | 20.0 | 69.46 |
| EXAMPLE 45 | 20 | 0.386 | 0.267 | 1.85 | 342.4 | 26.6 | 49.0 | 5.41 | 3.486 | 20.0 | 69.72 |
| EXAMPLE 46 | 20 | 0.383 | 0.260 | 1.81 | 350.1 | 26.2 | 49.6 | 5.18 | 3.454 | 20.0 | 69.08 |
| EXAMPLE 47 | 25 | 0.388 | 0.268 | 1.67 | 335.5 | 24.1 | 48.5 | 4.99 | 3.468 | 20.0 | 69.36 |
| EXAMPLE 49 | 25 | 0.386 | 0.262 | 1.72 | 328.5 | 24.6 | 48.9 | 5.23 | 3.487 | 20.0 | 69.74 |
| EXAMPLE 50 | 30 | 0.443 | 0.320 | 1.91 | 351.3 | 26.7 | 45.6 | 5.45 | 3.588 | 20.0 | 71.76 |
| EXAMPLE 50 | 30 | 0.428 | 0.306 | 1.69 | 338.1 | 23.8 | 47.0 | 5.00 | 3.547 | 20.0 | 70.94 |
| EXAMPLE 51 | 35 | 0.447 | 0.321 | 1.74 | 353.1 | 24.7 | 45.0 | 4.92 | 3.517 | 20.0 | 70.34 |
| EXAMPLE 52 | 35 | 0.455 | 0.330 | 1.85 | 366.0 | 26.2 | 44.0 | 5.05 | 3.522 | 20.0 | 70.44 |
| EXAMPLE 53 | 40 | 0.453 | 0.329 | 1.79 | 361.3 | 25.1 | 45.0 | 4.95 | 3.562 | 20.0 | 71.24 |
| EXAMPLE 54 | 40 | 0.478 | 0.349 | 1.97 | 354.2 | 27.6 | 41.4 | 5.56 | 3.561 | 20.0 | 71.22 |

TABLE 21

| | White-light-emitting device | | | | | | | | Blue LED | | | W2 |
|---|---|---|---|---|---|---|---|---|---|---|---|---|
| | Mixing ratio of orange phosphor A | Mixing ratio of yellow phosphor 2 | CIE color coordinates | | Total luminous flux | Luminous power [total luminous flux/W1] | Luminous efficiency [total luminous flux/W2] | General color rendering index Ra | W1 | Voltage when energized | Current when energized | [voltage when energized * current when energized] |
| | (wt %) | (wt %) | x | y | (lm) | (lm/W) | (lm/W) | | (mW) | (V) | (mA) | (mW) |
| EXAMPLE 55 | 5.0 | 5.0 | 0.461 | 0.439 | 2.06 | 414.2 | 29.8 | 61.6 | 4.97 | 3.459 | 20.0 | 69.18 |
| EXAMPLE 56 | 5.0 | 5.0 | 0.459 | 0.444 | 2.21 | 452.9 | 31.4 | 62.3 | 4.89 | 3.523 | 20.0 | 70.46 |
| EXAMPLE 57 | 5.0 | 5.0 | 0.464 | 0.439 | 2.15 | 417.8 | 30.9 | 61.1 | 5.15 | 3.479 | 20.0 | 69.58 |
| EXAMPLE 58 | 5.6 | 3.7 | 0.403 | 0.376 | 2.15 | 396.1 | 30.7 | 69.5 | 5.42 | 3.493 | 20.0 | 69.86 |
| EXAMPLE 59 | 5.6 | 3.7 | 0.421 | 0.386 | 2.04 | 399.6 | 29.2 | 65.5 | 5.10 | 3.493 | 20.0 | 69.86 |
| EXAMPLE 60 | 5.6 | 3.7 | 0.429 | 0.398 | 1.79 | 409.0 | 25.2 | 64.9 | 4.38 | 3.563 | 20.0 | 71.26 |
| EXAMPLE 61 | 5.9 | 3.9 | 0.386 | 0.371 | 2.49 | 417.2 | 35.3 | 71.8 | 5.98 | 3.533 | 20.0 | 70.66 |
| EXAMPLE 62 | 5.9 | 3.9 | 0.394 | 0.371 | 2.23 | 426.7 | 32.2 | 68.6 | 5.23 | 3.463 | 20.0 | 69.26 |
| EXAMPLE 63 | 5.9 | 3.9 | 0.381 | 0.356 | 2.12 | 433.4 | 30.3 | 71.0 | 4.90 | 3.505 | 20.0 | 70.10 |
| EXAMPLE 64 | 5.9 | 3.9 | 0.442 | 0.401 | 1.83 | 372.9 | 27.3 | 62.6 | 4.91 | 3.357 | 20.0 | 67.14 |
| EXAMPLE 65 | 5.9 | 3.9 | 0.440 | 0.408 | 1.85 | #N/A | 26.6 | 64.3 | #N/A | 3.477 | 20.0 | 69.54 |
| EXAMPLE 66 | 5.9 | 3.9 | 0.442 | 0.408 | 1.96 | #N/A | 28.3 | 63.0 | #N/A | 3.464 | 20.0 | 69.28 |

TABLE 22

| | White-light-emitting device | | | | | | | | Blue LED | | |
|---|---|---|---|---|---|---|---|---|---|---|---|
| | Mixing ratio of orange phosphor A | Mixing ratio of green phosphor 1 | CIE color coordinates | | Total luminous flux | Luminous power [total luminous flux/W1] | Luminous efficiency [total luminous flux/W2] | General color rendering | W1 | Voltage when energized | Current when energized | W2 [voltage when energized * current when energized] |
| | (wt %) | (wt %) | x | y | (lm) | (lm/W) | (lm/W) | index Ra | (mW) | (V) | (mA) | (mW) |
| EXAMPLE 67 | 1.3 | 12.5 | 0.261 | 0.342 | 2.07 | 412.9 | 29.9 | 65.2 | 5.01 | 3.459 | 20.0 | 69.18 |
| EXAMPLE 68 | 1.3 | 12.5 | 0.270 | 0.356 | 2.25 | 454.1 | 31.7 | 64.8 | 4.96 | 3.552 | 20.0 | 71.04 |
| EXAMPLE 69 | 1.3 | 12.5 | 0.261 | 0.340 | 2.13 | 427.9 | 30.3 | 65.4 | 4.98 | 3.513 | 20.0 | 70.26 |
| EXAMPLE 70 | 3.3 | 9.1 | 0.334 | 0.383 | 2.09 | 435.8 | 28.9 | 71.8 | 4.80 | 3.625 | 20.0 | 72.50 |
| EXAMPLE 71 | 3.3 | 9.1 | 0.339 | 0.390 | 2.17 | 440.1 | 32.3 | 70.6 | 4.94 | 3.365 | 20.0 | 67.30 |
| EXAMPLE 72 | 3.4 | 6.5 | 0.340 | 0.361 | 1.88 | 378.5 | 27.0 | 75.0 | 4.97 | 3.488 | 20.0 | 69.76 |
| EXAMPLE 73 | 3.4 | 6.5 | 0.336 | 0.358 | 1.91 | 334.3 | 26.9 | 75.8 | 5.70 | 3.551 | 20.0 | 71.02 |
| EXAMPLE 74 | 3.4 | 6.5 | 0.326 | 0.341 | 1.90 | 389.0 | 27.1 | 77.6 | 4.88 | 3.504 | 20.0 | 70.08 |
| EXAMPLE 75 | 3.5 | 5.3 | 0.318 | 0.323 | 1.92 | 376.4 | 27.6 | 80.0 | 5.10 | 3.479 | 20.0 | 69.58 |
| EXAMPLE 76 | 3.5 | 5.3 | 0.321 | 0.331 | 1.80 | 353.9 | 26.0 | 79.2 | 5.10 | 3.475 | 20.0 | 69.50 |
| EXAMPLE 77 | 3.5 | 5.3 | 0.328 | 0.335 | 1.82 | 385.0 | 27.1 | 79.1 | 4.72 | 3.351 | 20.0 | 67.02 |

TABLE 23

| | White-light-emitting device | | | | | | | | Blue LED | | |
|---|---|---|---|---|---|---|---|---|---|---|---|
| | Mixing ratio of orange phosphor A | Mixing ratio of green phosphor 1 | CIE color coordinates | | Total luminous flux | Luminous power [total luminous flux/W1] | Luminous efficiency [total luminous flux/W2] | General color rendering | W1 | Voltage when energized | Current when energized | W2 [voltage when energized * current when energized] |
| | (wt %) | (wt %) | x | y | (lm) | (lm/W) | (lm/W) | index Ra | (mW) | (V) | (mA) | (mW) |
| EXAMPLE 78 | 2.0 | 12.5 | 0.285 | 0.343 | 2.10 | 403.5 | 30.1 | 70.9 | 5.21 | 3.490 | 20.0 | 69.80 |
| EXAMPLE 79 | 2.0 | 12.5 | 0.287 | 0.349 | 2.13 | 433.8 | 29.9 | 70.5 | 4.91 | 3.557 | 20.0 | 71.14 |
| EXAMPLE 80 | 2.0 | 12.5 | 0.271 | 0.336 | 2.21 | 434.6 | 31.9 | 69.3 | 5.08 | 3.459 | 20.0 | 69.18 |
| EXAMPLE 81 | 7.6 | 9.7 | 0.400 | 0.401 | 1.77 | 398.4 | 24.8 | 68.4 | 4.46 | 3.583 | 20.0 | 71.66 |
| EXAMPLE 82 | 7.6 | 9.7 | 0.392 | 0.399 | 1.62 | 377.2 | 23.0 | 69.5 | 4.30 | 3.521 | 20.0 | 70.42 |
| EXAMPLE 83 | 8.9 | 6.8 | 0.423 | 0.396 | 1.69 | 329.7 | 24.2 | 65.4 | 5.14 | 3.493 | 20.0 | 69.86 |
| EXAMPLE 84 | 8.9 | 6.8 | 0.396 | 0.368 | 1.69 | 339.4 | 24.1 | 69.3 | 4.97 | 3.495 | 20.0 | 69.90 |
| EXAMPLE 85 | 8.9 | 6.8 | 0.401 | 0.375 | 1.68 | 356.4 | 24.4 | 69.2 | 4.72 | 3.443 | 20.0 | 68.86 |
| EXAMPLE 86 | 11.0 | 6.0 | 0.455 | 0.408 | 1.81 | 344.8 | 25.9 | 60.0 | 5.24 | 3.486 | 20.0 | 69.72 |
| EXAMPLE 87 | 11.0 | 6.0 | 0.451 | 0.407 | 1.80 | 340.7 | 25.9 | 60.3 | 5.28 | 3.481 | 20.0 | 69.62 |
| EXAMPLE 88 | 11.0 | 6.0 | 0.444 | 0.402 | 1.75 | 335.0 | 25.2 | 61.6 | 5.24 | 3.481 | 20.0 | 69.62 |

TABLE 24

| | White-light-emitting device | | | | | | | | Blue LED | | |
|---|---|---|---|---|---|---|---|---|---|---|---|
| | Mixing ratio of orange phosphor A | Mixing ratio of green phosphor 2A | CIE color coordinates | | Total luminous flux | Luminous power [total luminous flux/W1] | Luminous efficiency [total luminous flux/W2] | General color rendering | W1 | Voltage when energized | Current when energized | W2 [voltage when energized * current when energized] |
| | (wt %) | (wt %) | x | y | (lm) | (lm/W) | (lm/W) | index Ra | (mW) | (V) | (mA) | (mW) |
| EXAMPLE 89 | 4.9 | 3.6 | 0.307 | 0.276 | 1.63 | 304.8 | 23.5 | 83.9 | 5.34 | 3.469 | 20.0 | 69.38 |
| EXAMPLE 90 | 4.9 | 3.6 | 0.306 | 0.283 | 1.83 | 354.9 | 26.2 | 84.4 | 5.15 | 3.496 | 20.0 | 69.92 |
| EXAMPLE 91 | 4.9 | 3.6 | 0.311 | 0.287 | 1.96 | 374.2 | 28.4 | 83.5 | 5.24 | 3.457 | 20.0 | 69.14 |
| EXAMPLE 92 | 5.8 | 4.4 | 0.312 | 0.294 | 1.78 | 348.7 | 25.5 | 83.5 | 5.09 | 3.484 | 20.0 | 69.68 |
| EXAMPLE 93 | 5.8 | 4.4 | 0.311 | 0.289 | 1.64 | 322.6 | 23.5 | 84.0 | 5.08 | 3.489 | 20.0 | 69.78 |
| EXAMPLE 94 | 5.8 | 4.4 | 0.296 | 0.272 | 1.38 | 279.0 | 19.2 | 84.2 | 4.96 | 3.603 | 20.0 | 72.06 |
| EXAMPLE 95 | 6.8 | 5.2 | 0.343 | 0.322 | 1.62 | 337.7 | 23.4 | 79.4 | 4.80 | 3.455 | 20.0 | 69.10 |
| EXAMPLE 96 | 6.8 | 5.2 | 0.355 | 0.340 | 1.69 | 331.6 | 24.2 | 76.9 | 5.09 | 3.491 | 20.0 | 69.82 |
| EXAMPLE 97 | 6.8 | 5.2 | 0.348 | 0.334 | 1.86 | 300.2 | 25.2 | 78.1 | 6.21 | 3.702 | 20.0 | 74.04 |

TABLE 25

| | White-light-emitting device | | | | | | | | Blue LED | | |
|---|---|---|---|---|---|---|---|---|---|---|---|
| | Mixing ratio of orange phosphor A | Mixing ratio of green phosphor 2A | CIE color coordinates | | Total luminous flux | Luminous power [total luminous flux/W1] | Luminous efficiency [total luminous flux/W2] | General color rendering | W1 | Voltage when energized | Current when energized | W2 [voltage when energized * current when energized] |
| | (wt %) | (wt %) | x | y | (lm) | (lm/W) | (lm/W) | index Ra | (mW) | (V) | (mA) | (mW) |
| EXAMPLE 98 | 12.3 | 4.4 | 0.411 | 0.353 | 1.62 | 322.7 | 22.8 | 66.1 | 5.01 | 3.541 | 20.0 | 70.82 |
| EXAMPLE 99 | 12.3 | 4.4 | 0.431 | 0.372 | 1.84 | 348.6 | 26.3 | 62.9 | 5.27 | 3.492 | 20.0 | 69.84 |
| EXAMPLE 100 | 12.3 | 4.4 | 0.430 | 0.371 | 1.79 | 366.3 | 26.0 | 63.4 | 4.90 | 3.450 | 20.0 | 69.00 |
| EXAMPLE 101 | 13.4 | 4.9 | 0.415 | 0.361 | 1.67 | 333.0 | 23.9 | 65.4 | 5.03 | 3.503 | 20.0 | 70.06 |
| EXAMPLE 102 | 13.4 | 4.9 | 0.439 | 0.385 | 1.84 | 383.2 | 27.3 | 62.2 | 4.80 | 3.367 | 20.0 | 67.34 |
| EXAMPLE 103 | 13.4 | 4.9 | 0.402 | 0.342 | 1.57 | 316.5 | 22.4 | 67.0 | 4.96 | 3.503 | 20.0 | 70.06 |
| EXAMPLE 104 | 15.0 | 5.5 | 0.448 | 0.391 | 1.59 | 316.8 | 22.8 | 60.7 | 5.01 | 3.484 | 20.0 | 69.68 |
| EXAMPLE 105 | 15.0 | 5.5 | 0.435 | 0.380 | 1.70 | 332.5 | 24.5 | 62.6 | 5.12 | 3.482 | 20.0 | 69.64 |
| EXAMPLE 106 | 15.0 | 5.5 | 0.450 | 0.389 | 1.91 | 349.4 | 27.6 | 60.4 | 5.46 | 3.454 | 20.0 | 69.08 |

TABLE 26

| | White-light-emitting device | | | | | | | | Blue LED | | |
|---|---|---|---|---|---|---|---|---|---|---|---|
| | Mixing ratio of orange phosphor A | Mixing ratio of green phosphor 2B | CIE color coordinates | | Total luminous flux | Luminous power [total luminous flux/W1] | Luminous efficiency [total luminous flux/W2] | General color rendering | W1 | Voltage when energized | Current when energized | W2 [voltage when energized * current when energized] |
| | (wt %) | (wt %) | x | y | (lm) | (lm/W) | (lm/W) | index Ra | (mW) | (V) | (mA) | (mW) |
| EXAMPLE 107 | 6.8 | 5.2 | 0.347 | 0.327 | 1.80 | 346.0 | 25.8 | 78.8 | 5.19 | 3.476 | 20.0 | 69.52 |
| EXAMPLE 108 | 6.8 | 5.2 | 0.356 | 0.340 | 1.88 | 365.4 | 27.1 | 76.8 | 5.15 | 3.478 | 20.0 | 69.56 |
| EXAMPLE 109 | 6.8 | 5.2 | 0.359 | 0.342 | 1.68 | 336.7 | 24.3 | 76.7 | 4.99 | 3.463 | 20.0 | 69.26 |

TABLE 27

| | White-light-emitting device | | | | | | | | Blue LED | | |
|---|---|---|---|---|---|---|---|---|---|---|---|
| | Mixing ratio of orange phosphor A | Mixing ratio of green phosphor 2B | CIE color coordinates | | Total luminous flux | Luminous power [total luminous flux/W1] | Luminous efficiency [total luminous flux/W2] | General color rendering | W1 | Voltage when energized | Current when energized | W2 [voltage when energized * current when energized] |
| | (wt %) | (wt %) | x | y | (lm) | (lm/W) | (lm/W) | index Ra | (mW) | (V) | (mA) | (mW) |
| EXAMPLE 110 | 15.0 | 5.5 | 0.458 | 0.395 | 1.75 | 327.5 | 25.2 | 58.5 | 5.34 | 3.476 | 20.0 | 69.52 |
| EXAMPLE 111 | 15.0 | 5.5 | 0.471 | 0.401 | 1.67 | 342.2 | 24.2 | 56.8 | 4.88 | 3.450 | 20.0 | 69.00 |
| EXAMPLE 112 | 15.0 | 5.5 | 0.459 | 0.390 | 1.78 | 368.5 | 25.0 | 58.4 | 4.83 | 3.565 | 20.0 | 71.30 |

TABLE 28

| | White-light-emitting device | | | | | | |
|---|---|---|---|---|---|---|---|
| | Mixing ratio of orange phosphor A (wt %) | Mixing ratio of green phosphor 2A (wt %) | Mixing ratio of blue phosphor 1 (wt %) | CIE color coordinates x | CIE color coordinates y | Total luminous flux (lm) | Luminous power [total luminous flux/W1] (lm/W) |
| EXAMPLE 113 | 3.8 | 2.9 | 6.7 | 0.341 | 0.427 | 1.75 | 401.3 |
| EXAMPLE 114 | 3.8 | 2.9 | 6.7 | 0.364 | 0.447 | 1.93 | 431.5 |
| EXAMPLE 115 | 3.8 | 2.9 | 6.7 | 0.356 | 0.438 | 1.95 | 445.6 |
| EXAMPLE 116 | 4.6 | 2.3 | 8.9 | 0.351 | 0.391 | 1.38 | 346.6 |
| EXAMPLE 117 | 4.6 | 2.3 | 8.9 | 0.371 | 0.414 | 1.76 | 425.9 |
| EXAMPLE 118 | 4.6 | 2.3 | 8.9 | 0.359 | 0.400 | 1.73 | 388.1 |
| EXAMPLE 119 | 4.9 | 2.1 | 11.1 | 0.381 | 0.410 | 1.76 | 417.4 |
| EXAMPLE 120 | 4.9 | 2.1 | 11.1 | 0.363 | 0.394 | 1.74 | 384.1 |
| EXAMPLE 121 | 4.9 | 2.1 | 11.1 | 0.381 | 0.401 | 1.70 | 583.4 |
| EXAMPLE 122 | 3.9 | 1.7 | 11.1 | 0.338 | 0.367 | 1.49 | 335.9 |
| EXAMPLE 123 | 3.9 | 1.7 | 11.1 | 0.343 | 0.364 | 1.34 | 326.2 |
| EXAMPLE 124 | 3.9 | 1.7 | 11.1 | 0.343 | 0.362 | 1.37 | 333.0 |
| EXAMPLE 125 | 3.4 | 1.3 | 11.1 | 0.309 | 0.320 | 0.97 | 247.5 |
| EXAMPLE 126 | 3.4 | 1.3 | 11.1 | 0.326 | 0.336 | 1.31 | 301.4 |
| EXAMPLE 127 | 3.4 | 1.3 | 11.1 | 0.327 | 0.334 | 1.33 | 330.8 |

| | White-light-emitting device | | Near-ultraviolet LED | | | |
|---|---|---|---|---|---|---|
| | Luminous efficiency [total luminous flux/W2] (lm/W) | General color rendering index Ra | W1 (mW) | Voltage when energized (V) | Current when energized (mA) | W2 [voltage when energized * current when energized] (mW) |
| EXAMPLE 113 | 23.0 | 70.9 | 4.36 | 3.801 | 20.0 | 76.02 |
| EXAMPLE 114 | 25.3 | 69.2 | 4.48 | 3.815 | 20.0 | 76.30 |
| EXAMPLE 115 | 25.6 | 70.1 | 4.38 | 3.807 | 20.0 | 76.14 |
| EXAMPLE 116 | 18.2 | 78.1 | 3.99 | 3.805 | 20.0 | 76.10 |
| EXAMPLE 117 | 22.9 | 75.5 | 4.13 | 3.844 | 20.0 | 76.88 |
| EXAMPLE 118 | 22.6 | 77.1 | 4.45 | 3.817 | 20.0 | 76.34 |
| EXAMPLE 119 | 23.0 | 76.2 | 4.22 | 3.828 | 20.0 | 76.56 |
| EXAMPLE 120 | 22.8 | 78.0 | 4.53 | 3.805 | 20.0 | 76.10 |
| EXAMPLE 121 | 22.1 | 77.1 | 2.91 | 3.844 | 20.0 | 76.88 |
| EXAMPLE 122 | 19.6 | 82.2 | 4.44 | 3.802 | 20.0 | 76.04 |
| EXAMPLE 123 | 17.6 | 82.6 | 4.10 | 3.808 | 20.0 | 76.16 |
| EXAMPLE 124 | 18.0 | 83.1 | 4.12 | 3.815 | 20.0 | 76.30 |
| EXAMPLE 125 | 12.7 | 88.2 | 3.90 | 3.809 | 20.0 | 76.18 |
| EXAMPLE 126 | 17.3 | 86.6 | 4.36 | 3.808 | 20.0 | 76.16 |
| EXAMPLE 127 | 17.4 | 86.7 | 4.02 | 3.820 | 20.0 | 76.40 |

TABLE 29

| | White-light-emitting device | | | | | | |
|---|---|---|---|---|---|---|---|
| | Mixing ratio of orange phosphor A (wt %) | Mixing ratio of green phosphor 2A (wt %) | Mixing ratio of blue phosphor 1 (wt %) | CIE color coordinates x | CIE color coordinates y | Total luminous flux (lm) | Luminous power [total luminous flux/W1] (lm/W) |
| EXAMPLE 128 | 8.3 | 3.1 | 6.7 | 0.431 | 0.454 | 1.90 | 445.1 |
| EXAMPLE 129 | 8.3 | 3.1 | 6.7 | 0.431 | 0.448 | 1.84 | 396.0 |
| EXAMPLE 130 | 8.3 | 3.1 | 6.7 | 0.429 | 0.451 | 1.66 | 416.3 |
| EXAMPLE 131 | 9.4 | 2.2 | 7.2 | 0.457 | 0.436 | 1.91 | 438.5 |
| EXAMPLE 132 | 9.4 | 2.2 | 7.2 | 0.452 | 0.430 | 1.86 | 413.6 |
| EXAMPLE 133 | 9.4 | 2.2 | 7.2 | 0.456 | 0.437 | 1.79 | 460.0 |
| EXAMPLE 134 | 9.6 | 2.0 | 7.7 | 0.452 | 0.427 | 1.77 | 400.9 |
| EXAMPLE 135 | 9.6 | 2.0 | 7.7 | 0.449 | 0.423 | 1.79 | 426.5 |
| EXAMPLE 136 | 9.6 | 2.0 | 7.7 | 0.472 | 0.436 | 1.94 | 451.2 |
| EXAMPLE 137 | 8.9 | 1.7 | 7.7 | 0.428 | 0.407 | 1.78 | 422.2 |
| EXAMPLE 138 | 8.9 | 1.7 | 7.7 | 0.428 | 0.413 | 1.44 | 320.5 |
| EXAMPLE 139 | 8.9 | 1.7 | 7.7 | 0.445 | 0.422 | 1.90 | 427.1 |
| EXAMPLE 140 | 8.9 | 1.3 | 7.7 | 0.456 | 0.421 | 1.84 | 417.7 |
| EXAMPLE 141 | 8.9 | 1.3 | 7.7 | 0.441 | 0.409 | 1.65 | 360.2 |
| EXAMPLE 142 | 8.9 | 1.3 | 7.7 | 0.453 | 0.419 | 1.81 | 419.9 |

TABLE 29-continued

|  | White-light-emitting device | | | Near-ultraviolet LED | | W2 [voltage when energized * current when energized] (mW) |
|---|---|---|---|---|---|---|
|  | Luminous efficiency [total luminous flux/W2] (lm/W) | General color rendering index Ra | W1 (mW) | Voltage when energized (V) | Current when energized (mA) | |
| EXAMPLE 128 | 25.0 | 69.0 | 4.28 | 3.801 | 20.0 | 76.02 |
| EXAMPLE 129 | 24.3 | 69.5 | 4.65 | 3.784 | 20.0 | 75.68 |
| EXAMPLE 130 | 21.8 | 69.5 | 3.98 | 3.800 | 20.0 | 76.00 |
| EXAMPLE 131 | 25.1 | 66.7 | 4.35 | 3.799 | 20.0 | 75.98 |
| EXAMPLE 132 | 24.5 | 67.3 | 4.49 | 3.787 | 20.0 | 75.74 |
| EXAMPLE 133 | 23.6 | 66.8 | 3.89 | 3.803 | 20.0 | 76.06 |
| EXAMPLE 134 | 23.3 | 67.4 | 4.41 | 3.801 | 20.0 | 76.02 |
| EXAMPLE 135 | 23.3 | 67.9 | 4.19 | 3.844 | 20.0 | 76.88 |
| EXAMPLE 136 | 25.5 | 63.7 | 4.30 | 3.807 | 20.0 | 76.14 |
| EXAMPLE 137 | 23.4 | 71.2 | 4.22 | 3.810 | 20.0 | 76.20 |
| EXAMPLE 138 | 19.0 | 71.5 | 4.50 | 3.798 | 20.0 | 75.96 |
| EXAMPLE 139 | 24.9 | 68.2 | 4.45 | 3.805 | 20.0 | 76.10 |
| EXAMPLE 140 | 24.2 | 66.5 | 4.41 | 3.806 | 20.0 | 76.12 |
| EXAMPLE 141 | 21.6 | 68.8 | 4.57 | 3.811 | 20.0 | 76.22 |
| EXAMPLE 142 | 23.8 | 66.8 | 4.32 | 3.811 | 20.0 | 76.22 |

TABLE 30

|  | White-light-emitting device | | | | | |
|---|---|---|---|---|---|---|
|  | Mixing ratio of orange phosphor A (wt %) | Mixing ratio of green phosphor 2B (wt %) | Mixing ratio of blue phosphor 1 (wt %) | CIE color coordinates x | CIE color coordinates y | Total luminous flux (lm) | Luminous power [total luminous flux/W1] (lm/W) |
| EXAMPLE 143 | 3.3 | 1.1 | 11.1 | 0.331 | 0.351 | 1.64 | 359.7 |
| EXAMPLE 144 | 3.3 | 1.1 | 11.1 | 0.332 | 0.353 | 1.63 | 390.3 |
| EXAMPLE 145 | 3.3 | 1.1 | 11.1 | 0.314 | 0.333 | 1.40 | 316.0 |

|  | White-light-emitting device | | | Near-ultraviolet LED | | W2 [voltage when energized * current when energized] (mW) |
|---|---|---|---|---|---|---|
|  | Luminous efficiency [total luminous flux/W2] (lm/W) | General color rendering index Ra | W1 (mW) | Voltage when energized (V) | Current when energized (mA) | |
| EXAMPLE 143 | 21.5 | 84.9 | 4.55 | 3.800 | 20.0 | 76.00 |
| EXAMPLE 144 | 21.3 | 84.4 | 4.17 | 3.818 | 20.0 | 76.36 |
| EXAMPLE 145 | 18.4 | 87.1 | 4.44 | 3.805 | 20.0 | 76.10 |

TABLE 31

|  | White-light-emitting device | | | | | | |
|---|---|---|---|---|---|---|---|
|  | Mixing ratio of orange phosphor A (wt %) | Mixing ratio of green phosphor 2B (wt %) | Mixing ratio of blue phosphor 1 (wt %) | CIE color coordinates x | CIE color coordinates y | Total luminous flux (lm) | Luminous power [total luminous flux/W1] (lm/W) |
| EXAMPLE 146 | 8.8 | 1.4 | 7.7 | 0.426 | 0.410 | 1.57 | 374.4 |
| EXAMPLE 147 | 8.8 | 1.4 | 7.7 | 0.432 | 0.411 | 1.72 | 390.4 |
| EXAMPLE 148 | 8.8 | 1.4 | 7.7 | 0.436 | 0.418 | 1.77 | 397.9 |

TABLE 31-continued

| | White-light-emitting device | | Near-ultraviolet LED | | | W2 |
|---|---|---|---|---|---|---|
| | Luminous efficiency [total luminous flux/W2] (lm/W) | General color rendering index Ra | W1 (mW) | Voltage when energized (V) | Current when energized (mA) | [voltage when energized * current when energized] (mW) |
| EXAMPLE 146 | 20.6 | 71.9 | 4.18 | 3.810 | 20.0 | 76.20 |
| EXAMPLE 147 | 22.4 | 70.9 | 4.39 | 3.836 | 20.0 | 76.72 |
| EXAMPLE 148 | 23.3 | 70.5 | 4.46 | 3.803 | 20.0 | 76.06 |

TABLE 32

| | Emitting device | | | | | Near-ultraviolet LED | | | W2 |
|---|---|---|---|---|---|---|---|---|---|
| | Mixing ratio of orange phosphor A | CIE color coordinates | | Total luminous flux | Luminous power [total luminous flux/W1] | Luminous efficiency [total luminous flux/W2] | W1 | Voltage when energized | Current when energized | [voltage when energized * current when energized] |
| | (wt %) | x | y | (lm) | (lm/W) | (lm/W) | (mW) | (V) | (mA) | (mW) |
| EXAMPLE 149 | 35 | 0.566 | 0.432 | 1.478 | 464.0 | 19.4 | 3.18 | 3.800 | 20 | 76.00 |
| EXAMPLE 150 | 30 | 0.561 | 0.435 | 1.523 | 435.2 | 20.0 | 3.50 | 3.801 | 20 | 76.02 |
| EXAMPLE 151 | 15 | 0.547 | 0.434 | 1.284 | 394.9 | 16.9 | 3.25 | 3.807 | 20 | 76.14 |
| EXAMPLE 152 | 7.5 | 0.515 | 0.407 | 0.830 | 244.8 | 10.9 | 3.39 | 3.803 | 20 | 76.06 |
| EXAMPLE 153 | 6 | 0.501 | 0.390 | 0.733 | 216.6 | 9.7 | 3.38 | 3.788 | 20 | 75.76 |
| EXAMPLE 154 | 4 | 0.456 | 0.346 | 0.458 | 147.4 | 6.0 | 3.11 | 3.802 | 20 | 76.04 |

Examples and Comparative Example of Phosphor Containing $M^4$ and/or $M^5$

Example 155

Materials described below were sufficiently mixed with a mixer mill to provide a material mixture.
$SrCO_3$: 29.22 g
$BaCO_3$: 19.73 g
$SiO_2$: 6.01 g
$Eu_2O_3$: 0.35 g
$ZnF_2 \cdot 4H_2O$: 0.14 g
KCl: 0.14 g The material mixture was charged into an alumina crucible and fired at 1,300° C. for 2 hours in a hydrogen-containing nitrogen atmosphere (hydrogen:nitrogen=4:96 (volume ratio)). The resulting fired product was ground and then fired at 1,550° C. for 5 hours in a hydrogen-containing nitrogen atmosphere (hydrogen:nitrogen=4:96 (volume ratio)). The resulting fired product was ground, washed with water, and dried to provide a phosphor, The crystal structure of the resulting phosphor was investigated by powder X-ray diffraction measurement and was believed to belong to the space group I4/mcm (No. 140) or the space group P4/ncc (No. 130).

Figure 20:
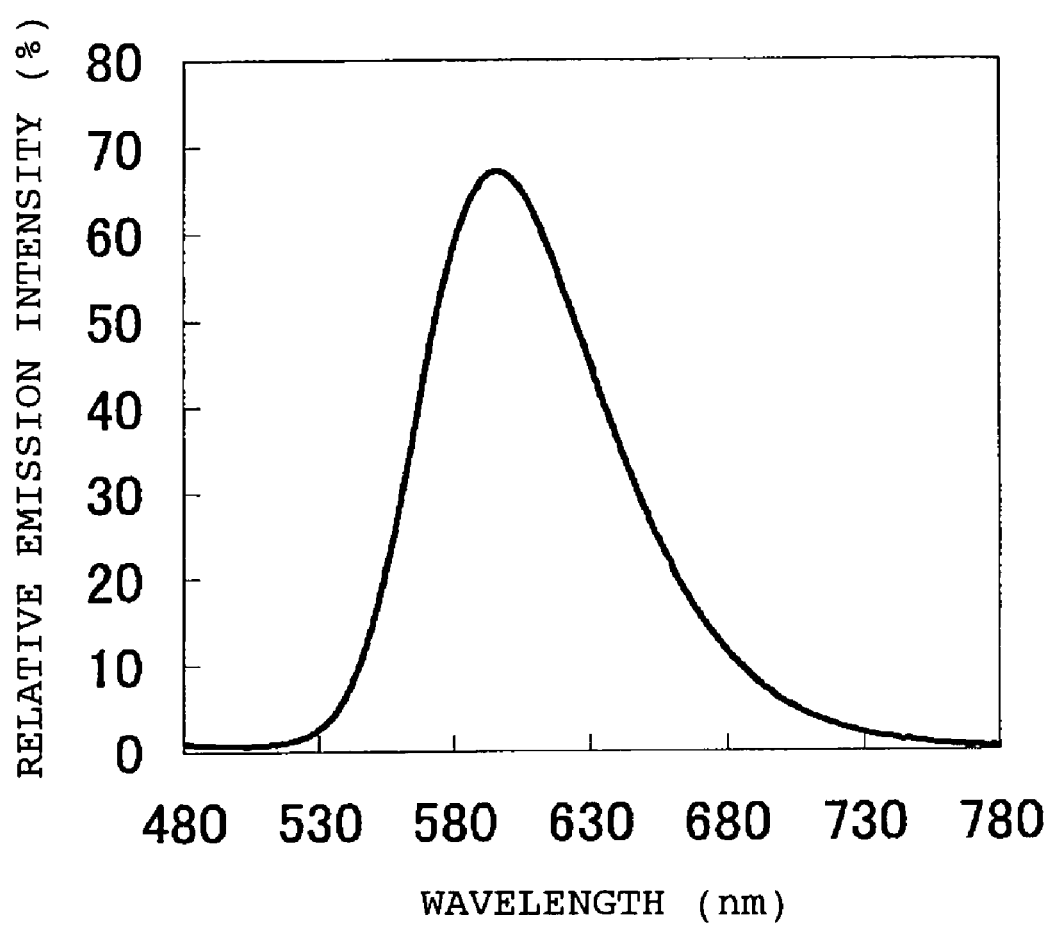
FIG. 20 shows the emission spectrum of a phosphor in EXAMPLE 155.

The emission spectrum of the resulting phosphor was measured and shown in FIG. 20. The relative luminance and color coordinates (x, y) were calculated from the emission spectrum and shown in Table 33 together with the charged composition of the phosphor.

Referring to Table 33, comparisons of the phosphor (charged composition: $Sr_{1.95}Zn_{0.008}BaSiO_5:Eu_{0.02}$, $K_{0.02}Cl_{0.02}$, $F_{0.02}$) obtained in EXAMPLE 155 with the phosphor (charged composition: $Sr_{1.98}BaSiO_5:Eu_{0.02}$) obtained in EXAMPLE 171 show that the incorporation of $ZnF_2 \cdot 4H_2O$ and KCl in the material mixture increases luminance.

Chemical composition analysis was performed by a GDMS method. The results were as follows: F: 4 ppm, Al: 180 ppm, Cl: 28 ppm, K: 0.5 ppm or less, and Zn: 2 ppm or less.

Example 171

A phosphor was produced as in EXAMPLE 155, except that the following materials were used. The relative luminance and color coordinates (x, y) were calculated and shown in Table 33 together with the charged composition of the phosphor.
$SrCO_3$: 29.22 g
$BaCO_3$: 19.73 g
$SiO_2$: 6.01 g
$Eu_2O_3$: 0.35 g Examples 156 to 168

Phosphors were produced as in EXAMPLE 155, except that the materials were mixed in such a manner that the compositions shown in Table 33 were achieved. Zn, Sb, La, Gd, and Bi were added and mixed in the form of oxides. Zn, Rb, Cs, Ba, and K were added and mixed in the form of halogenated compounds. P was added and mixed in the form of an ammonium salt.

The relative luminance and color coordinates (x, y) of each of the phosphors obtained in EXAMPLES 156 to 168 were also calculated and shown in Table 33 together with the charged composition of the phosphors. Referring to Table 33, in comparison with the phosphor obtained in EXAMPLE 171, any of the phosphors obtained in EXAMPLES had high luminance.

TABLE 33

| | | Amount of material compound charged (g) | | | | $M^4$ source and/or $M^5$ source | |
|---|---|---|---|---|---|---|---|
| | | $SrCO_3$ | $BaCO_3$ | $SiO_2$ | $Eu_2O_3$ | Type | Amount added (g) |
| EXAMPLE | 171 | 29.22 | 19.73 | 6.01 | 0.35 | None | 0 |
| EXAMPLE | 155 | 29.22 | 19.73 | 6.01 | 0.35 | $KCl/ZnF_2 \cdot 4H_2O$ | 0.14/0.14 |
| | 156 | 29.22 | 19.73 | 6.01 | 0.35 | $ZnF_2 \cdot 4H_2O$ | 0.55 |
| | 157 | 29.22 | 19.73 | 6.01 | 0.35 | ZnO | 0.55 |
| | 158 | 29.22 | 19.73 | 6.01 | 0.35 | $BaF_2$ | 0.55 |
| | 159 | 29.22 | 19.73 | 6.01 | 0.35 | $Bi_2O_3$ | 0.23 |
| | 160 | 29.22 | 19.73 | 6.01 | 0.35 | KCl | 1.1 |
| | 161 | 29.22 | 19.73 | 6.01 | 0.35 | KF | 0.55 |
| | 162 | 29.22 | 19.73 | 6.01 | 0.35 | $KCl/Bi_2O_3$ | 0.55/0.23 |
| | 163 | 29.22 | 19.73 | 6.01 | 0.35 | $KCl/Sb_2O_3$ | 0.55/0.15 |
| | 164 | 29.22 | 19.73 | 6.01 | 0.35 | $KCl/(NH_4)_2HPO_4$ | 0.55/0.39 |
| | 165 | 29.22 | 19.73 | 6.01 | 0.35 | CsCl | 0.55 |
| | 166 | 29.22 | 19.73 | 6.01 | 0.35 | RbF | 0.55 |
| | 167 | 29.22 | 19.73 | 6.01 | 0.35 | $KCl/La_2O_3$ | 0.55/0.16 |
| | 168 | 29.22 | 19.73 | 6.01 | 0.35 | $KCl/Gd_2O_3$ | 0.55/0.08 |

| | | Charged composition | Color coordinates | | Relative luminance (%) |
|---|---|---|---|---|---|
| | | | x | y | |
| EXAMPLE | 171 | $Sr_{1.98}BaSiO_5:Eu_{0.02}$ | 0.555 | 0.437 | 100 |
| EXAMPLE | 155 | $Sr_{1.95}Zn_{0.008}BaSiO_5:Eu_{0.02},K_{0.02},Cl_{0.02},F_{0.02}$ | 0.565 | 0.431 | 153 |
| | 156 | $Sr_{1.95}Zn_{0.03}BaSiO_5:Eu_{0.02},F_{0.06}$ | 0.590 | 0.427 | 163 |
| | 157 | $Sr_{1.91}Zn_{0.07}BaSiO_5:Eu_{0.02}$ | 0.564 | 0.431 | 138 |
| | 158 | $Sr_{1.98}Ba_{1.03}SiO_5:Eu_{0.02},F_{0.06}$ | 0.562 | 0.433 | 157 |
| | 159 | $Sr_{1.98}BaSiO_5:Eu_{0.02},Bi_{0.01}$ | 0.564 | 0.432 | 137 |
| | 160 | $Sr_{1.98}BaSiO_5:Eu_{0.02},K_{0.14},Cl_{0.14}$ | 0.568 | 0.429 | 152 |
| | 161 | $Sr_{1.98}BaSiO_5:Eu_{0.02},K_{0.09},F_{0.09}$ | 0.571 | 0.426 | 152 |
| | 162 | $Sr_{1.98}BaSiO_5:Eu_{0.02},Bi_{0.01},K_{0.07},Cl_{0.07}$ | 0.565 | 0.435 | 149 |
| | 163 | $Sr_{1.98}BaSiO_5:Eu_{0.02},Sb_{0.01},K_{0.07},Cl_{0.07}$ | 0.569 | 0.431 | 137 |
| | 164 | $Sr_{1.98}BaSiO_5:Eu_{0.02},P_{0.01},K_{0.07},Cl_{0.07}$ | 0.566 | 0.430 | 144 |
| | 165 | $Sr_{1.98}BaSiO_5:Eu_{0.02},Cs_{0.03},Cl_{0.03}$ | 0.561 | 0.434 | 146 |
| | 166 | $Sr_{1.98}Ba_{1.03}SiO_5:Eu_{0.02},Rb_{0.05},F_{0.05}$ | 0.568 | 0.428 | 138 |
| | 167 | $Sr_{1.98}BaSiO_5:Eu_{0.02},La_{0.01},K_{0.07},Cl_{0.07}$ | 0.555 | 0.439 | 119 |
| | 168 | $Sr_{1.98}BaSiO_5:Eu_{0.02},Gd_{0.004},K_{0.07},Cl_{0.07}$ | 0.555 | 0.440 | 129 |

Example 169

A light-emitting device having the structure shown in FIG. 1b was produced by the following procedure. Elements in EXAMPLE 169 corresponding to the elements in FIG. 1b are designated using the same reference numerals in parentheses.

As a first illuminant (21), a blue-light-emitting diode (hereinafter, appropriately abbreviated as an "LED") 460-MB (manufactured by Cree, Inc.) was used. The blue LED (21) was mounted by die bonding on a terminal (26) at the bottom of the depression of the frame (23) with a silver paste as an adhesive. In view of achieving good radiation of heat produced by the blue LED (21), the silver paste as an adhesive was uniformly applied in a thin layer. Heating was performed at 150° C. for 2 hours to cure the silver paste. An electrode of the blue LED (21) was connected to a terminal (25) of the frame (23) by wire bonding. A gold wire having a diameter of 25 μm was used as a wire (24).

The orange phosphor (in some cases, referred to as "phosphor (A)") obtained in EXAMPLE 155 was used as a light-emitting material of a phosphor-containing portion (22). An addition silicone resin LPS-3400 (manufactured by Shin-Etsu Chemical Co., Ltd.) was added in such a manner that the ratio by weight of the silicone resin to the phosphor (A) was 30:70. The mixture was mixed to form a phosphor slurry (phosphor-containing composition). The resulting phosphor slurry was filled into the depression in the frame (23) and cured by heating to form a phosphor-containing portion (22).

The light-emitting device was driven by passing a current of 20 mA through the blue LED (21) to emit light. The color coordinates thereof were measured to be x, y=0.47, 0.35. The emission was measured with a Fiber multichannel spectrometer (USB2000, manufactured by OceanOptics, Inc.). The luminous flux was 1.82 (lm). The radiant flux was 5,810 (μW).

Example 172

A light-emitting device was produced as in EXAMPLE 155, except that the phosphor obtained in EXAMPLE 171 was used in place of the phosphor (A) as a light-emitting material for the phosphor-containing portion (15).

The light-emitting device was driven by passing a current of 20 mA through the blue LED (21) to emit light. The color coordinates thereof were measured to be x, y=0.40, 0.31. The emission was measured as in EXAMPLE 169. The luminous flux was 1.37 (lm). The radiant flux was 4,790 (μW).

These results demonstrate that the light-emitting device produced in EXAMPLE 169 has a high luminous efficiency and high power compared with the light-emitting device produced in EXAMPLE 172. Furthermore, EXAMPLE 169 differs in color coordinates from EXAMPLE 172. To conform the color coordinates of both, in EXAMPLE 172, the weight of the phosphor contained in the phosphor-containing portion (22) needs to increase by a factor of about 1.5. In such a case, it is speculated that the luminous efficiency is further reduced.

Example 170

A white-light-emitting device was produced with the phosphor (A) and a phosphor $Ba_{1.39}Sr_{0.46}Eu_{0.15}SiO_4$ (in some cases, referred to as "phosphor (B)") which emits light having a wavelength of about 500 nm to 545 nm, as light-emitting materials in the phosphor-containing portion (22). The ratio by weight of the phosphor (A) to the phosphor (B) was set to 50:50. An addition silicone resin LPS-3400 (manufactured by Shin-Etsu Chemical Co., Ltd.) was added in such a manner that the ratio by weight of the silicone resin to the total weight of the phosphor (A) and the phosphor (B) was 15:85. The mixture was mixed to form a phosphor slurry (phosphor-containing composition). The resulting phosphor slurry was filled into the depression in the frame (23) and cured by heating to form a phosphor-containing portion (15).

The light-emitting device obtained in EXAMPLE 170 was driven by passing a current of 20 mA through the blue LED (14) to emit light. The white color coordinates were measured to be x, y=0.34, 0.32. The emission was measured as in EXAMPLE 169. The luminous flux was 2.14 (lm). The radiant flux was 6,930 (μW).

While the present invention is described in detail by the specific embodiments, it will be obvious to those skilled in the art that various changes may be made without departing from the contemplation and the scope of the invention.

The present invention contains subject matter related to Japanese Patent Application (JP 2005-231876) filed in the Japanese Patent Office on Aug. 10, 2005, Japanese Patent Application (JP 2006-010096) filed in the Japanese Patent Office on Jan. 18, 2006, Japanese Patent Application (JP 2006-010097) filed in the Japanese Patent Office on Jan. 18, 2006, Japanese Patent Application (JP 2006-203439) filed in the Japanese Patent Office on Jul. 26, 2006, and Japanese Patent Application (JP 2006-216855) filed in the Japanese Patent Office on Aug. 9, 2006, the entire contents of which are incorporated herein by reference.

The invention claimed is:

1. A phosphor represented by formula (1):

wherein $M^1$ represents at least one element selected from the group consisting of Zn, Be, Mg, C, Sr, and Ra, $M^2$ represents at least one element selected from the group consisting of Eu, Ce, Cr, Mn, Sm, Tm, Tb, Er, and Yb, $M^3$ represents Si and optionally at least one other tetravalent element, $M^4$ represents at least one element selected from the group consisting of Li, Na, K, Rb, Cs, Fr, La, Gd, P, Sb, Al, Pr, Sm, Yb, and Bi, $M^5$ represents at least one element selected from the group consisting of F, Cl, Br, I, and At, $M^6$ represents at least one element selected from the group consisting of N, O, and S, $0.5 \leq x \leq 1.2$, $0 < y < 1$, $0 < 3-x-y$, $0.5 \leq a \leq 1.5$, $0 \leq b \leq 0.6$, $0 \leq c \leq 0.3$, $4.5 \leq d \leq 5.5$, $b+c \geq 0$, and wherein said phosphor has a material present on a surface of the phosphor that comprises at least one member selected from the group consisting of magnesium oxide, aluminum oxide, silicon oxide, titanium oxide, zirconium oxide, tin oxide, germanium oxide, tantalum oxide, niobium oxide, vanadium oxide, boron oxide, antimony oxide, zinc oxide, yttrium oxide, bismuth oxide, silicon nitride, aluminum nitride, calcium phosphate, barium phosphate, strontium strontium phosphate, present on a surface of the phosphor in an amount of from 1 to 50 percent by weight, relative to the total weight of the phosphor.

2. The phosphor according to claim 1, wherein $M^2$ represents Eu.

3. The phosphor according to claim 1, wherein $M^1$ represents Sr.

4. The phosphor according to claim 1, wherein $0.01 \leq y \leq 0.1$.

5. The phosphor according to claim 1, wherein $0.8 \leq x \leq 1.2$.

6. The phosphor according to claim 1, wherein $0.5 \leq x \leq 0.8$.

7. A phosphor represented by formula (1B):

wherein $0.5 \leq x \leq 1.2$, $0 \leq y \leq 1$, and $0 < 3-x-y$.

8. The phosphor according to claim 7, wherein in x represents 1.

9. The phosphor according to claim 1, wherein a material different from the phosphor is present on the surface of the phosphor.

10. A method for producing the phosphor according to claim 1, comprising firing a mixture comprising at least one compound selected from the group consisting of an alkaline-earth-metal halide, an alkali metal phosphate, an alkali metal halide, a zinc compound, and a compound having an element in group 15 of the periodic table.

11. A phosphor composition comprising at least one phosphor according to claim 1 and a liquid medium.

12. A light-emitting device comprising a first illuminant and a second illuminant that emits visible light by irradiation with light emitted from the first illuminant, wherein as a first phosphor, the second illuminant comprises at least one phosphor according to claim 1.

13. The light-emitting device according to claim 12, wherein as a second phosphor, the second illuminant comprises at least one phosphor different in emission wavelength from the first phosphor.

14. The light-emitting device according to claim 13, wherein the first illuminant has an emission peak of 420 nm to 500 nm, and the second illuminant comprises at least one phosphor having an emission peak of 490 nm to 560 nm as the second phosphor.

15. The light-emitting device according to claim 13, wherein the first illuminant has an emission peak of 300 nm to 420 nm, and as the second phosphor, the second illuminant comprises at least one phosphor having an emission peak of 420 nm to 490 nm and at least one phosphor having an emission peak of 490 nm to 560 nm.

16. An image display comprising the light-emitting device according to claim 12.

17. The phosphor according to claim 7, wherein $0.5 \leq x \leq 1.0$, $0.003 \leq y \leq 0.3$, and $1.485 \leq 3-x-y \leq 2.475$.

18. The phosphor according to claim 1, wherein $M^1$ represents at least one element selected from the group consisting of Be, Mg, Ca, Sr, and Ra.

19. The phosphor according to claim 1, wherein
$M^1$ represents at least one element selected from the group consisting of Be, Mg, Ca, Sr, and Ra, and
Sr is present in an amount of at least 60 mol %, relative to the total amount of $M^1$ elements.

20. The phosphor according to claim 1, wherein $M^2$ represents at least one element selected from the group consisting of Sm, Eu, and Yb.

21. The phosphor according to claim 1, wherein $M^3$ represents Si.

22. The phosphor according to claim 1, wherein $M^6$ represents at least one element selected from the group consisting of O and N, wherein a ratio of O to N is from 0.9:0.1 to 1:0.

23. The phosphor according to claim 1, wherein $M^3$ represents Si and $0.5 \leq a \leq 1.1$.

24. The phosphor according to claim 1, wherein $M^6$ represents O and $4.5 \leq d \leq 5.05$.

25. The phosphor according to claim 1, wherein the chemical composition represented by formula (1) comprises at least one member selected from the group consisting of $Sr_{1.98}BaSiO_5$:$Eu_{0.02}$, $Sr_{1.97}BaSiO_5$:$Eu_{0.03}$, $Sr_{2.18}Ba_{0.8}SiO_5$:$Eu_{0.02}$, and $Sr_{2.48}Ba_{0.5}SiO_5$:$Eu_{0.02}$.

26. The phosphor according to claim 1, wherein the phosphor exhibits an emission peak at a wavelength of 570 nm or more.

27. The phosphor according to claim 1, wherein the phosphor exhibits an emission peak at a wavelength of from 570 nm to 680 nm.

28. A phosphor represented by formula (1):

$$M^1{}_{3-x-y}Ba_xM^2{}_yM^3{}_aM^4{}_bM^5{}_cM^6{}_d \qquad (1)$$

wherein
$M^1$ represents at least one element selected from the group consisting of Zn, Be, Mg, Ca, Sr, and Ra,
$M^2$ represents at least one element selected from the group consisting of Eu, Ce, Cr, Mn, Sm, Tm, Tb, Er, and Yb,
$M^3$ represents Si and optionally at least one other tetravalent element,
$M^4$ represents at least one element selected from the group consisting of P, Sb, and Bi,
$M^5$ represents at least one element selected from the group consisting of F, Cl, Br, I, and At,
$M^6$ represents at least one element selected from the group consisting of N, O, and S, $0.5 \leq x \leq 1.2$, $0 < y < 1$, $0 < 3-x-y$, $0.5 \leq a \leq 1.5$, $0 < b \leq 0.6$, $0 \leq c \leq 0.3$, $4.5 \leq d \leq 5.5$, and $b+c \leq 0$.

29. A phosphor represented by formula (1):

$$M^1{}_{3-x-y}Ba_xM^2{}_yM^3{}_aM^4{}_bM^5{}_cM^6{}_d \qquad (1)$$

wherein
$M^1$ represents at least one element selected from the group consisting of Zn, Be, Mg, Ca, Sr, and Ra,
$M^2$ represents at least one element selected from the group consisting of Eu, Ce, Cr, Mn, Sm, Tm, Tb, Er, and Yb,
$M^3$ represents Si and optionally at least one other tetravalent element,
$M^4$ represents at least one element selected from the group consisting of Li, Na, K, Rb, Cs, Fr, La, Gd, P, Sb, Al, Pr, Sm, Yb, and Bi,
$M^5$ represents at least one element selected from the group consisting of F and Cl,
$M^6$ represents at least one element selected from the group consisting of N, O, and S, $0.5 \leq x \leq 1.2$, $0 < y < 1$, $0 < 3-x-y$, $0.5 \leq a \leq 1.5$, $0 \leq b \leq 0.6$, $0 < c \leq 0.3$, $4.5 \leq d \leq 5.5$, and $b+c \leq 0$.

* * * * *

UNITED STATES PATENT AND TRADEMARK OFFICE
CERTIFICATE OF CORRECTION

| | | |
|---|---|---|
| PATENT NO. | : 8,277,687 B2 | Page 1 of 1 |
| APPLICATION NO. | : 11/997926 | |
| DATED | : October 2, 2012 | |
| INVENTOR(S) | : Tomoko Takahashi et al. | |

It is certified that error appears in the above-identified patent and that said Letters Patent is hereby corrected as shown below:

On the title page, Item (86), the PCT filing date is incorrect. Item (86) should read:

--(86)  PCT No.:  PCT/JP2006/315805

§ 371 (c)(1),
(2), (4) Date:  May 22, 2008--

Signed and Sealed this
Twenty-seventh Day of November, 2012

David J. Kappos
*Director of the United States Patent and Trademark Office*